(12) United States Patent
Meguro et al.

(10) Patent No.: US 11,972,950 B2
(45) Date of Patent: Apr. 30, 2024

(54) SEMICONDUCTOR DEVICE AND METHOD FOR MANUFACTURING

(71) Applicant: FUJI ELECTRIC CO., LTD., Kanagawa (JP)

(72) Inventors: Misaki Meguro, Matsumoto (JP); Takashi Yoshimura, Matsumoto (JP); Hiroshi Takishita, Matsumoto (JP); Naoko Kodama, Matsumoto (JP); Yasunori Agata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 750 days.

(21) Appl. No.: 17/106,187

(22) Filed: Nov. 30, 2020

(65) Prior Publication Data
US 2021/0104407 A1    Apr. 8, 2021

Related U.S. Application Data

(63) Continuation of application No. PCT/JP2019/050950, filed on Dec. 25, 2019.

(30) Foreign Application Priority Data

Dec. 28, 2018  (JP) ................................ 2018-248559

(51) Int. Cl.
*H01L 21/00*    (2006.01)
*H01L 21/265*   (2006.01)
(Continued)

(52) U.S. Cl.
CPC .... *H01L 21/26506* (2013.01); *H01L 27/0664* (2013.01); *H01L 29/7397* (2013.01); *H01L 29/8611* (2013.01)

(58) Field of Classification Search
CPC ........... H01L 21/26506; H01L 27/0664; H01L 29/7397; H01L 29/8611; H01L 21/2253;
(Continued)

(56) References Cited

U.S. PATENT DOCUMENTS

| 6,482,681 B1 | 11/2002 | Francis |
| 10,304,928 B2 | 5/2019 | Tamura |

(Continued)

FOREIGN PATENT DOCUMENTS

| CN | 1950938 A | 4/2007 |
| CN | 102956494 A | 3/2013 |

(Continued)

OTHER PUBLICATIONS

International Search Report and (ISA/237) Written Opinion of the International Search Authority for International Patent Application No. PCT/JP2019/050950, mailed by the Japan Patent Office dated Mar. 3, 2020.

(Continued)

*Primary Examiner* — Michael Maskell

(57) ABSTRACT

There is provided a semiconductor device, a hydrogen concentration distribution has a hydrogen concentration peak, a helium concentration distribution has a helium concentration peak, and a donor concentration distribution has a first donor concentration peak and a second donor concentration peak; the hydrogen concentration peak and the first donor concentration peak are located at a first depth, and the helium concentration peak and the second donor concentration peak are located at a second depth; each concentration peak has an upward slope; and a value which is obtained by normalizing a gradient of the upward slope of the second donor concentration peak by a gradient of the upward slope of the helium concentration peak is smaller than a value which is obtained by normalizing a gradient of (Continued)

the upward slope of the first donor concentration peak by a gradient of the upward slope of the hydrogen concentration peak.

27 Claims, 43 Drawing Sheets

(51) Int. Cl.
*H01L 27/06* (2006.01)
*H01L 29/739* (2006.01)
*H01L 29/861* (2006.01)

(58) Field of Classification Search
CPC ............... H01L 21/266; H01L 27/0727; H01L 29/0696; H01L 29/167; H01L 29/36; H01L 29/8613; H01L 29/06; H01L 29/32; H01L 29/66136; H01L 29/66348; H01L 29/78
USPC ........................................... 250/492.1–492.3
See application file for complete search history.

(56) References Cited

U.S. PATENT DOCUMENTS

| | | |
|---|---|---|
| 2005/0196936 A1 | 9/2005 | Daval |
| 2006/0068565 A1 | 3/2006 | Droes |
| 2006/0278925 A1 | 12/2006 | Yamaguchi |
| 2009/0310265 A1 | 12/2009 | Fukuoka |
| 2012/0267681 A1 | 10/2012 | Nemoto |
| 2013/0049129 A1* | 2/2013 | Feng ................. H01L 21/26506 438/585 |
| 2013/0249058 A1 | 9/2013 | Neidhart |
| 2014/0299915 A1 | 10/2014 | Kouno |
| 2015/0050754 A1 | 2/2015 | Ploss |
| 2015/0214347 A1 | 7/2015 | Falck |
| 2015/0270132 A1 | 9/2015 | Laven |
| 2015/0311279 A1* | 10/2015 | Onozawa ................. H01L 29/32 438/530 |
| 2015/0357229 A1 | 12/2015 | Schulze |
| 2015/0371858 A1 | 12/2015 | Laven |
| 2016/0141399 A1 | 5/2016 | Jelinek |
| 2016/0172438 A1 | 6/2016 | Jelinek |
| 2017/0271147 A1 | 9/2017 | Tamura |
| 2017/0271447 A1 | 9/2017 | Tamura |
| 2017/0373141 A1 | 12/2017 | Yoshida |
| 2018/0005829 A1 | 1/2018 | Takishita |
| 2018/0005831 A1 | 1/2018 | Schulze |
| 2018/0012762 A1 | 1/2018 | Mukai |
| 2018/0122895 A1 | 5/2018 | Jelinek |
| 2018/0166279 A1* | 6/2018 | Tamura ................... H01L 29/36 |
| 2019/0139772 A1 | 5/2019 | Kodama |

FOREIGN PATENT DOCUMENTS

| | | |
|---|---|---|
| CN | 104903997 A | 9/2015 |
| CN | 107851584 A | 3/2018 |
| JP | 2006332127 A | 12/2006 |
| JP | 2007266233 A | 10/2007 |
| JP | 2010028109 A | 2/2010 |
| JP | 2013138172 A | 7/2013 |
| JP | 2014107278 A | 6/2014 |
| JP | 2016111174 A | 6/2016 |
| JP | 2017011000 A | 1/2017 |
| JP | 2018137454 A | 8/2018 |
| JP | 2018195757 A | 12/2018 |
| WO | 2014208404 A1 | 12/2014 |
| WO | 2016204227 A1 | 12/2016 |
| WO | 2017047285 A1 | 3/2017 |
| WO | 2017146148 A1 | 8/2017 |

OTHER PUBLICATIONS

J. G. Laven et al., "Activation and Dissociation of proton-Induced Donor Profiles in Silicon", ECS Journal of Solid State Science and Technology, 2 (9) p. 389-p. 394 (2013).

Office Action issued for counterpart Japanese Application No. 2022-105137, transmitted from the Japanese Patent Office dated Aug. 8, 2023 (drafted on Jul. 28, 2023).

Office Action issued for counterpart Chinese Application 201980034474. 9, issued by the State Intellectual Property Office of People's Republic of China dated Oct. 28, 2023.

* cited by examiner

SEMICONDUCTOR DEVICE AND METHOD FOR MANUFACTURING

The contents of the following Japanese patent applications are incorporated herein by reference:
NO. 2018-248559 filed in JP on Dec. 28, 2018 and
PCT/JP2019/050950 filed in WO on Dec. 25, 2019

BACKGROUND

1. Technical Field

The present invention relates to a semiconductor device and a method for manufacturing.

2. Related Art

In the related art, it is known that hydrogen is implanted into a semiconductor substrate to be diffused such that the hydrogen is combined with a crystal defect existing in a diffusion region to serve as a donor (for example, refer to Patent Document 1).

[Patent Document 1] Japanese Translation of PCT International Publication No. 2016-204227

It is preferable that a range of a donor region and a donor concentration which are generated by hydrogen combining with a crystal defect can be controlled with a high precision.

GENERAL DISCLOSURE

In order to solve the above problem, an aspect of the present invention provides a semiconductor device including a semiconductor substrate that has an upper surface and a lower surface. In a depth direction connecting the upper surface and the lower surface of the semiconductor substrate, a hydrogen concentration distribution may have a hydrogen concentration peak. A helium concentration distribution may have a helium concentration peak. In the depth direction, a donor concentration distribution may have a first donor concentration peak and a second donor concentration peak. The hydrogen concentration peak and the first donor concentration peak may be located at a first depth. The helium concentration peak and the second donor concentration peak may be located at a second depth which is deeper than the first depth with respect to the lower surface. Each concentration peak may have an upward slope in which a concentration value increases from the lower surface toward the upper surface. A value which is obtained by normalizing a gradient of the upward slope of the second donor concentration peak by a gradient of the upward slope of the helium concentration peak may be smaller than a value which is obtained by normalizing a gradient of the upward slope of the first donor concentration peak by a gradient of the upward slope of the hydrogen concentration peak.

Each concentration peak may have a downward slope in which a concentration value decreases from the lower surface toward the upper surface. In the helium concentration peak, the gradient of the upward slope may be smaller than a gradient of the downward slope. In the second donor concentration peak, the gradient of the upward slope may be smaller than a gradient of the downward slope.

The donor concentration distribution between the first depth and the second depth may have a flat region where a donor concentration is approximately constant. A length of the flat region in the depth direction may be 10% or more of a thickness of the semiconductor substrate in the depth direction.

The donor concentration distribution between the first depth and the second depth may have a flat region where a donor concentration is approximately constant. A length of the flat region in the depth direction may be 10 μm or more.

A minimum value of the donor concentration of the flat region may be higher than a donor concentration of the semiconductor substrate.

A minimum value of a donor concentration between the first depth and the second depth may be higher than the donor concentration of the semiconductor substrate.

A concentration value of the helium concentration peak may be smaller than a concentration value of the hydrogen concentration peak.

The semiconductor device may include a drift region of an N type that is provided in the semiconductor substrate. The semiconductor device may include an emitter region that is provided in contact with the upper surface of the semiconductor substrate and that has a higher donor concentration than a donor concentration of the drift region. The semiconductor device may include a base region of a P type that is provided between the emitter region and the drift region. The semiconductor device may include a collector region of the P type that is provided in contact with the lower surface of the semiconductor substrate. The semiconductor device may include a buffer region of the N type that is provided between the collector region and the drift region and that has one or more donor concentration peaks whose donor concentration is higher than the donor concentration of the drift region. The first donor concentration peak may be the donor concentration peak of the buffer region.

The semiconductor device may include an accumulation region that is provided between the base region and the drift region and that has one or more donor concentration peaks whose donor concentration is higher than the donor concentration of the drift region. The second donor concentration peak may be the donor concentration peak of the accumulation region.

The accumulation region may have, in addition to the second donor concentration peak, the donor concentration peak due to a donor other than hydrogen.

The second donor concentration peak may be located between the buffer region and the accumulation region.

The semiconductor device may include a gate trench portion that is provided on the upper surface of the semiconductor substrate. The second donor concentration peak may be located between a bottom portion of the gate trench portion and the upper surface of the semiconductor substrate.

The semiconductor device may include an active portion that is provided in the semiconductor substrate. The semiconductor device may include an edge termination structure portion that is provided to surround the active portion in a top plan view of the semiconductor substrate. The semiconductor substrate may have a passed-through region through which helium implanted at a position of the helium concentration peak has passed. In the depth direction, the passed-through region provided in the edge termination structure portion may be shorter than the passed-through region provided in the active portion, or the passed-through region may not be provided in the edge termination structure portion.

The semiconductor device may include a transistor portion and a diode portion that are provided in the semiconductor substrate. In the depth direction, the passed-through region provided in the diode portion may be shorter than the passed-through region provided in the transistor portion, or the passed-through region may not be provided in the diode portion.

In the depth direction, the passed-through region provided in the transistor portion may be shorter than the passed-through region provided in the diode portion, or the passed-through region may not be provided in the transistor portion.

The first depth may be included in a range of 5 μm or less from the lower surface in the depth direction.

A donor concentration at the hydrogen concentration peak may be $1×10^{15}/cm^3$ or higher and $1×10^{17}/cm^3$ or lower.

A second aspect of the present invention provides a semiconductor device including a semiconductor substrate that has an upper surface and a lower surface. In a depth direction connecting the upper surface and the lower surface of the semiconductor substrate, a hydrogen concentration distribution may have a hydrogen concentration peak located in a range of 5 μm or less from the lower surface in the depth direction, and a helium concentration distribution may have a helium concentration peak located to be closer to the upper surface than the hydrogen concentration peak.

The semiconductor substrate may have an impurity concentration peak between the lower surface and the hydrogen concentration peak, and an impurity may be argon or fluorine.

A third aspect of the present invention provides a method for manufacturing the semiconductor device according to the first aspect. The method for manufacturing may include a first implantation step of implanting hydrogen at the first depth from the lower surface of the semiconductor substrate. The method for manufacturing may include a second implantation step of implanting helium at the second depth from the lower surface of the semiconductor substrate to form a passed-through region through which the helium has passed. The method for manufacturing may include a diffusion step of heat treating the semiconductor substrate to diffuse, in the passed-through region, the hydrogen implanted at the first depth. In the semiconductor substrate heat treated in the diffusion step, a dose of hydrogen in the first implantation step may be determined such that a minimum value of a donor concentration of the passed-through region is higher than a donor concentration of the semiconductor substrate into which the hydrogen is to be implanted.

In the first implantation step, hydrogen may be implanted according to a diffusion coefficient of hydrogen in the semiconductor substrate, and in a dose larger than or equal to a minimum dose determined by the second depth.

The semiconductor substrate may be a silicon substrate, and when the second depth from the lower surface is set to x (μm), a dose Q (ions/cm²) of hydrogen in the first implantation step may satisfy $Q≳1.6×10^{13}×e^{0.06x}$.

In the first implantation step, hydrogen may be implanted at the first depth by plasma doping.

The lower surface of the semiconductor substrate may be ground after the plasma doping.

The lower surface of the semiconductor substrate may be laser annealed after the plasma doping.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

In the present specification, one side in a direction parallel to a depth direction of a semiconductor substrate is referred to as "upper", and the other side is referred to as "lower". One surface of two principal surfaces of a substrate, a layer or another member is referred to as an upper surface, and the other surface is referred to as a lower surface. The "upper" and "lower" directions are not limited to a direction of gravity, or a direction in which the semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, it is not intended that the Z axis exclusively indicates a height direction with respect to the ground. Note that a +Z axis direction and a −Z axis direction are directions opposite to each other. In a case where the Z axis direction is described without a description of positive and negative signs, the direction means a direction parallel to the +Z axis and the −Z axis.

One mentioned herein as "same" or "equal" may include the one with error due to a variation in manufacturing or the like. The error is, for example, within 10%.

A chemical concentration in the present specification indicates an atomic density of an impurity measured regardless of an activation state. The chemical concentration can be measured by, for example, secondary ion mass spectrometry (SIMS). In the present specification, a concentration difference between a donor and an acceptor may relate to a concentration of a majority between the donor or the acceptor. The concentration difference can be measured by Capacitance-Voltage profiling (CV profiling). Further, a carrier concentration measured by Spreading Resistance (SR) profiling may be set as the concentration of the donor or the acceptor. Further, when a concentration distribution of the donor or the acceptor has a peak in a region, a value of the peak may be set as the concentration of the donor or the acceptor. In a case where the concentration of the donor or the acceptor is approximately uniform in a region where the donor or the acceptor exists, or the like, an average value of the concentration of the donor or the acceptor in the region may be set as the concentration of the donor or the acceptor. In the present specification, a unit system is the SI base unit system unless otherwise noted. Although a unit of a length may be represented by cm, various calculations may be performed after conversion to meters (m).

Figure 1:
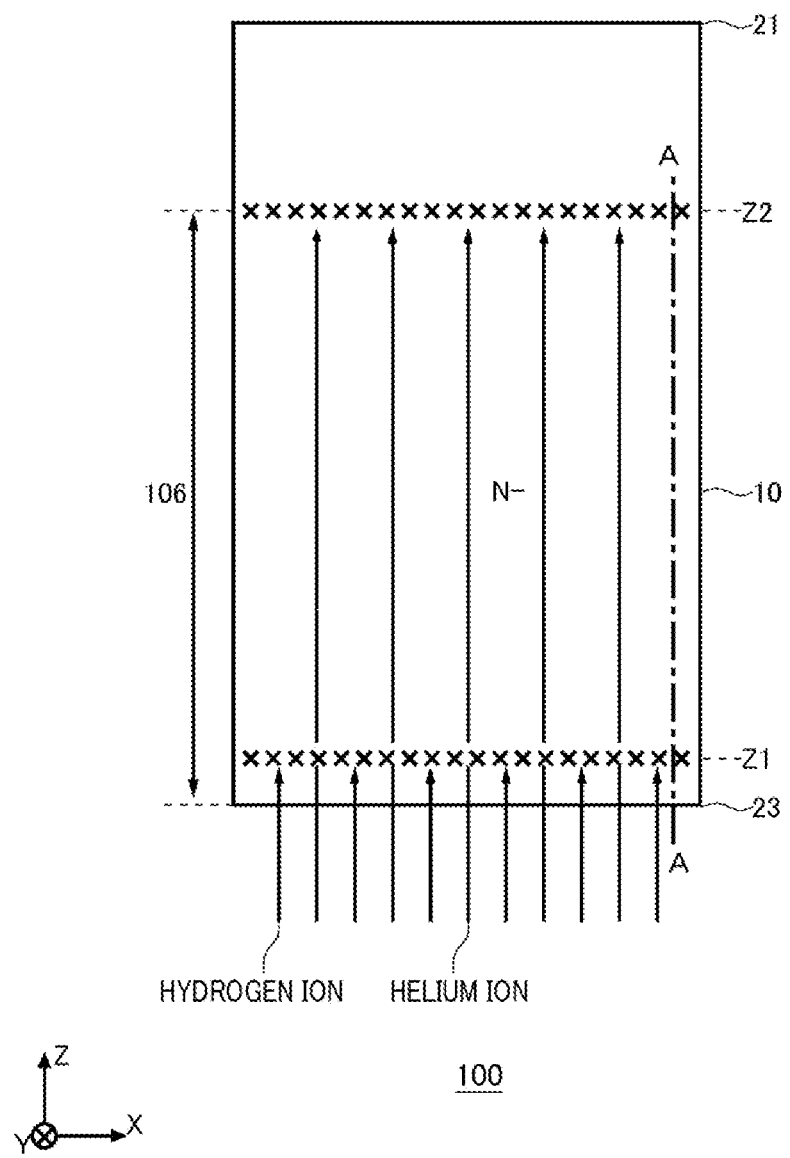
FIG. 1 is a cross-sectional view showing an example of a semiconductor device 100.

FIG. 1 is a cross-sectional view showing an example of a semiconductor device 100. The semiconductor device 100 includes a semiconductor substrate 10. The semiconductor substrate 10 is a substrate formed of a semiconductor material. As an example, the semiconductor substrate 10 is a silicon substrate. The semiconductor substrate 10 has a donor concentration that is determined by impurities or the like implanted during manufacturing. A conductivity type of the semiconductor substrate 10 of the present example is an N− type. In the present specification, the donor concentration in the semiconductor substrate 10 may be referred to as a substrate concentration.

The semiconductor substrate 10 has an upper surface 21 and a lower surface 23. The upper surface 21 and the lower surface 23 are two principal surfaces of the semiconductor substrate 10. In the present specification, orthogonal axes in a plane parallel to the upper surface 21 and the lower surface 23 are defined as the X axis and the Y axis, and an axis perpendicular to the upper surface 21 and the lower surface 23 is defined as the Z axis. Although semiconductor devices such as an IGBT or a FWD are formed in the semiconductor substrate 10, these device structures are omitted in FIG. 1.

Hydrogen ions and helium ions are implanted into the semiconductor substrate 10 from a lower surface 23 side. The hydrogen ion in the present example is a proton. The hydrogen ions are implanted at a depth Z1 in the depth direction (the Z axis direction) of the semiconductor substrate 10. The helium ions are implanted at a depth Z2. Of the two depths in the present example, the one closer to the lower surface 23 is the first depth Z1 and the other one deeper than the first depth Z1 when viewed from the lower surface 23 is the second depth Z2. In FIG. 1, the implanted hydrogen and helium are schematically shown by x marks; however, hydrogen and helium are also distributed around the implantation positions Z1, Z2.

The first depth Z1 may be located on the lower surface 23 side in the depth direction of the semiconductor substrate 10. For example, with respect to the lower surface 23, the first depth Z1 may be located in a range of half or less of a thickness of the semiconductor substrate 10, and may be located in a range of ¼ or less of the thickness of the semiconductor substrate 10. The second depth Z2 may be located on the upper surface 21 side in the depth direction of the semiconductor substrate 10. For example, with respect to the upper surface 21, the second depth Z2 may be located in a range of half or less of a thickness of the semiconductor substrate 10, and may be located in a range of ¼ or less of the thickness of the semiconductor substrate 10. Note that the first depth Z1 and the second depth Z2 are not limited to these ranges.

The helium ions implanted at the second depth Z2 pass through a passed-through region 106 from the lower surface 23 to the second depth Z2. In the passed-through region 106, a vacancy defect of a vacancy (V), a divacancy (VV), or the like is generated by the passing through of the helium ion. In the present specification, the vacancy includes the divacancy unless otherwise noted. A vacancy density in the passed-through region 106 can be adjusted by a dose of the helium ion implanted at the second depth Z2, or the like.

Implanting the hydrogen ions at the first depth Z1 and then heat treating the semiconductor substrate 10 diffuse, in the passed-through region 106, the hydrogen implanted at the first depth Z1. A VOH defect is formed by attachments of a vacancy (V) and oxygen (O), which exist in the passed-through region 106, with hydrogen (H). The VOH defect functions as a donor that supplies an electron. This allows a donor concentration of the passed-through region 106 to be higher than a donor concentration Db (or specific resistance or a base doping concentration) during manufacturing of a semiconductor ingot which is a base of the semiconductor substrate 10. Accordingly, the donor concentration of the semiconductor substrate 10 can be easily adjusted depending on the characteristics that a device formed in the semiconductor substrate 10 should have. Note that unless otherwise noted in the present specification, the VOH defect having a distribution similar to a chemical concentration distribution of hydrogen, and the VOH defect having a distribution similar to a distribution of the vacancy defect in the passed-through region 106 are both referred to as a hydrogen donor or hydrogen as a donor.

Note that a dopant for setting the base doping concentration Db is a dopant added during manufacturing of the semiconductor ingot. As an example, when the semiconductor ingot is silicon, in a case of an n type, phosphorus, antimony, or arsenic may be used, and in a case of a p type, boron, aluminum, or the like may be used. In cases of a compound semiconductor and an oxide semiconductor other than silicon, as well, respective dopants may be used. Further, a method for manufacturing the semiconductor ingot may be any of a float zone (FZ) method, a Czochralski (CZ) method, and a magnetic field applied Czochralski (MCZ) method.

Normally, the semiconductor substrate 10 having the base doping concentration Db so as to correspond to the characteristics of the device to be formed in the semiconductor substrate 10, in particular, a rated voltage or a withstand voltage should be prepared. In contrast, with the semiconductor device 100 shown in FIG. 1, by controlling doses, and the implantation depths of the hydrogen ions and the helium ions, the donor concentration of the semiconductor substrate 10 and the range of the passed-through region 106 at the time of completion of the semiconductor device 100 can be partially higher than the base doping concentration Db. Therefore, even when the semiconductor substrate 10 with a different base doping concentration is used, a device having a predetermined rated voltage or withstand voltage characteristic can be formed. Further, although a variation in the donor concentration during manufacturing of the semiconductor substrate 10 is relatively large, the doses of the hydrogen ion and the helium ion can be controlled with a relatively high precision. Therefore, a concentration of the vacancy (V) generated by implanting the helium ion can be controlled with a high precision, and the donor concentration of the passed-through region 106 can be controlled with a high precision.

Figure 2:
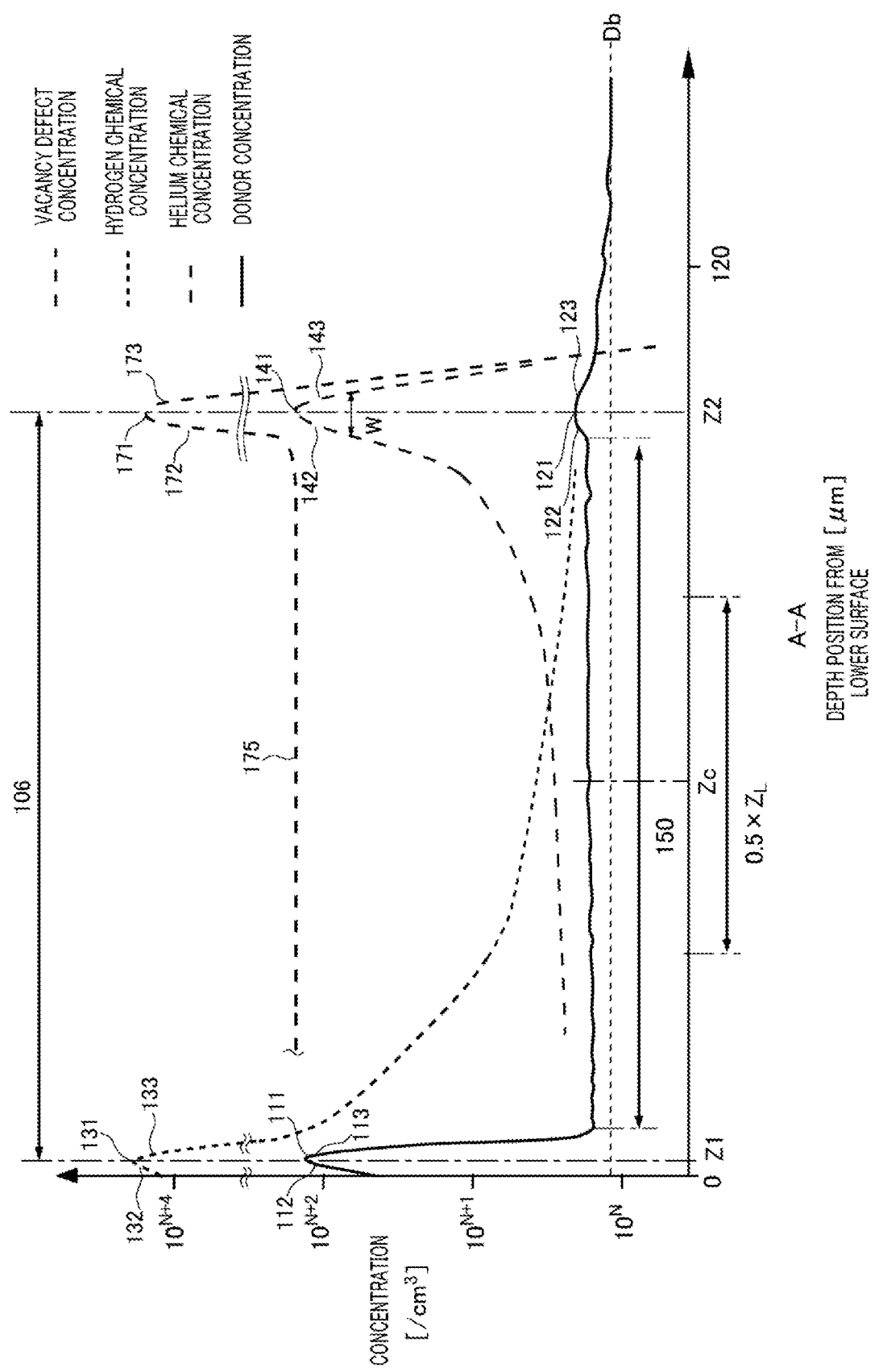
FIG. 2 shows a hydrogen concentration distribution, a helium concentration distribution, a donor concentration distribution, and a vacancy defect concentration distribution 175 in a depth direction at a position shown by a line A-A in FIG. 1.

FIG. 2 shows a hydrogen concentration distribution, a helium concentration distribution, a donor concentration distribution, and a vacancy defect concentration distribution 175 in a depth direction at a position shown by a line A-A in FIG. 1. In FIG. 2, a horizontal axis shows a depth position from the lower surface 23, and a vertical axis shows a hydrogen concentration, a helium concentration, a donor concentration, and a vacancy defect concentration per unit volume on a logarithmic axis. Note that the vacancy defect concentration distribution 175 is a distribution immediately after the ion implantation of the hydrogen ions and the helium ions. When the semiconductor device 100 is completed, the vacancies are reduced or annihilate as compared with immediately after the ion implantation, and a concentration distribution different from that of FIG. 2 is shown. The hydrogen concentration and the helium concentration in FIG. 2 are chemical concentrations measured by, for example, the SIMS method. The donor concentration in FIG. 2 is an electrically activated doping concentration measured by, for example, the CV profiling or the SR profiling. In FIG. 2, the hydrogen concentration distribution, the helium concentration distribution, and the vacancy defect concentration distribution 175 are shown by dashed lines, and the donor concentration distribution is shown by a solid line.

The hydrogen concentration distribution has a hydrogen concentration peak 131. The helium concentration distribution has a helium concentration peak 141. The hydrogen concentration peak 131 has a local maximum value at the first depth Z1. The helium concentration peak 141 has a local maximum value at the second depth Z2.

The donor concentration distribution has a first donor concentration peak 111 and a second donor concentration peak 121. The first donor concentration peak 111 has a local maximum value at the first depth Z1. The second donor concentration peak 121 has a local maximum value at the second depth Z2. Note that the position at which the first donor concentration peak 111 has the local maximum value may not exactly match the first depth Z1. For example, as long as the position at which the first donor concentration peak 111 has the local maximum value is included within a range of full width at half maximum of the hydrogen concentration peak 131 with respect to the first depth Z1, the first donor concentration peak 111 may be considered to be located substantially at the first depth Z1. Similarly, as long as the position at which the second donor concentration peak 121 has the local maximum value is included within a range of full width at half maximum of the helium concentration peak 141 with respect to the second depth Z2, the second donor concentration peak 121 may be considered to be located substantially at the second depth Z2.

The vacancy defect concentration distribution 175 has a first vacancy concentration peak corresponding to the hydrogen concentration peak 131, and a second vacancy concentration peak (a vacancy concentration peak 171) corresponding to the helium concentration peak 141. Note that an illustration of the first vacancy concentration peak is omitted. The vacancy concentration peak 171 has a local maximum value at the second depth Z2.

Each concentration peak has an upward slope in which a concentration value increases from the lower surface 23 toward the upper surface 21 of the semiconductor substrate 10, and a downward slope in which the concentration value decreases from the lower surface 23 toward the upper surface 21 of the semiconductor substrate 10. In the present example, the hydrogen concentration peak 131 has an upward slope 132 and a downward slope 133. The helium concentration peak 141 has an upward slope 142 and a downward slope 143. The first donor concentration peak 111 has an upward slope 112 and a downward slope 113. The second donor concentration peak 121 has an upward slope 122 and a downward slope 123. The vacancy concentration peak 171 has an upward slope 172 and a downward slope 173.

The donor of the semiconductor substrate 10 includes a donor having been existing in the semiconductor substrate 10 both before and after the hydrogen ion is implanted, that is, a donor which relates to the base doping concentration (the concentration Db), a donor obtained by activation of the implanted hydrogen, and the VOH defect described above. A ratio at which hydrogen is activated as a donor is, for example, approximately 1%. In the passed-through region 106, in a region which is spaced from the first depth Z1 and the second depth Z2 to some extent, a donor due to a VOH defect corresponding to a vacancy defect concentration has a higher ratio than a donor due to a VOH defect corresponding to a hydrogen chemical concentration, and a ratio of the donor concentration is controlled by the concentration of vacancy defect. The VOH defect corresponding to the hydrogen chemical concentration indicates a VOH defect for which the hydrogen chemical concentration is more dominant than the vacancy defect concentration. The VOH defect corresponding to the vacancy defect concentration indicates a VOH defect for which the vacancy defect concentration is more dominant than the hydrogen chemical concentration.

Here, the VOH defect for which the hydrogen chemical concentration distribution is dominant has the following meaning. In a case where a vacancy, oxygen and hydrogen form a cluster to form a VOH defect, since the hydrogen chemical concentration is sufficiently higher than the vacancy defect concentration, the distribution of the donor concentration due to the VOH defect is shown to be similar to the distribution of the hydrogen chemical concentration. As an example, it can be said that when the hydrogen chemical concentration is higher than the vacancy defect concentration at a certain depth and a depth in the vicinity thereof, the donor concentration distribution of the VOH defect for which the hydrogen chemical concentration distribution is dominant occurs.

On the other hand, the VOH defect for which the vacancy defect concentration distribution 175 is dominant shows that the distribution of the donor concentration due to the VOH defect is similar to the distribution of the vacancy defect concentration since the vacancy defect concentration is sufficiently higher than the hydrogen chemical concentration. As an example, it can be said that when the vacancy defect concentration is higher than the hydrogen chemical concentration at a certain depth and a depth in the vicinity thereof, the donor concentration distribution of the VOH defect for which the vacancy defect concentration distribution 175 is dominant occurs.

It is considered that, in the passed-through region 106, except for the vicinity of the first depth Z1 and the vicinity of the second depth Z2, the vacancies (V, VV, and the like) generated by the passing through of hydrogen are distributed, having an approximately uniform concentration in the depth direction as shown in FIG. 2. Further, it is considered that oxygen (O) which is implanted during the manufacturing of the semiconductor substrate 10, or the like also has an approximately uniform distribution in the depth direction. Further, in the passed-through region 106, a sufficient amount of hydrogen exists since hydrogen at the hydrogen concentration peak 131 is diffused. For the VOH defect, a flat donor distribution is formed by these.

Therefore, in a region other than the vicinity of the first depth Z1 and the vicinity of the second depth Z2 in the passed-through region 106, there exists a flat region 150 in which the VOH defects functioning as donors have an approximately uniform distribution. A donor concentration distribution in the flat region 150 is approximately constant in the depth direction. The expression that the donor concentration is approximately constant in the depth direction may indicate, for example, a state where a region, in which a difference between a maximum value and a minimum value of the donor concentration is within 50% of the maximum value of the donor concentration, is continuous in the depth direction. The difference may be 30% or less, or 10% or less of the maximum value of the donor concentration in the region.

Alternatively, with respect to an average concentration of the donor concentration distribution in a predetermined range in the depth direction, a value of the donor concentration distribution may be within ±50%, within ±30%, or within ±10% of the average concentration of the donor concentration distribution. The predetermined range in the depth direction may be as follows as an example. That is, on the assumption that a length from the first depth Z1 to the second depth Z2 is $Z_L$, a zone with a length of 0.5 $Z_L$ between two points respectively spaced by $0.25Z_L$ away from the center Zc between Z1 and Z2 to a first depth Z1 side and a second depth Z2 side may be set as the range. Depending on a length of the flat region 150, a length of the predetermined range may be $0.75Z_L$, $0.3Z_L$, or $0.9Z_L$.

The range in which the flat region 150 is provided can be controlled by a position of the helium concentration peak 141. The flat region 150 is provided between the hydrogen concentration peak 131 and the helium concentration peak 141. Further, a donor concentration of the flat region 150 can be controlled by a dose of the helium ion at the helium concentration peak 141. Increasing the dose of the helium ion increases the number of the vacancies (V) generated in the passed-through region 106 and raises the donor concentration.

Note that when the helium ion is implanted at a position deeper than the hydrogen concentration peak 131, acceleration energy of the helium ion may be set to be high approximately to a value at which the helium ion penetrates through (passes through) the semiconductor substrate 10. That is, the helium concentration peak 141 may not remain in the semiconductor substrate 10. This makes it possible to increase the concentration of the vacancy defect, as well. On the other hand, when the acceleration energy is excessively large, the substrate may be damaged too much during the ion implantation, and a flatness of the distribution of the vacancy defects in the passed-through region 106 may not be maintained. Therefore, the helium concentration peak 141 may be located inside the semiconductor substrate 10.

The helium concentration peak 141 is provided at a position deeper than the hydrogen concentration peak 131, and thus peak spreading of the helium concentration peak 141 is likely to be larger than that of the hydrogen concentration peak 131. Therefore, peak spreading of the second donor concentration peak 121 is also likely to be larger than that of the first donor concentration peak 111. That is, the second donor concentration peak 121 is likely to be a gentler peak than that of the first donor concentration peak 111.

Further, in the present example, a concentration value of the hydrogen concentration peak 131 is larger than a concentration value of the helium concentration peak 141. The concentration value of the hydrogen concentration peak 131 may be 10 times or higher, or 100 times or higher of the concentration value of the helium concentration peak 141. In another example, the concentration value of the hydrogen concentration peak 131 may be lower than or equal to the concentration value of the helium concentration peak 141.

In the present example, since the concentration value of the hydrogen concentration peak 131 is high, an amount of hydrogen activated as a donor at the hydrogen concentration peak 131 is relatively large. That is, a ratio of the donor of the VOH defect for which the hydrogen chemical concentration distribution is dominant against the vacancy defect concentration distribution 175 is high. In this case, a shape of the first donor concentration peak 111 is similar to a shape of the hydrogen concentration peak 131.

On the other hand, since the helium concentration peak 141 is spaced away from the hydrogen concentration peak 131, an amount of hydrogen activated as a donor at the helium concentration peak 141 is small. That is, the donor of the VOH defect for which the vacancy defect concentration distribution 175 is dominant has a relatively higher ratio than the donor of the VOH defect for which the hydrogen chemical concentration distribution is dominant. In this case, a similarity between a shape of the second donor concentration peak 121 and a shape of the helium concentration peak 141 is smaller than a similarity between the shape of the first donor concentration peak 111 and the shape of the hydrogen concentration peak 131. Since the VOH defects are considered to have an approximately uniform distribution in most of the passed-through region 106, the second donor concentration peak 121 has a further gentler shape. The similarity of the peak shape may be an index showing that the larger a difference of gradients of corresponding slopes between the hydrogen concentration peak or the helium concentration peak, and the donor concentration peak, the smaller a value of the similarity.

With such a structure, the flat region 150 can be provided between the first depth Z1 and the second depth Z2. The length of the flat region 150 in the depth direction may be 10% or more, 30% or more, or 50% or more of the thickness of the semiconductor substrate 10 in the depth direction. Further, the length of the flat region 150 in the depth direction may be 10 μm or more, 30 μm or more, 50 μm or more, or 100 μm or more.

A minimum value of the donor concentration of the flat region 150 may be higher than the base doping concentration Db of the semiconductor substrate 10. That is, the donor concentration of the flat region 150 may be higher than the base doping concentration Db over the entire flat region 150. A difference between the donor concentration of the flat region 150 and the base doping concentration Db of the semiconductor substrate 10 can be adjusted, for example, by the dose of helium at the helium concentration peak 141.

A minimum value of the donor concentration between the first depth Z1 and the second depth Z2 may be higher than the base doping concentration of the semiconductor substrate 10. Between the hydrogen concentration peak 131 and the helium concentration peak 141, a region of an N type may be continuously provided. Further, a minimum value of a donor concentration between the second depth Z2 and the lower surface 23 of the semiconductor substrate 10 may be higher than the donor concentration of the semiconductor substrate 10.

Figure 3A:
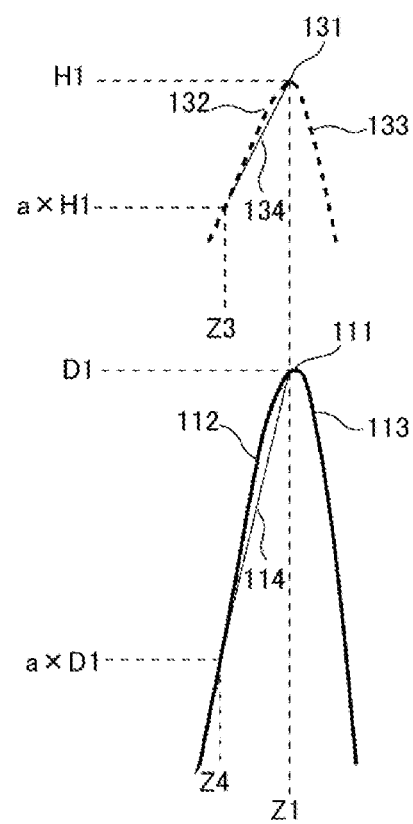
FIG. 3A is a diagram illustrating a relationship between a hydrogen concentration peak 131 and a first donor concentration peak 111.

FIG. 3A is a diagram illustrating a relationship between a hydrogen concentration peak 131 and a first donor concentration peak 111. In the present example, a gradient 134 of the upward slope 132 of the hydrogen concentration peak 131 is used to normalize a gradient 114 of the upward slope 112 of the first donor concentration peak 111. The normalization is a process of dividing the gradient 114 by the gradient 134, as an example. Note that in the present specification, a gradient may be used to mean an absolute value of the gradient.

The gradient of the upward slope may be a gradient between a position at which a concentration has a local maximum value and a position at which a concentration has a predetermined ratio to the local maximum value. The predetermined ratio may be 80%, 50%, 10%, or 1%, and other ratios may be used. Further, in the hydrogen concentration peak 131 and the first donor concentration peak 111, a gradient of a concentration distribution between the first depth Z1 and the lower surface 23 of the semiconductor substrate 10 may be used. In the example shown in FIG. 3A, the gradient 134 of the hydrogen concentration peak 131 is given as (H1−aH1)/(Z1−Z3), and the gradient 114 of the first donor concentration peak 111 is given as (D1−aD1)/(Z1−Z4). H1 is a hydrogen concentration at the first depth Z1, D1 is a donor concentration at the first depth Z1, a is a predetermined ratio, Z3 is a depth at which the hydrogen concentration is aH1 in the upward slope 132 of the hydrogen concentration peak 131, and Z4 is a depth at which the donor concentration is aD1 in the upward slope 112 of the first donor concentration peak 111. For example, the gradient 114 is normalized by the gradient 134 to be (D1−aD1)(Z1−Z3)/{(H1−aH1)(Z1−Z4)}. A gradient obtained by normalizing the gradient 114 by the gradient 134 is set as α.

Figure 3B:
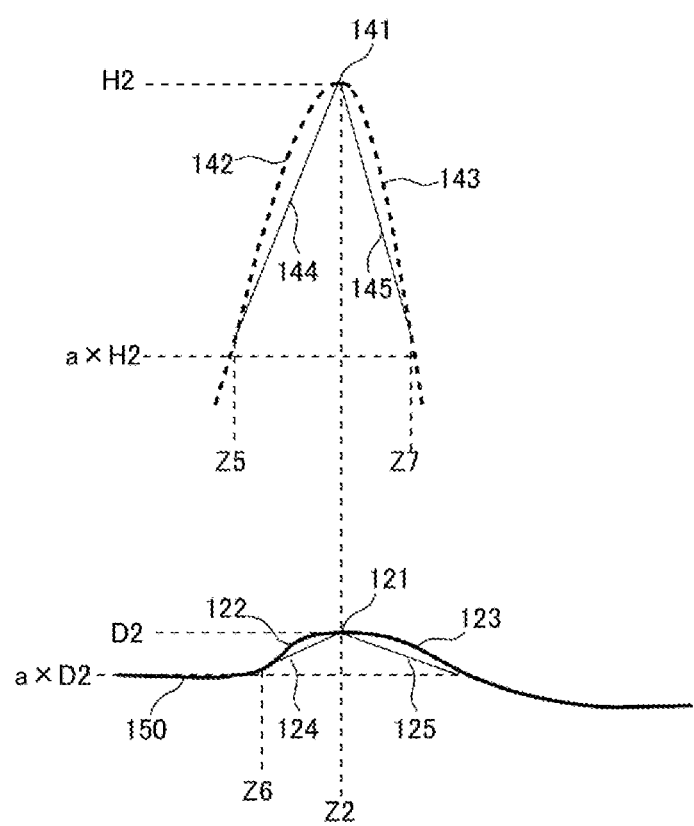
FIG. 3B is a diagram illustrating a relationship between a helium concentration peak 141 and a second donor concentration peak 121.

FIG. 3B is a diagram illustrating a relationship between a helium concentration peak 141 and a second donor concentration peak 121. In the present example, a gradient 144 of the upward slope 142 of the helium concentration peak 141 is used to normalize a gradient 124 of the upward slope 122 of the second donor concentration peak 121.

In the example shown in FIG. 3B, the gradient 144 of the helium concentration peak 141 is given as (H2−aH2)/(Z2−Z5), and the gradient 124 of the second donor concentration peak 121 is given as (D2−aD2)/(Z2−Z6). H2 is a helium concentration at the second depth Z2, D2 is a donor concentration at the second depth Z2, a is a predetermined ratio, Z5 is a depth at which the helium concentration is aH2 in the upward slope 142 of the helium concentration peak 141, and Z6 is a depth at which the donor concentration is aD2 in the upward slope 122 of the second donor concentration peak 121. A ratio a which is used to normalize the gradient of the second donor concentration peak 121 may be the same as or different from a ratio a which is used to normalize the gradient of the first donor concentration peak 111. For example, the gradient 124 is normalized by the gradient 144 to be (D2−aD2)(Z2−Z5)/{(Z2−Z6)(H2−aH2)}. A gradient obtained by normalizing the gradient 124 by the gradient 144 is set as β.

The normalized gradient β of the upward slope 122 of the second donor concentration peak 121 is smaller than the normalized gradient α of the upward slope 112 of the first donor concentration peak 111. That is, with respect to the concentration peak of hydrogen or helium, the second donor concentration peak 121 is a gentler peak compared with the first donor concentration peak 111. Implanting the hydrogen ions and helium ions so as to form such second donor concentration peak 121 makes it possible to form the flat region 150. Further, by making the second donor concentration peak 121 have a gentle shape, it is possible to moderate a change in a donor concentration at an edge of the flat region 150. The normalized gradient β of the upward slope 122 of the second donor concentration peak 121 may be one times or less, 0.1 times or less, or 0.01 times or less of the normalized gradient a of the upward slope 112 of the first donor concentration peak 111.

Further, the gradient 144 of the upward slope 142 of the helium concentration peak 141 may be smaller than a gradient 145 of the downward slope 143. The concentration distribution of the helium ions implanted at a deep position from the lower surface 23 may have a gentle trail on the lower surface 23 side, and thus by comparing the gradient 144 of the upward slope 142 with the gradient 145 of the downward slope 143, it may be possible to determine whether helium of the helium concentration peak 141 has been implanted from the lower surface 23 side. The gradient 145 is given as (H2−aH2)/(Z7−Z2). A gradient 125 is given as (D2−aD2)/(Z7−Z2). Note that in FIG. 3B, the gradient 124 of the upward slope 122 of the second donor concentration peak 121 is larger than the gradient 125 of the downward slope 123; however, similarly to the helium concentration peak 141, the gradient 124 of the upward slope 122 of the second donor concentration peak 121 may be smaller than the gradient 125 of the downward slope 123.

Figure 3C:
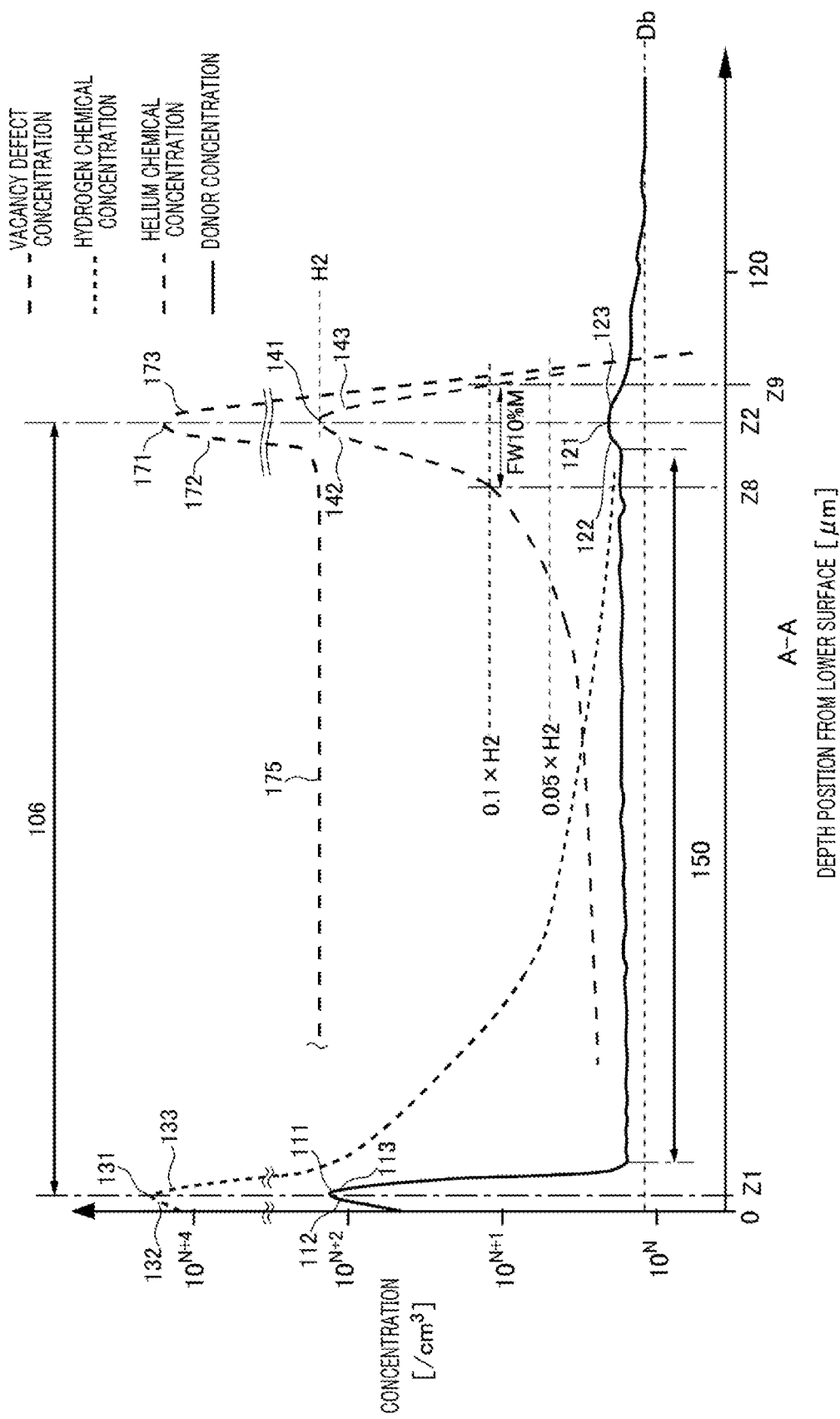
FIG. 3C is a diagram illustrating a gradient of an upward slope 142.

FIG. 3C is a diagram illustrating a gradient of an upward slope 142. The gradient of the upward slope 142 may be considered as follows. As described in FIG. 3C, in the helium concentration peak 141, a width (a 10% full width) between two positions Z8, Z9 with concentrations which are 10% of a peak concentration H2 (0.1×H2) is set to FW 10% M. The two positions Z8, Z9 are two positions closest to the peak position Z2 among points where the helium concentration is 0.1×H2 with the peak position Z2 interposed therebetween. The position on a hydrogen concentration peak side of the two positions Z8, Z9 is set as Z8. A gradient of the donor concentration at the position Z8 is approximately flat. A gradient of the helium concentration at the position Z8 exceeds 100 times the gradient of the donor concentration at the position Z8. For example, the gradient of the helium concentration at the position Z8 may be 100 times or more, or 1000 times or more of the gradient of the donor concentration at the position Z8.

Figure 4A:
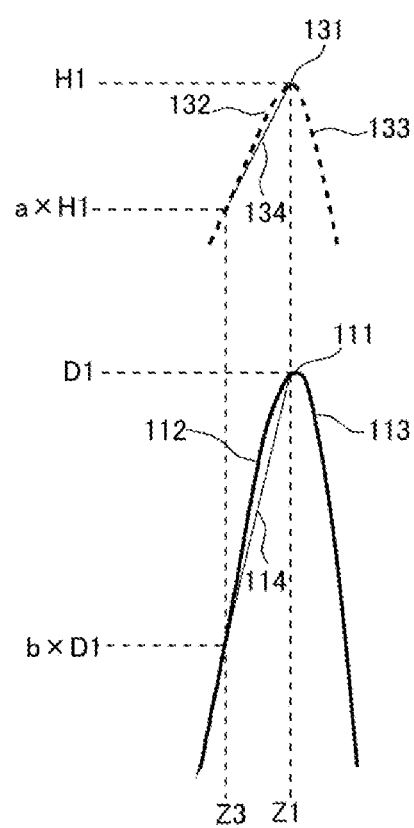
FIG. 4A is a diagram illustrating another definition of normalization of a gradient of an upward slope 112.

FIG. 4A is a diagram illustrating another definition of normalization of a gradient of an upward slope 112. In normalizing the gradient of the upward slope 112, for example, the following index γ is introduced. In the example of FIG. 3A, the position Z3 and the position Z4 are different; however, in the present example, the position Z3 and the position Z4 are set as the same position (Z3=Z4). Here, the position Z3 is a predetermined position. The position Z3 only needs to be a position at which the hydrogen concentration distribution and the donor concentration distribution have the upward slopes 132, 112 and which is closer to a lower surface side than the position Z1. At the position Z3, a hydrogen concentration is set as axH1, and a donor concentration is set as bxD1. The symbol a is a ratio of the hydrogen concentration at the position Z3 to the concentration H1 of the hydrogen concentration peak 131 at the position Z1. The symbol b is a ratio of the donor concentration at the position Z3 to the concentration D1 of the first donor concentration peak 111 at the position Z1. Here, a ratio of a gradient of each of the hydrogen concentration and the donor concentration in a zone from Z3 to Z1, and a gradient ratio γ obtained by normalizing the ratio of the gradient are introduced. The ratio of the gradient of the hydrogen concentration in the zone from Z3 to Z1 is defined as (H1/aH1)/(Z1−Z3). In the same way, the ratio of the gradient of the donor concentration in the zone from Z3 to Z1 is defined as (D1/bD1)/(Z1−Z3). Then, the gradient ratio γ obtained by normalizing the ratio of the gradient of the donor concentration by the ratio of the gradient of the hydrogen concentration in the zone from Z3 to Z1 is defined as $\{(D1/bD1)/(Z1-Z3)\}/\{(H1/aH1)/(Z1-Z3)\}$. The normalized gradient ratio γ is obtained as a simple ratio a/b by calculating the above described Expression.

Figure 4B:
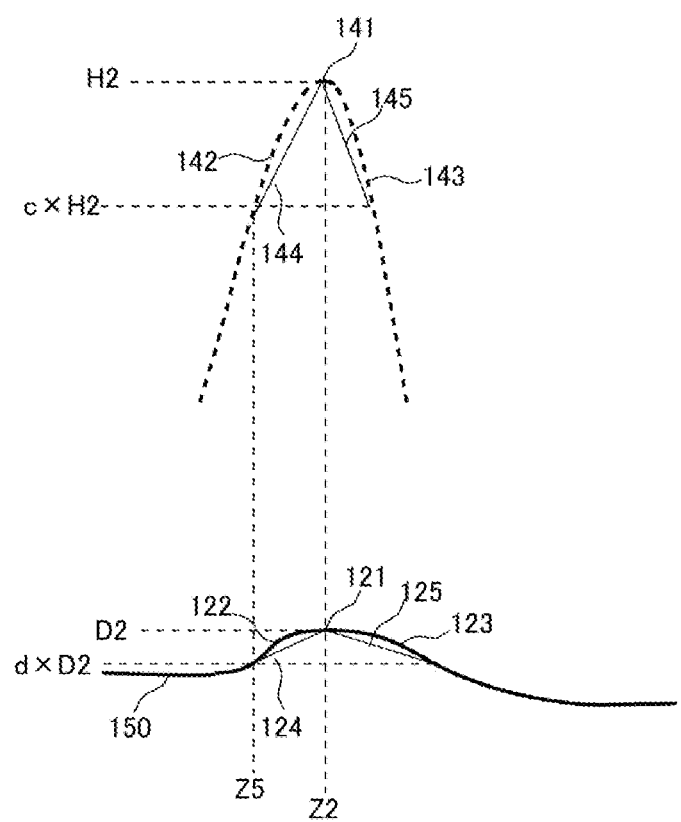
FIG. 4B is a diagram illustrating another definition of normalization of a gradient of an upward slope 122.

FIG. 4B is a diagram illustrating another definition of normalization of a gradient of an upward slope 122. In normalizing the gradient of the upward slope 122, for example, an index c similar to the index γ is introduced. In the example of FIG. 3B, the position Z5 and the position Z6 are different; however, in the present example, the position Z5 and the position Z6 are set as the same position (Z5=Z6). Here, the position Z5 is a predetermined position. The position Z5 only needs to be a position at which the helium concentration distribution and the donor concentration distribution have the upward slopes 142, 122 and which is closer to a lower surface side than the position Z2. At the position Z5, a helium concentration at the position Z5 is set as cxH2, and a donor concentration is set as dxD2. The symbol c is a ratio of the helium concentration at the position Z5 to the concentration H2 of the helium concentration peak 141 at the position Z2. The symbol d is a ratio of the donor concentration at the position Z5 to the concentration D2 of the second donor concentration peak 121 at the position Z2. Here, a ratio of a gradient of each of the helium concentration and the donor concentration in a zone from Z5 to Z2, and a gradient ratio c obtained by normalizing the ratio of the gradient are introduced. The ratio of the gradient of the helium concentration in the zone from Z5 to Z2 is defined as (H2/cH2)/(Z2−Z5). In the same way, the ratio of the gradient of the donor concentration in the zone from Z5 to Z2 is defined as (D2/dD2)/(Z2−Z5). Then, the gradient ratio c obtained by normalizing the ratio of the gradient of the donor concentration by the ratio of the gradient of the helium concentration in the zone from Z5 to Z2 is defined as $\{(D2/dD2)/(Z2-Z5)\}/\{(H2/cH2)/(Z2-Z5)\}$. The normalized gradient ratio c is obtained as a simple ratio c/d by calculating the above described Expression.

Regarding the hydrogen concentration peak 131 and the first donor concentration peak 111, the hydrogen concentration distribution and the donor concentration distribution often have similar shapes. Here, for example, having a similar shape means that when the horizontal axis represents the depth and the vertical axis represents the common logarithm of the concentration, the donor concentration distribution shows a distribution reflecting the hydrogen concentration distribution. That is, in the predetermined zone from Z3 to Z1, by implanting the hydrogen ions and further performing thermal annealing, the donor concentration distribution becomes a distribution reflecting the hydrogen concentration distribution. As an example, when H1 of the hydrogen concentration peak 131 is $1 \times 10^{17}$ atoms/cm³ and the hydrogen concentration aHl at the position Z3 is $2 \times 10^{16}$ atoms/cm³, a is 0.2. On the other hand, when D1 of the first donor concentration peak 111 is $1 \times 10^{16}$ atoms/cm³ and the donor concentration bD1 at the position Z3 is $2\times10^{15}$ atoms/cm³, b is 0.2. Accordingly, the normalized gradient ratio γ is a/b, and thus is 1. That is, at the depth position Z1 close to the lower surface, the ratio a of the gradient of the hydrogen concentration distribution and the ratio b of the gradient of the donor concentration distribution have approximately the same value and can be said to have a similar shape.

On the other hand, regarding the helium concentration peak 141 and the second donor concentration peak 121, the helium concentration distribution and the donor concentration distribution may not have similar shapes. That is, in the predetermined zone from Z5 to Z2, the donor concentration distribution may not reflect the helium concentration distribution. As an example, when H2 of the helium concentration peak 141 is $1\times10^{16}$ atoms/cm³ and the helium concentration cH2 at the position Z5 is $1\times10^{15}$ atoms/cm³, c is 0.1. On the other hand, when D2 of the second donor concentration peak 121 is $3\times10^{14}$ atoms/cm³ and the donor concentration dD2 at the position Z5 is $1.5\times10^{14}$ atoms/cm³, d is 0.5. Accordingly, the normalized gradient ratio c is c/d, and thus is 0.2. That is, at a position Z2 sufficiently deep from the lower surface, the ratio c of the gradient of the helium concentration distribution is a value of 0.2 times the ratio d of the gradient of the donor concentration distribution, and the two ratios can be said to show shapes which are far from being similar to each other.

In comparison between the normalized gradient ratios γ and ε, γ may be close to 1 when the peak position of the helium concentration distribution is close to the lower surface, and c may be a value sufficiently smaller than 1 when the peak position of the helium concentration distribution is sufficiently deep from the lower surface. That is, the normalized gradient ratio ε may be smaller than the normalized gradient ratio γ. Further, the gradient ratio c may be 0.9 or less, 0.5 or less, or 0.2 or less. Alternatively, the gradient ratio ε may be 0.1 or less, or 0.01 or less.

Further, as another example of the second donor concentration peak 121, the donor concentration calculated by Spreading Resistance, that is, a carrier concentration may be lower than carrier concentrations at front and rear positions at the depth position Z2, by reduction of carrier mobility. In such a case, the upward slope 122 has a decreasing gradient, and thus d has a negative sign. That is, d is a negative number whose absolute value is 1 or more. For this reason, ε is a negative number. That is, the normalized gradient ratio ε may be smaller than the normalized gradient ratio γ. Further, the gradient ratio ε may be 0.9 or less, 0 or less, or −1 or less. Alternatively, the gradient ratio ε may be −10 or less, or −100 or less.

Note that an actual position of the helium concentration peak 141 may be different from an actual position of the second donor concentration peak 121. Further, the position of the hydrogen concentration peak 131 and the position of the first donor concentration peak 111 may not exactly match with each other. In this way, when the position of the concentration peak of hydrogen or helium, and the position of the donor concentration peak do not match with each other, the concentration at the peak position of the concentration of hydrogen or helium may be set for the position of the peak of the donor concentration, for convenience. For this reason, a calculation by the above described definition is possible.

An important point in the above description is that the helium concentration peak 141 has the local maximum value. That is, the distribution of the helium concentration has the local maximum value at the depth Z2. Since the helium concentration peak 141 has the local maximum value, it is possible to compare the normalized gradient ratios above described.

Figure 5:
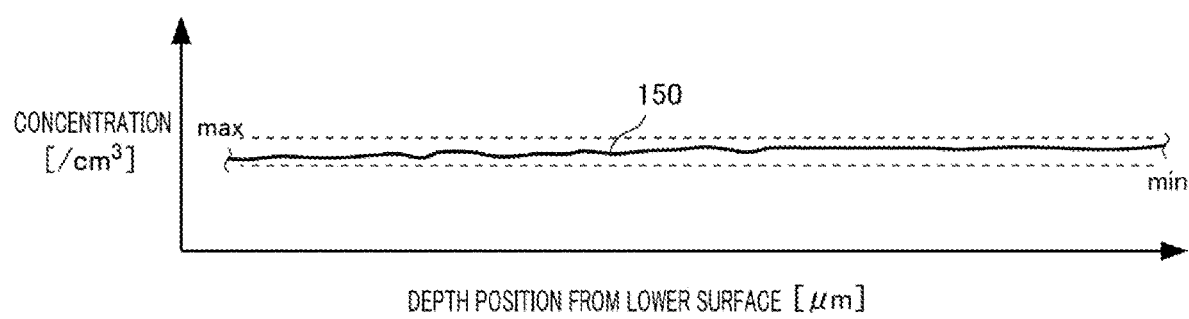
FIG. 5 is a diagram illustrating a flat region 150.

FIG. 5 is a diagram illustrating a flat region 150. As described above, a donor concentration distribution in the flat region 150 is approximately constant in the depth direction. The flat region 150 is a portion in which a region where the donor concentration is between a predetermined maximum value max and a predetermined minimum value min is continuous in the depth direction. As the maximum value max, a maximum value of the donor concentration in the region may be used. The minimum value min may be, with respect to the maximum value max, a value of 50%, a value of 70%, or a value of 90%.

Alternatively, as described above, with respect to an average concentration of the donor concentration distribution in a predetermined range in the depth direction, a value of the donor concentration distribution may be within ±50%, within ±30%, or within ±10% of the average concentration of the donor concentration distribution. The predetermined range in the depth direction may be the same as described above.

Figure 6:
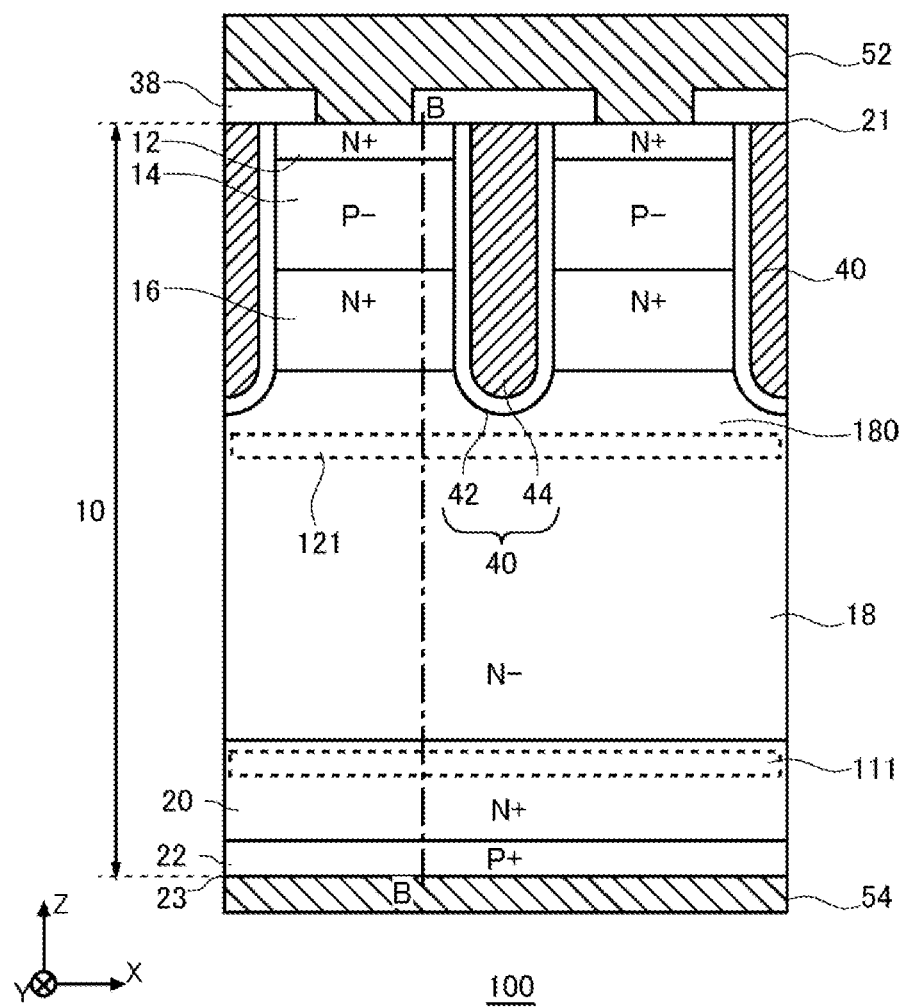
FIG. 6 is a diagram showing a structural example of a semiconductor device 100.

FIG. 6 is a diagram showing a structural example of a semiconductor device 100. The semiconductor device 100 of the present example functions as an IGBT. The semiconductor device 100 of the present example has the semiconductor substrate 10, an interlayer dielectric film 38, an emitter electrode 52, and a collector electrode 54. The interlayer dielectric film 38 is formed to cover at least a part of the upper surface 21 of the semiconductor substrate 10. In the interlayer dielectric film 38, a through hole such as a contact hole is formed. The upper surface 21 of the semiconductor substrate 10 is exposed by the contact hole. The interlayer dielectric film 38 may be silicate glass such as PSG and BPSG, and may be an oxide film, a nitride film, or the like.

The emitter electrode 52 is formed on the upper surfaces of the semiconductor substrate 10 and the interlayer dielectric film 38. The emitter electrode 52 is also formed inside the contact hole and is in contact with the upper surface 21 of the semiconductor substrate 10 exposed by the contact hole.

The collector electrode 54 is formed on the lower surface 23 of the semiconductor substrate 10. The collector electrode 54 may be in contact with the entire lower surface 23 of the semiconductor substrate 10. The emitter electrode 52 and the collector electrode 54 are formed of a metal material such as aluminum.

The semiconductor substrate 10 of the present example is provided with a drift region 18 of the N− type, an emitter region 12 of an N+ type, a base region 14 of a P− type, an accumulation region 16 of the N+ type, a buffer region 20 of the N+ type, and a collector region 22 of a P+ type.

The emitter region 12 is a region that is provided in contact with the upper surface 21 of the semiconductor substrate 10 and that has a higher donor concentration than the drift region 18. The emitter region 12 includes, for example, an impurity of the N type such as phosphorus.

The base region 14 is provided between the emitter region 12 and the drift region 18. The base region 14 includes, for example an impurity of a P type such as boron. As an example, along an extension direction of a trench portion (a Y axis direction in FIG. 6), a contact region of the P type (not shown) which is arranged alternately with the emitter region 12 is included. The contact region may be formed on the upper surface 21 of the base region and may be formed to be deeper than the emitter region 12. The contact region suppresses a latch-up of the IGBT at the time of turn-off.

The accumulation region 16 is provided between the base region 14 and the drift region 18, and has one or more donor concentration peaks whose donor concentration is higher than that of the drift region 18. The accumulation region 16 may include the impurity of the N type such as phosphorus, and may include hydrogen.

The collector region 22 is provided in contact with the lower surface 23 of the semiconductor substrate 10. An acceptor concentration in the collector region 22 may be higher than an acceptor concentration in the base region 14. The collector region 22 may include an impurity of the P type which is the same as or different from that of the base region 14.

The buffer region 20 is provided between the collector region 22 and the drift region 18, and has one or more donor concentration peaks whose donor concentration is higher than that of the drift region 18. The buffer region 20 has an impurity of the N type such as hydrogen. The buffer region 20 may function as a field stop layer which prevents a depletion layer from reaching the collector region 22, the depletion layer extending from a lower surface side of the base region 14.

A gate trench portion 40 passes through the emitter region 12, the base region 14, and the accumulation region 16 from the upper surface 21 of the semiconductor substrate 10 to reach the drift region 18. The accumulation region 16 of the present example is arranged above a lower end of the gate trench portion 40. The accumulation region 16 may be provided to cover the entire lower surface of the base region 14. By providing the accumulation region 16 whose concentration is higher than that of the drift region 18 between the drift region 18 and the base region 14, it is possible to enhance a carrier injection enhancement effect (IE effect, Injection-Enhancement effect), and to reduce an ON voltage in the IGBT.

The gate trench portion 40 has a gate trench, a gate dielectric film 42, and a gate conductive portion 44 which are formed on the upper surface side of the semiconductor substrate 10. The gate dielectric film 42 is formed to cover an inner wall of the gate trench. The gate dielectric film 42 may be formed by oxidizing or nitriding a semiconductor on the inner wall of the gate trench. The gate conductive portion 44 is formed on an inner side further than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 includes a region that faces the base region 14 with the gate dielectric film 42 interposed therebetween. The gate trench portion 40 in the cross section is covered with the interlayer dielectric film 38 on the upper surface of the semiconductor substrate 10; however, the gate conductive portion 44 is connected to a gate electrode in another cross section. When a predetermined gate voltage is applied to the gate conductive portion 44, a channel is formed by an inversion layer with electrons on a surface layer in the base region 14 at an interface in contact with the gate trench portion 40.

The first donor concentration peak 111 may be provided in the buffer region 20. The second donor concentration peak 121 may be provided in a region of the N type above the buffer region 20. The second donor concentration peak 121 may be provided between the buffer region 20 and the accumulation region 16. The second donor concentration peak 121 of the present example is provided in the drift region 18. The second donor concentration peak 121 may be located below the lower end of the gate trench portion 40, may be located in contact with the lower end of the gate trench portion 40, and may be located above the lower end of the gate trench portion 40. Further, a base doping region 180 which is a region of the base doping concentration Db of the substrate may be provided between the second donor concentration peak 121 and the accumulation region 16.

Figure 7:
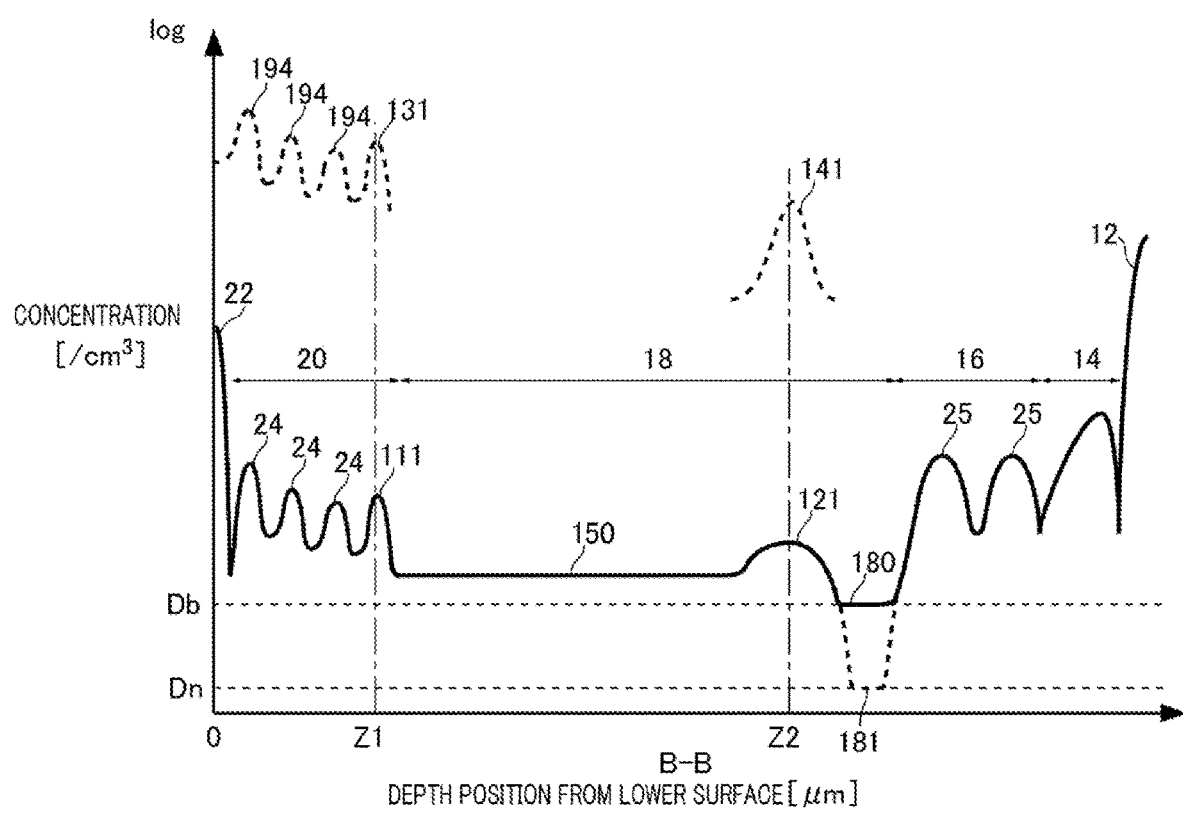
FIG. 7 is a diagram showing an example of a carrier concentration distribution in the depth direction at a position of line B-B in FIG. 6.

FIG. 7 is a diagram showing an example of a carrier concentration distribution in the depth direction at a position of line B-B in FIG. 6. In FIG. 7, parts of the hydrogen concentration distribution and the helium concentration distribution are shown together. The vertical axis in FIG. 7 is a logarithmic axis.

A carrier concentration distribution in the buffer region 20 of the present example has a plurality of peaks 24 provided at different positions in the depth direction. Each of the peaks 24 is a peak of the donor concentration. The peak 24 may have hydrogen as an impurity. By providing the plurality of peaks 24, it is possible to suppress the depletion layer reaching the collector region 22. The first donor concentration peak 111 may function as the peak 24 in the buffer region 20.

As an example, the first donor concentration peak 111 may function as a peak farthest from the lower surface 23 of the semiconductor substrate 10 among the plurality of peaks 24 of the buffer region 20. The flat region 150 is arranged between the first donor concentration peak 111 included in the buffer region 20, and the second donor concentration peak 121.

The first donor concentration peak 111 may have a higher donor concentration than a peak 24 which is apart from the lower surface 23 next to the first donor concentration peak 111 among the plurality of peaks 24 of the buffer region 20. By making the concentration of the first donor concentration peak 111 be high, the flat region 150 can be easily formed even when the first donor concentration peak 111 is spaced away from the second donor concentration peak 121 in distance. The hydrogen concentration distribution may have one or more hydrogen concentration peaks 194 between the first depth Z1 and the lower surface 23. A hydrogen concentration peak 194 may be located in the buffer region 20 described in FIG. 6 or the like. The hydrogen concentration peak 194 may be located at the same depth position as the peak 24.

The accumulation region 16 of the present example has a plurality of peaks 25. Each of the peaks 25 is a peak of the donor concentration. The second donor concentration peak 121 is located to be closer to the lower surface 23 side than the accumulation region 16. Between the second donor concentration peak 121 and the accumulation region 16, the region (the base doping region 180) of the base doping concentration Db of the substrate may be provided. In another example, a donor concentration between the second donor concentration peak 121 and the accumulation region 16 may be higher than the base doping concentration Db of the semiconductor substrate.

Further, the semiconductor device 100 may use, as the semiconductor substrate 10, a non-doping substrate for which the entire ingot is not doped with a dopant such as phosphorus (P) during manufacturing of the semiconductor ingot. In this case, a base doping concentration Dn of the semiconductor substrate 10 is lower than the base doping concentration Db. In the example of FIG. 7, a region where the doping concentration is the base doping concentration Dn is set as a non-doping region 181. The base doping concentration Dn of the non-doping region 181 is, for example, $1\times10^{10}$ atoms/cm$^3$ or higher and $5\times10^{12}$ atoms/cm$^3$ or lower. The base doping concentration Dn may be $1\times10^{11}$ atoms/cm$^3$ or higher. The base doping concentration Dn may be $5\times10^{12}$ atoms/cm$^3$ or lower. Note that each concentration in the present specification may be a value at a room temperature. As the room temperature, for example, a value at 300 K (kelvins) (about 26.9° C.) may be used.

Figure 8:
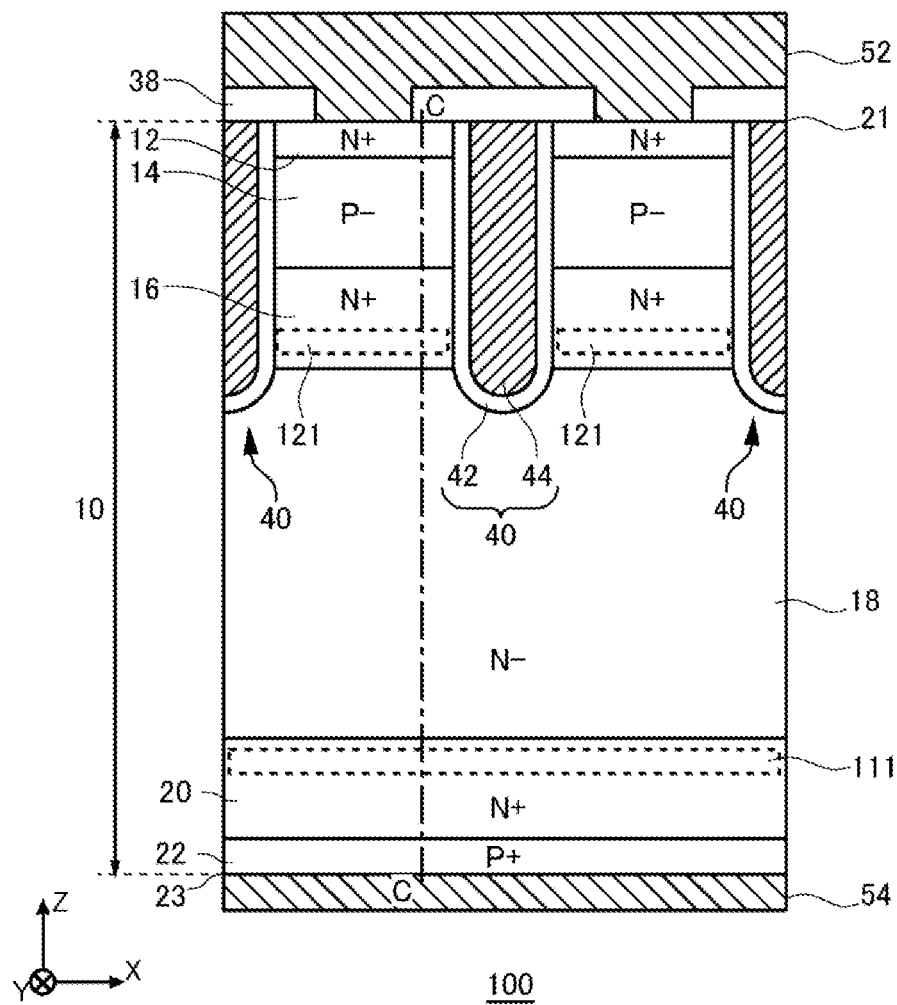
FIG. 8 is a diagram showing another structural example of the semiconductor device 100.

FIG. 8 is a diagram showing another structural example of the semiconductor device 100. The semiconductor device 100 of the present example is different from the semiconductor device 100 described in FIG. 6 and FIG. 7 in that the second donor concentration peak 121 (and the helium concentration peak 141) is located in the accumulation region 16. Other structures may be the same as those of the semiconductor device 100 described in FIG. 6 and FIG. 7.

Figure 9:
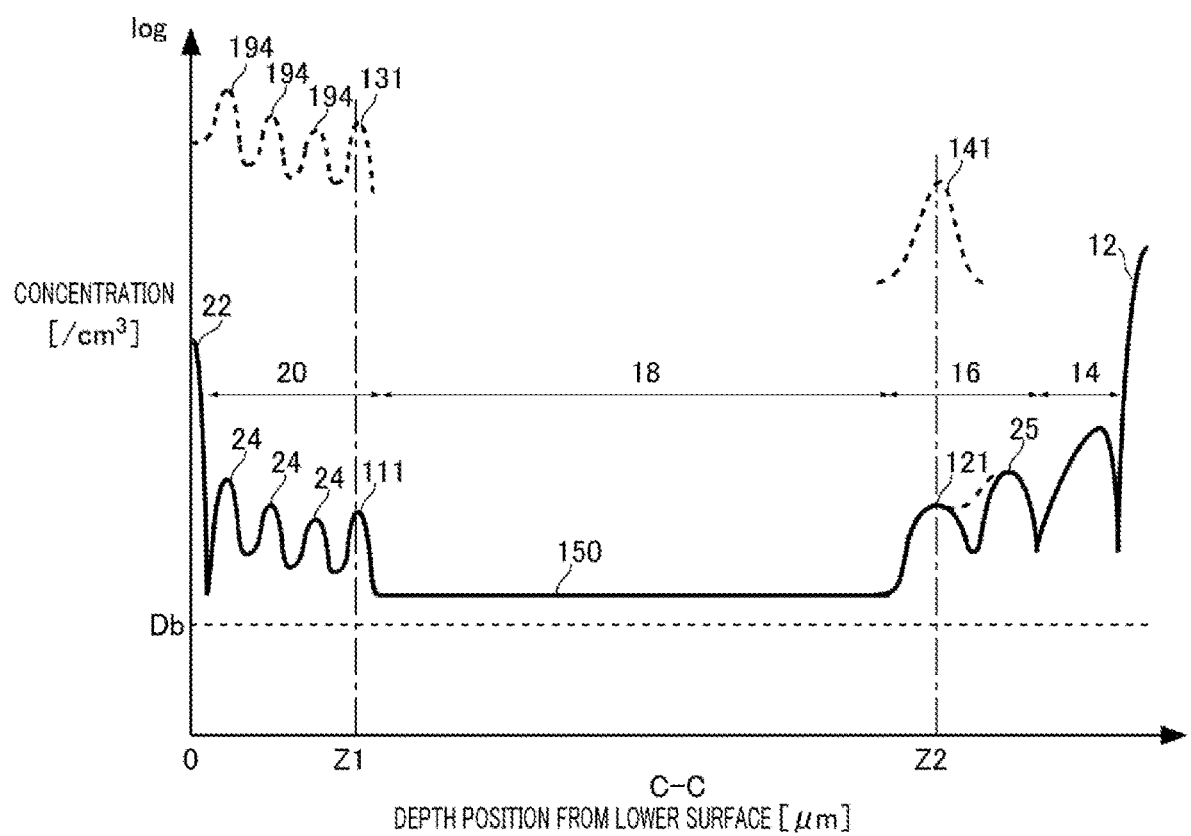
FIG. 9 is a diagram showing an example of a carrier concentration distribution in the depth direction at a position of line C-C in FIG. 8.

FIG. 9 is a diagram showing an example of a carrier concentration distribution in the depth direction at a position of line C-C in FIG. 8. In FIG. 9, parts of the hydrogen concentration distribution and the helium concentration distribution are shown together. The vertical axis in FIG. 9 is a logarithmic axis.

A carrier concentration distribution in the accumulation region 16 of the present example has a plurality of peaks provided at different positions in the depth direction. Each of the peaks is a peak of the donor concentration. The peak in the accumulation region 16 may have hydrogen or phosphorus as an impurity. In a structure in which a gate trench portion and a dummy trench portion are arranged to be adjacent to each other (for example, refer to WO2018/030440), by providing the plurality of peaks in the accumulation region 16, it is possible to suppress a displacement current to the gate trench portion. The dummy trench portion has a structure similar to that of the gate trench portion, and is a trench portion to which an emitter potential is applied.

The second donor concentration peak 121 of the present example functions as any of the donor concentration peaks in the accumulation region 16. As an example, the second donor concentration peak 121 may function as a peak farthest from the upper surface 21 of the semiconductor substrate 10 among the plurality of peaks of the accumulation region 16. The flat region 150 of the present example is arranged between the first donor concentration peak 111 included in the buffer region 20 and the second donor concentration peak 121 included in the accumulation region 16.

The donor concentration of the second donor concentration peak 121 may be lower than, the same as, or higher than the donor concentration of the other peak 25 of the accumulation region 16. When the accumulation region 16 has three or more peaks, peaks 25 other than the second donor concentration peak 121 may have the same donor concentration. The donor concentration of the second donor concentration peak 121 may be determined depending on the donor concentration that the flat region 150 should have.

A carrier concentration of the drift region 18 in the present example may be higher than the base doping concentration Db of the substrate over the entire depth direction. With such a structure, the entire carrier concentration of the drift region 18 can be adjusted with a high precision.

The peak 25 other than the second donor concentration peak 121 may be a peak due to a donor other than hydrogen. For example, the peak 25 is a peak for which phosphorus functions as a donor. By using phosphorus as a donor, the VOH defect is less likely to be generated, and the donor concentrations in the peak 25 and in the vicinity thereof can be easily controlled by a phosphorus concentration. Further, a width of the second donor concentration peak 121 in the depth direction may be wider than a width of the peak 25 in the depth direction. This makes it possible to further suppress the displacement current to the gate trench portion. Further, between the second donor concentration peak 121 and the peak 25 of the accumulation region 16, there may be a valley of the donor concentration distribution as shown in FIG. 9. Alternatively, as shown by a dotted line between the two peaks in FIG. 9, the donor concentration distribution of the accumulation region 16 may have a kink rather than a valley.

Figure 10:
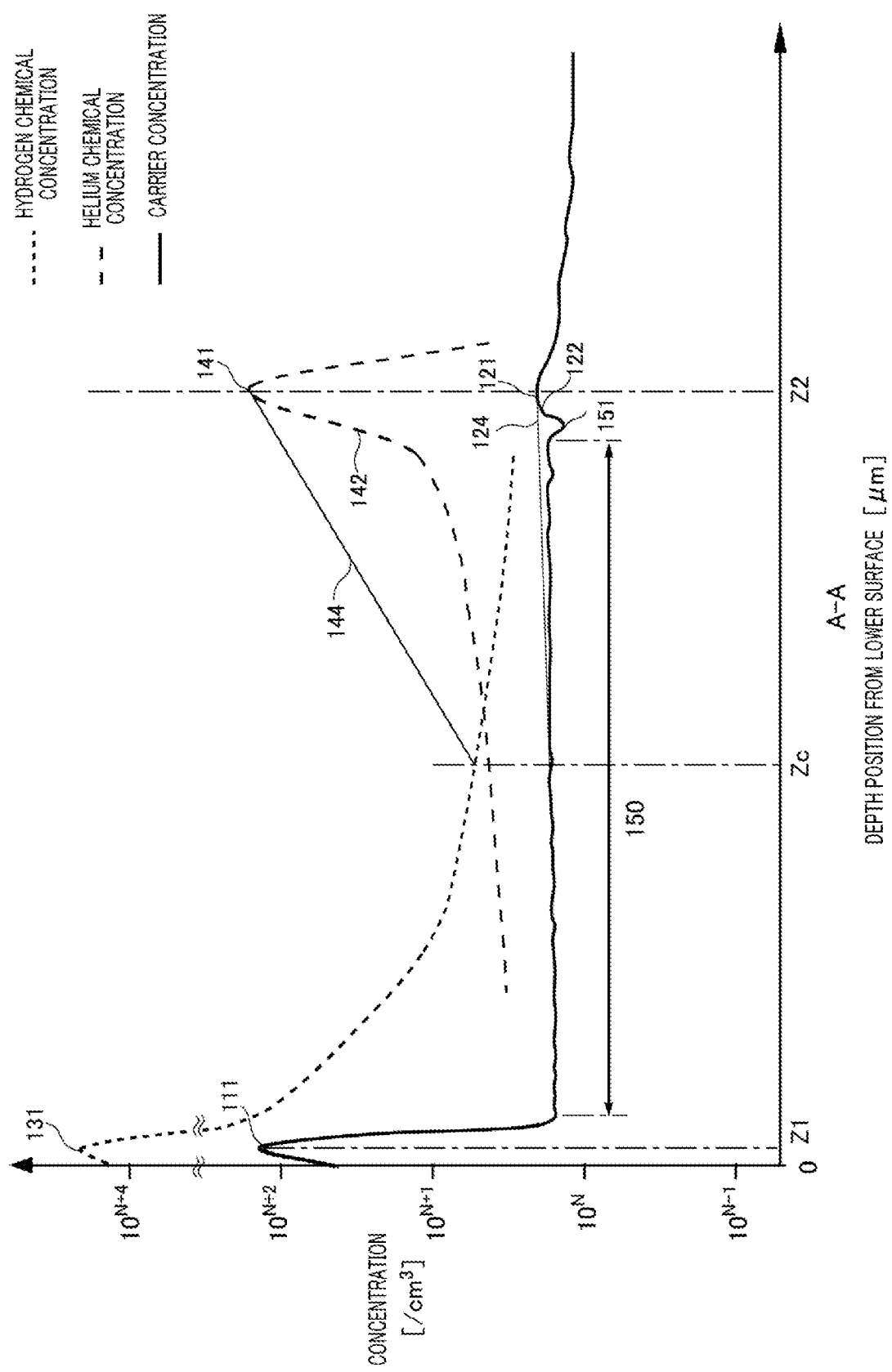
FIG. 10 shows the hydrogen concentration distribution, the helium concentration distribution, and a carrier concentration distribution in the depth direction at the position shown by the line A-A in FIG. 1.

FIG. 10 shows the hydrogen concentration distribution, the helium concentration distribution, and a carrier concentration distribution in the depth direction at the position shown by the line A-A in FIG. 1. The carrier concentration is measured by the SR profiling. More defects are easily generated in the vicinity of a range (Z2) of the helium concentration peak 141 than in the passed-through region 106. Due to a defect remaining without being combined with hydrogen, a valley 151 may be generated in the carrier concentration distribution in the vicinity of the second depth Z2.

When the valley 151 is generated, the gradient of the upward slope 122 of the second donor concentration peak 121 may be steep in calculation. Therefore, it is preferable to calculate the gradient of the upward slope 122 without an influence of the valley 151. For example, the gradient of each upward slope of the second donor concentration peak 121 and the helium concentration peak 141 may be calculated by using the concentrations at the second depth Z2 and the concentrations at a depth Zc. The depth Zc may be a position closer to the lower surface 23 side than the valley 151. The depth Zc in the present example is the center depth of the flat region 150 in the depth direction. This makes it possible to normalize the gradient of the upward slope 122 of the second donor concentration peak 121 without the influence of the valley 151. As described above, in the normalization, a gradient of the concentration difference may be used, and a gradient of a ratio of the concentration may be used.

Figure 11:
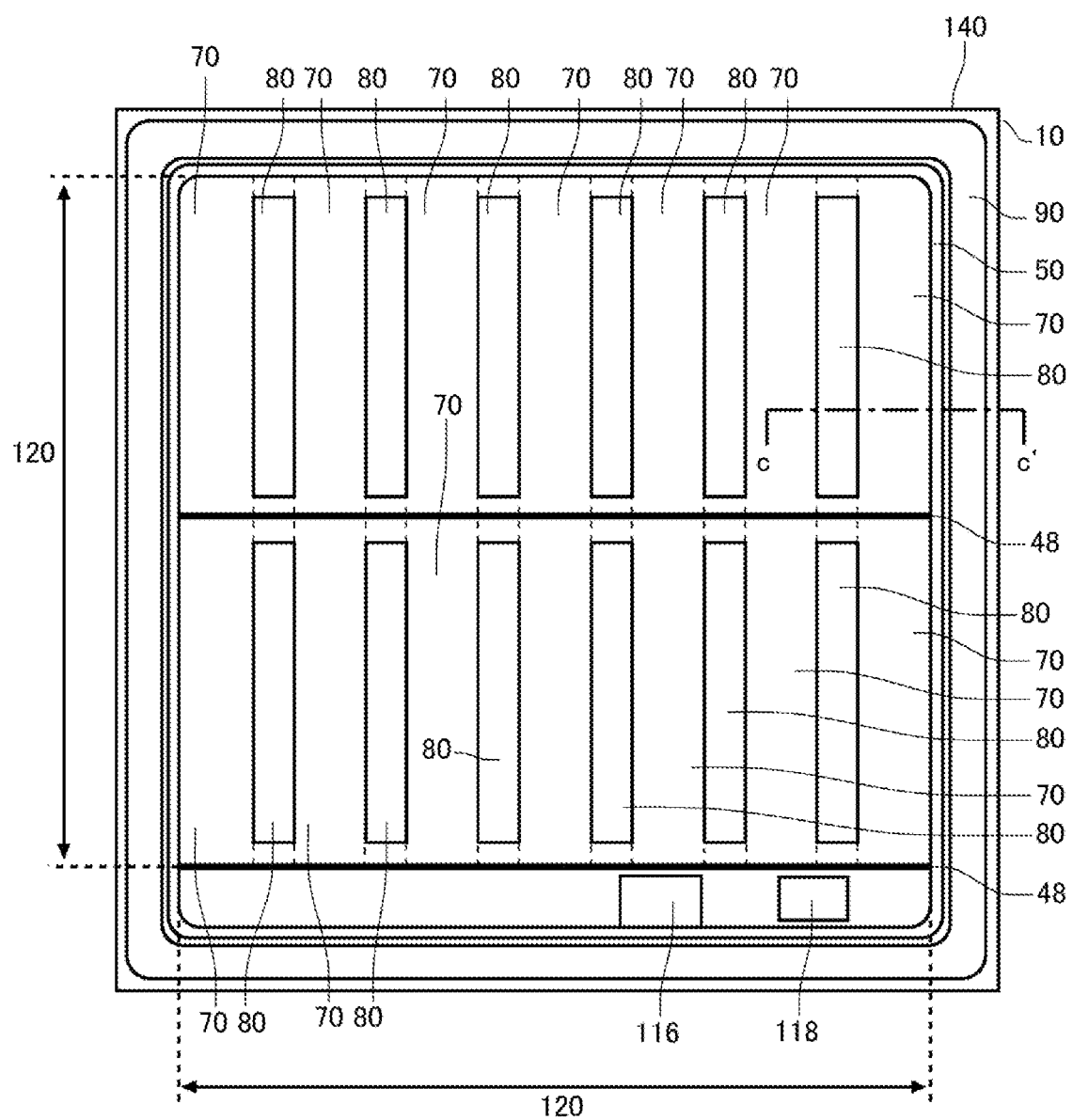
FIG. 11 is a diagram showing an arrangement example of each element on an upper surface 21 of a semiconductor substrate 10.

FIG. 11 is a diagram showing an arrangement example of each element on an upper surface 21 of a semiconductor substrate 10. In FIG. 11, an end portion of an outer periphery of the semiconductor substrate 10 is defined as an outer peripheral end 140.

The semiconductor device 100 includes an active portion 120 and an edge termination structure portion 90. When the semiconductor device 100 is controlled to be in an ON state, the active portion 120 is a region where a main current flows between the upper surface 21 and the lower surface 23 of the semiconductor substrate 10. That is, the active portion 120 is a region where a current flows inside the semiconductor substrate 10 in the depth direction, from the upper surface 21 to the lower surface 23 of the semiconductor substrate 10, or from the lower surface 23 to the upper surface 21.

The active portion 120 in the present example is provided with a transistor portion 70 and a diode portion 80. The transistor portion 70 and the diode portion 80 may be arranged in the X axis direction. In the example of FIG. 11, the transistor portion 70 and the diode portion 80 are alternately arranged in contact with each other in an X axis direction. In the active portion 120, the transistor portions 70 may be provided at both ends in the X axis direction. The emitter electrode 52 may cover the transistor portion 70 and the diode portion 80. The active portion 120 may indicate a region covered with the emitter electrode 52.

The transistor portion 70 of the present example has the IGBT (insulated gate bipolar transistor) described in FIG. 6 to FIG. 10. The diode portion 80 of the present example has an FWD (Free Wheeling Diode). In each diode portion 80, a cathode region 82 of the N+ type is provided in a region in contact with the lower surface 23 of the semiconductor substrate 10. In FIG. 11, the diode portion 80 shown by the solid line is a region where the cathode region 82 is provided on the lower surface 23 of the semiconductor substrate 10. In the semiconductor device 100 of the present example, in the region in contact with the lower surface 23 of the semiconductor substrate 10, the collector region 22 is provided in a region other than the cathode region 82.

The diode portion 80 is a region where the cathode region 82 is projected in the Z axis direction. The transistor portion 70 is a region where the collector region 22 is provided on the lower surface 23 of the semiconductor substrate 10, and a unit structure including the emitter region 12 is periodically provided on the upper surface 21 of the semiconductor substrate 10. A boundary between the diode portion 80 and the transistor portion 70 in the Y axis direction is a boundary between the cathode region 82 and the collector region 22. The diode portion 80 may also include a portion (in FIG. 11, a portion indicated by a dashed line extending the diode portion 80) which is obtained by extending the region, where the cathode region 82 is projected, to an end portion of the active portion 120 or a gate runner 48 in the Y axis direction. The extended portion is not provided with the emitter region 12.

The semiconductor device 100 of the present example further includes a gate metal layer 50 and the gate runner 48. Further, the semiconductor device 100 may have each pad of a gate pad 116, an emitter pad 118, and the like. The gate pad 116 is electrically connected to the gate metal layer 50 and the gate runner 48. The emitter pad 118 is electrically connected to the emitter electrode 52.

The gate metal layer 50 may be provided so as to surround the active portion 120 in a top plan view. The gate pad 116 and the emitter pad 118 may be arranged in a region surrounded by the gate metal layer 50. The gate metal layer 50 may be formed of a metal material such as aluminum or an aluminum silicon alloy. The gate metal layer 50 is insulated from the semiconductor substrate 10 by the interlayer dielectric film 38. In FIG. 11, an illustration of the interlayer dielectric film 38 is omitted. Further, the gate metal layer 50 is provided to be separate from the emitter electrode 52. The gate metal layer 50 transfers a gate voltage applied to the gate pad 116 to the transistor portion 70. The gate conductive portion 44 of the transistor portion 70 is directly connected to the gate metal layer 50, or indirectly connected to the gate metal layer 50 via another conductive member.

The gate runner 48 connects the gate metal layer 50 and the gate conductive portion 44. The gate runner 48 may be formed of a semiconductor material such as polysilicon doped with impurities. A part of the gate runner 48 may be provided above the active portion 120. The gate runner 48 shown in FIG. 11 is provided across the active portion 120 in the X axis direction. This makes it possible to suppress a decrease and a delay of the gate voltage even in an inner side of the active portion 120 which is spaced away from the gate metal layer 50. A part of the gate runner 48 may be arranged to surround the active portion 120 along the gate metal layer 50. The gate runner 48 may be connected to the gate conductive portion 44 at the end portion of the active portion 120.

On the upper surface 21 of the semiconductor substrate 10, the edge termination structure portion 90 is provided between the active portion 120 and the outer peripheral end 140 of the semiconductor substrate 10. In the present example, the gate metal layer 50 is arranged between the edge termination structure portion 90 and the active portion 120. The edge termination structure portion 90 may be arranged to be loop-shaped to surround the active portion 120 on the upper surface 21 of the semiconductor substrate 10. The edge termination structure portion 90 of the present example is arranged along the outer peripheral end 140 of the semiconductor substrate 10. The edge termination structure portion 90 relaxes an electric field concentration on the upper surface 21 side of the semiconductor substrate 10. The edge termination structure portion 90 has, for example, a structure of a guard ring, a field plate, a RESURF, and a combination of these.

Figure 12:
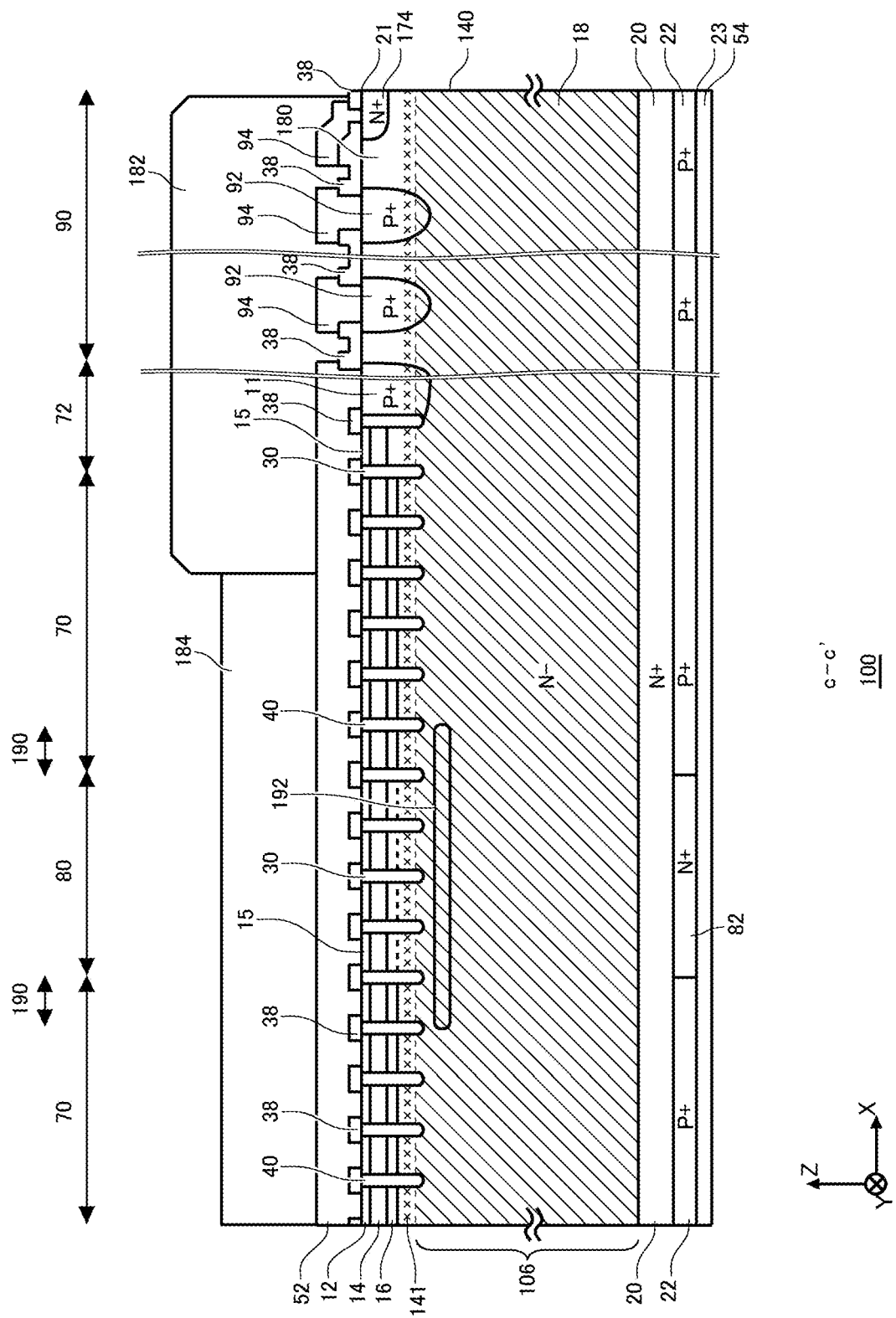
FIG. 12 is a view showing an example of a cross section c-c' in FIG. 11.

FIG. 12 is a view showing an example of a cross section c-c' in FIG. 11. FIG. 12 shows an arrangement example of the passed-through region 106 described in FIG. 1 to FIG. 10 in the cross section. In FIG. 12, the passed-through region 106 is hatched with diagonal lines. Note that in FIG. 12, only the passed-through region 106 in the drift region 18 is shown, and an illustration of the passed-through regions 106 in the buffer region 20, the collector region 22, and the cathode region 82 is omitted.

The cross section shown in FIG. 12 is an XZ plane including the edge termination structure portion 90, the transistor portion 70, and the diode portion 80. Note that although the gate metal layer 50 and the gate runner 48 are arranged between the edge termination structure portion 90 and the transistor portion 70, an illustration of these is omitted in FIG. 12. A structure of the transistor portion 70 is similar to that of the IGBT described in FIG. 6 to FIG. 10.

The diode portion 80 includes the base region 14, the drift region 18, the cathode region 82, and a dummy trench portion 30 inside the semiconductor substrate 10. The base region 14 and the drift region 18 are the same as the base region 14 and the drift region 18 in the transistor portion 70.

In the diode portion 80, in a region in contact with the upper surface 21 of the semiconductor substrate 10, the base region 14 may be provided, and a contact region 15 may be provided. The contact region 15 is a region of the P+ type that has a higher doping concentration than the base region 14. The diode portion 80 in the present example is not provided with the emitter region 12. Further, the diode portion 80 may be provided with, or may not be provided with the accumulation region 16.

The dummy trench portion 30 has the same structure as the gate trench portion 40. Note that the dummy trench portion 30 is electrically connected to the emitter electrode 52. Each dummy trench portion 30 is provided from the upper surface 21 of the semiconductor substrate 10 to the drift region 18 and passes through the base region 14. The dummy trench portion 30 may also be provided in the transistor portion 70. In the transistor portion 70, the dummy trench portion 30 and the gate trench portion 40 may be arranged at a predetermined period.

Between the transistor portion 70 and the diode portion 80, there may be an intermediate boundary region 190. The intermediate boundary region 190 is a region where neither an operation of the transistor portion 70 nor an operation of the diode portion 80 is directly performed. As an example, a region, of the intermediate boundary region 190, which is in contact with the upper surface 21 may have the same structure as the upper surface 21 side of the diode portion 80. Further, in a region, of the intermediate boundary region 190, which is in contact with the lower surface 23 in the top plan view, the collector region of the transistor portion 70 may be provided to be extended. In FIG. 12, only a range example of the intermediate boundary region 190 is shown by an arrow. In FIG. 12, the range illustrated as the intermediate boundary region 190 also has the same structure as the transistor portion 70.

In the drift region 18 of the diode portion 80, a lifetime control region 192 may be provided to be closer to the upper surface 21 side than the center in the depth direction. The lifetime control region 192 is a region where a recombination center of a carrier (an electron or a hole) is provided at a higher concentration than that of a periphery. The recombination center may be a vacancy type defect such as the vacancy and the divacancy, may be a dislocation, may be an interstitial atom, and may be transition metal, or the like. The lifetime control region 192 may extend from the diode portion 80 to the intermediate boundary region 190.

The edge termination structure portion 90 is provided with a plurality of guard rings 92, a plurality of field plates 94, and a channel stopper 174. In the edge termination structure portion 90, in a region in contact with the lower surface 23, the collector region 22 may be provided. Each guard ring 92 may be provided to surround the active portion 120 on the upper surface 21. The plurality of guard rings 92 may have a function of extending the depletion layer generated in the active portion 120 to an outside of the semiconductor substrate 10. This makes it possible to prevent the electric field concentration inside the semiconductor substrate 10 and to improve the withstand voltage of the semiconductor device 100.

The guard ring 92 of the present example is a semiconductor region of the P+ type formed by the ion implantation in the vicinity of the upper surface 21. A depth of a bottom portion of the guard ring 92 may be deeper than depths of bottom portions of the gate trench portion 40 and the dummy trench portion 30.

An upper surface of the guard ring 92 is covered with the interlayer dielectric film 38. The field plate 94 is formed of a conductive material such as metal or polysilicon. The field plate 94 may be formed of the same material as the gate metal layer 50 or the emitter electrode 52. The field plate 94 is provided on the interlayer dielectric film 38. The field plate 94 is connected to the guard ring 92 through a through hole provided in the interlayer dielectric film 38.

A protective film 182 is provided on the upper surface 21 side of the semiconductor substrate 10. The protective film 182 may cover the edge termination structure portion 90, the gate metal layer 50, a boundary portion 72, a part of a portion, of the active portion, which is in contact with the boundary portion 72, and the like. The protective film 182 may be a dielectric film or an organic thin film. The protective film 182 of the present example is polyimide. A plating layer 184 may be provided on the entire surface of an exposed portion, of the emitter electrode 52, in which the protective film 182 is not formed. A surface of the plating layer 184 may be located to be closer to the upper surface 21 side than the surface of the protective film 182. The plating layer 184 is connected to an electrode terminal of a power module on which the semiconductor device 100 is mounted.

The channel stopper 174 is provided to be exposed on the upper surface 21 and a side surface of the outer peripheral end 140. The channel stopper 174 is a region of the N type whose doping concentration is higher than the drift region 18. The channel stopper 174 has a function of terminating the depletion layer generated in the active portion 120 at the outer peripheral end 140 of the semiconductor substrate 10.

The boundary portion 72 may be provided between the transistor portion 70 and the edge termination structure portion 90. The boundary portion 72 may have the contact region 15, the base region 14, and the dummy trench portion 30 on the upper surface 21 side of the semiconductor substrate 10. The boundary portion 72 may have a well region 11 of the P+ type whose doping concentration is higher than the base region 14. The well region 11 is provided to be in contact with the upper surface 21 of the semiconductor substrate 10. The gate metal layer 50 and the gate runner 48 may be provided above the well region 11. A depth of a bottom portion of the well region 11 may be the same as the depth of a bottom portion of the guard ring 92. Some trench portion at the boundary portion 72 may be formed in the well region 11. In the boundary portion 72, the collector region 22 may be provided in a region in contact with the lower surface 23.

In the present example, the helium concentration peak 141 is located between the bottom portion of the gate trench portion 40 in the Z axis direction and the upper surface 21 of the semiconductor substrate 10. In the example of FIG. 12, the helium concentration peak 141 is located at a position deeper than the accumulation region 16; however, the helium concentration peak 141 may be located at the same depth as the accumulation region 16, may be located at the same depth as the base region 14, and may be located at the same depth as the emitter region 12. Note that the accumulation region 16 may also be formed in the diode portion 80 as shown by the dotted line in FIG. 12.

The passed-through region 106 is formed in the range from the lower surface 23 of the semiconductor substrate 10 to the helium concentration peak 141. In each drawing, the helium concentration peak 141 and the passed-through region 106 do not overlap each other; however, the passed-through region 106 is formed up to the depth of the helium concentration peak 141.

Further, the passed-through region 106 of the present example is provided in each of the transistor portion 70, the diode portion 80, the boundary portion 72, and the edge termination structure portion 90. In each of the transistor portion 70, the diode portion 80, the boundary portion 72, and the edge termination structure portion 90, the depth of the passed-through region 106 may be the same. The passed-through region 106 may be provided in the entire semiconductor substrate 10 in the top plan view. With the present example, the donor concentration can be adjusted over approximately the entire depth direction of the semiconductor substrate 10. The donor concentration can also be adjusted over approximately the entire semiconductor substrate 10 in the top plan view.

In the present example, a region where the passed-through region 106 is not formed is particularly provided in a portion in contact with the upper surface 21 of the edge termination structure portion 90. The region where this passed-through region 106 is not formed is a portion where the donor concentration is the same as the base doping concentration Db. The region where the passed-through region 106 is not formed is closer to the upper surface 21 side than the depth of the helium concentration peak 141. That is, the region where the passed-through region 106 is not formed may be a region where the doping concentration is approximately the base doping concentration Db. The region where the doping concentration is the base doping concentration Db is defined as the base doping region 180. In the present example, the base doping region 180 is provided in a portion that is in contact with the upper surface 21 and is shallower than the well region 11.

Figure 13:
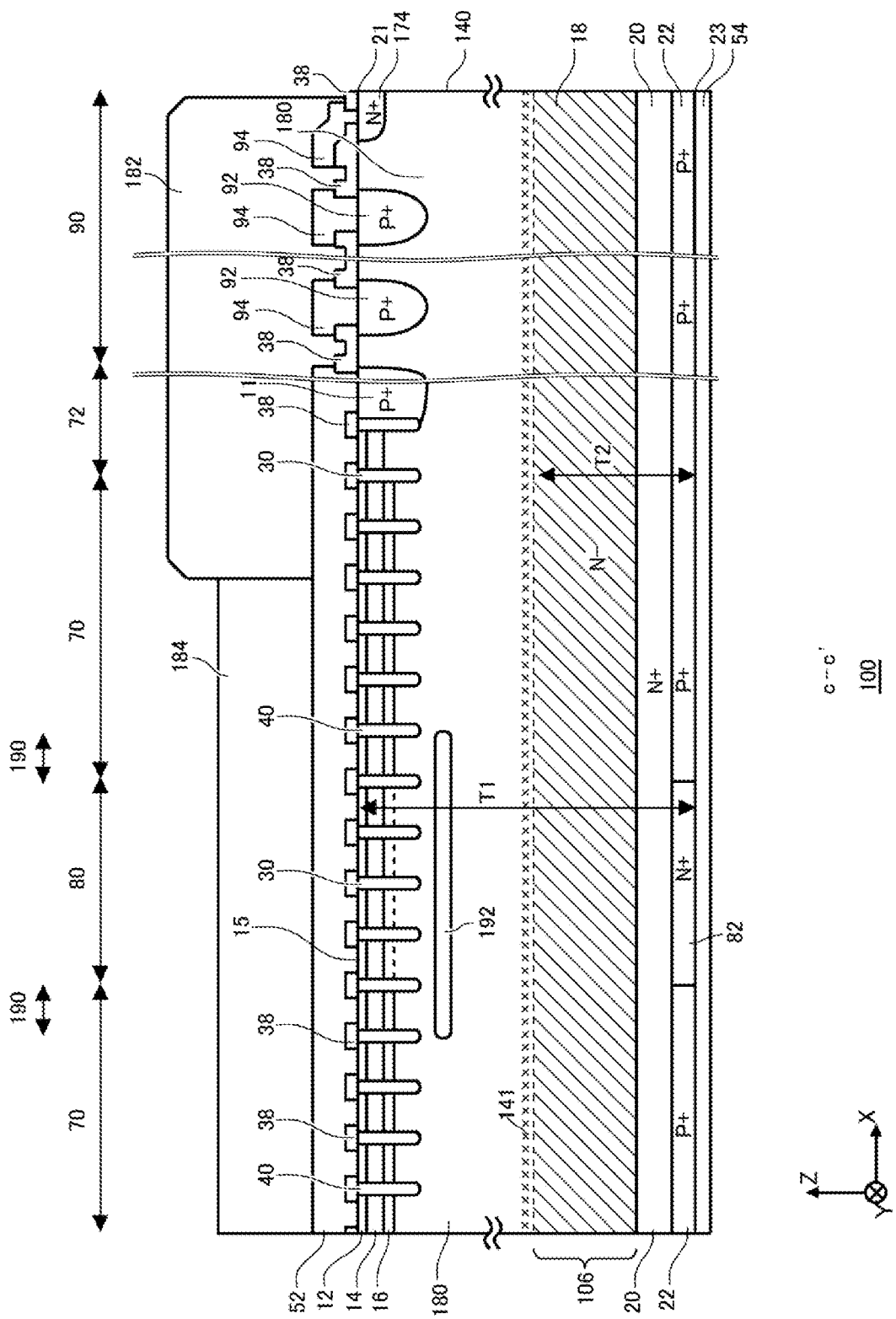
FIG. 13 is a diagram showing another arrangement example of a passed-through region 106.

FIG. 13 is a diagram showing another arrangement example of a passed-through region 106. The passed-through region 106 of the present example is different from the passed-through region 106 in FIG. 12 in width in the depth direction. An arrangement in the top plan view is the same as that of the passed-through region 106 in FIG. 12.

The helium concentration peak 141 in the present example is located between the bottom portion of the gate trench portion 40 and the lower surface 23 of the semiconductor substrate 10. The thickness of the semiconductor substrate 10 in the depth direction is set as T1, and a distance between the helium concentration peak 141 and the lower surface 23 of the semiconductor substrate 10 is set as T2. The distance T2 corresponds to a thickness of the passed-through region 106 in the depth direction. The distance T2 may be 40% or more and 60% or less of the thickness T1. That is, the passed-through region 106 may be provided from the lower surface 23 of the semiconductor substrate 10 to approximately the center of the semiconductor substrate 10 in the depth direction. Note that the distance T2 can be changed properly.

As described above, the base doping region 180 is provided to be closer to the upper surface 21 side than the helium concentration peak 141. The base doping region 180 of the present example is a region from a bottom surface of the trench portion to the helium concentration peak 141, and has a depth of about T1-T2. In the top plan view, the base doping region 180 of the present example is provided on the entire surface of the semiconductor substrate 10.

Figure 14:
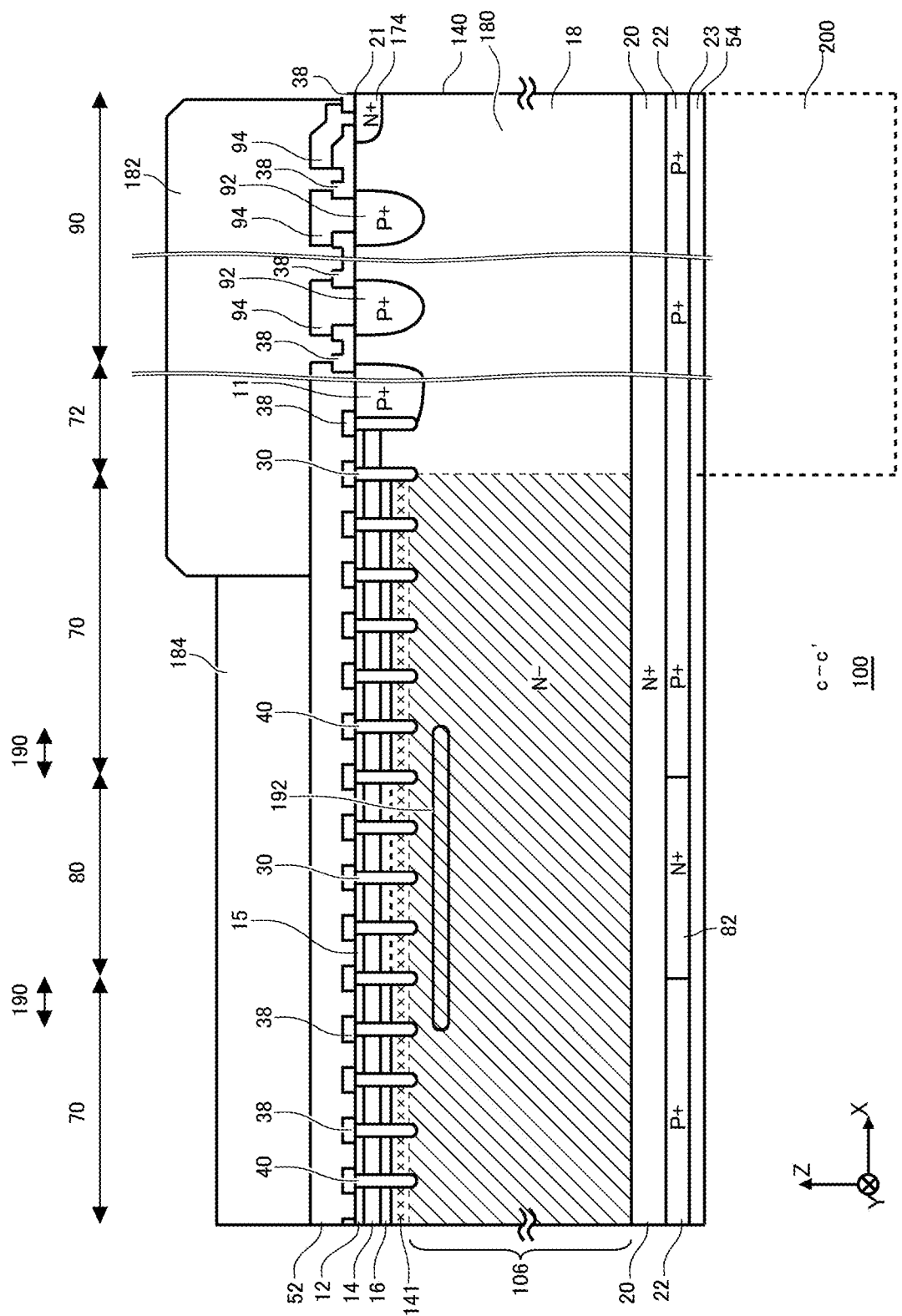
FIG. 14 is a diagram showing another arrangement example of the passed-through region 106.

FIG. 14 is a diagram showing another arrangement example of the passed-through region 106. The passed-through region 106 of the present example is different from the passed-through region 106 in FIG. 12 in arrangement in the top plan view. The arrangement in the depth direction may be the same as that of the passed-through region 106 in FIG. 12.

In the present example, the passed-through region 106 and the helium concentration peak 141 are not provided in at least a partial region of the edge termination structure portion 90 in the top plan view. FIG. 14 shows an example in which the passed-through region 106 and the helium concentration peak 141 are not provided in the entire edge termination structure portion 90 in the top plan view. In another example, the passed-through region 106 and the helium concentration peak 141 may be provided at an end portion of a side, in the edge termination structure portion 90, which is close to the active portion 120. That is, the passed-through region 106 and the helium concentration peak 141 are not provided in a region in contact with the outer peripheral end 140 of the semiconductor substrate 10. In the present example, since the helium concentration peak 141 is not provided in the vicinity of the outer peripheral end 140, it is possible to suppress the formation of the defect in the vicinity of the outer peripheral end 140. Therefore, it is possible to suppress an increase in leak at the outer peripheral end 140.

That is, the base doping region 180 of the present example is provided in the region in contact with the outer peripheral end 140 of the semiconductor substrate 10. The base doping region 180 of the present example is provided in at least a partial region of the edge termination structure portion 90 in the top plan view. Further, the base doping region 180 may be provided in the entire edge termination structure portion 90, and the boundary portion 72 in the top plan view.

Note that an arrangement of the passed-through region 106 in the boundary portion 72 may be the same as in the edge termination structure portion 90, may be the same as in the transistor portion 70, and may be the same as in the diode portion 80. FIG. 14 shows an example in which the passed-through region 106 is not provided in the boundary portion 72.

Figure 15:
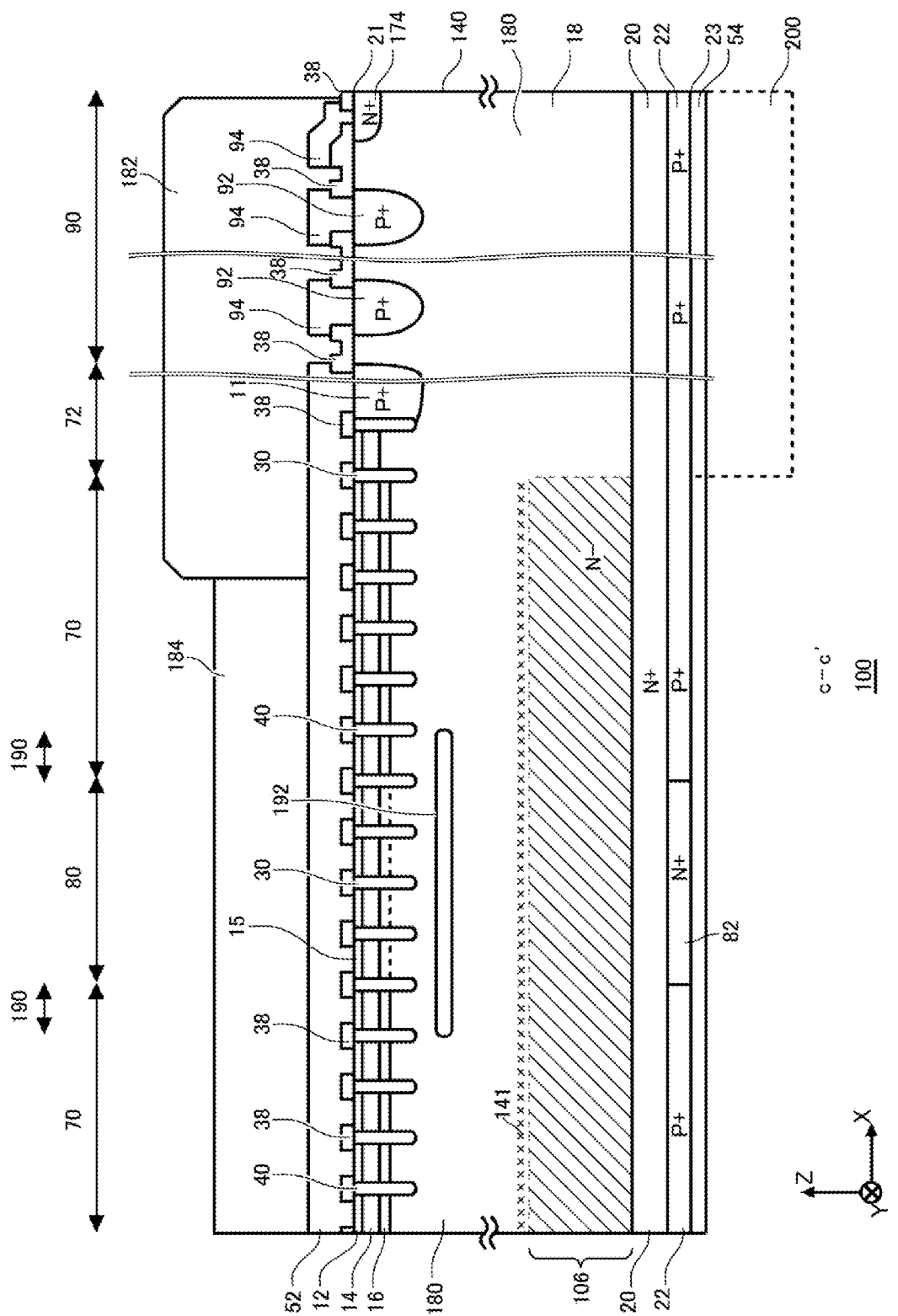
FIG. 15 is a diagram showing another arrangement example of the passed-through region 106.

FIG. 15 is a diagram showing another arrangement example of the passed-through region 106. The passed-through region 106 of the present example has the same arrangement in the depth direction as the passed-through region 106 shown in FIG. 13, and has the same arrangement in the top plan view as the passed-through region 106 shown in FIG. 14. That is, the edge termination structure portion 90 is not provided with the passed-through region 106. Further, the transistor portion 70 and the diode portion 80 are provided with the passed-through region 106 from the lower surface 23 of the semiconductor substrate 10 to the vicinity of the center of the semiconductor substrate 10 in the depth direction.

The base doping region 180 of the present example is formed from the upper surface 21 to the buffer region 20 in the boundary portion 72 and the edge termination structure portion 90. Further, in the active portion, the base doping region 180 is formed in the drift region 18 closer to the upper surface 21 side than the helium concentration peak 141. The base doping region 180 of the present example is provided to be closer to the upper surface 21 side than the helium concentration peak 141 on the entire surface of the semiconductor substrate 10 in the top plan view.

Figure 16A:
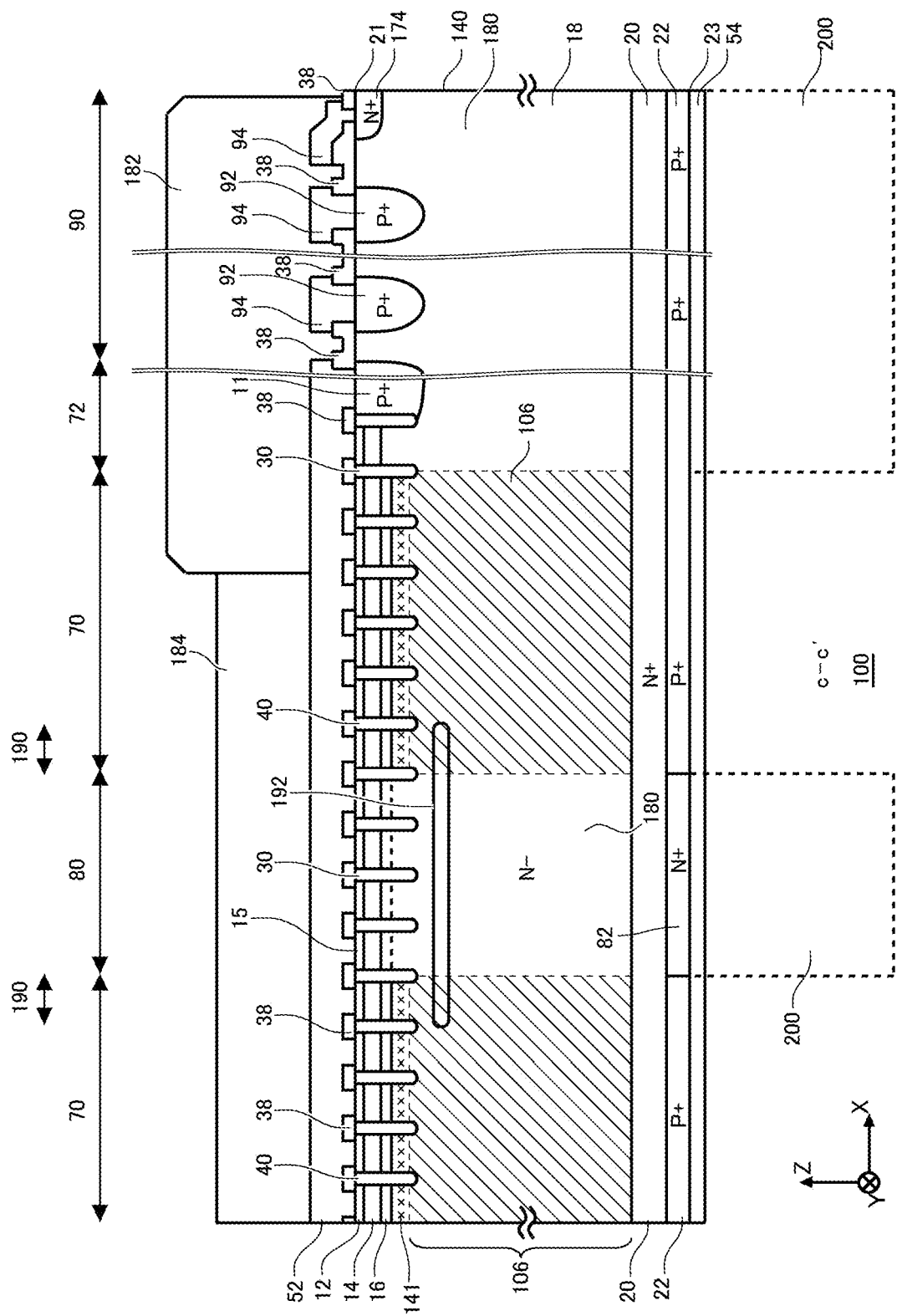
FIG. 16A is a diagram showing another arrangement example of the passed-through region 106.

FIG. 16A is a diagram showing another arrangement example of the passed-through region 106. The present example is different from the examples in FIG. 12 to FIG. 15 in that the passed-through region 106 and the helium concentration peak 141 are not provided in at least a part of the diode portion 80 in the top plan view. The other structure is the same as those of the examples described in FIG. 12 to FIG. 15.

FIG. 16A shows an example in which the passed-through region 106 and the helium concentration peak 141 are not provided in the entire diode portion 80 in the top plan view. That is, the base doping region 180 is provided on the entire diode portion 80 in the top plan view. Further, the base doping region 180 is also provided on the entire boundary portion 72 and the entire edge termination structure portion 90. In another example, the passed-through region 106 and the helium concentration peak 141 may be provided at an end portion, of the diode portion 80, which is in contact with the transistor portion 70. By causing the arrangement of the passed-through region 106 to be different between in the transistor portion 70 and in the diode portion 80, the distributions of the doping concentrations of the diode portion 80 and the transistor portion 70 can be properly made to be different.

Figure 16B:
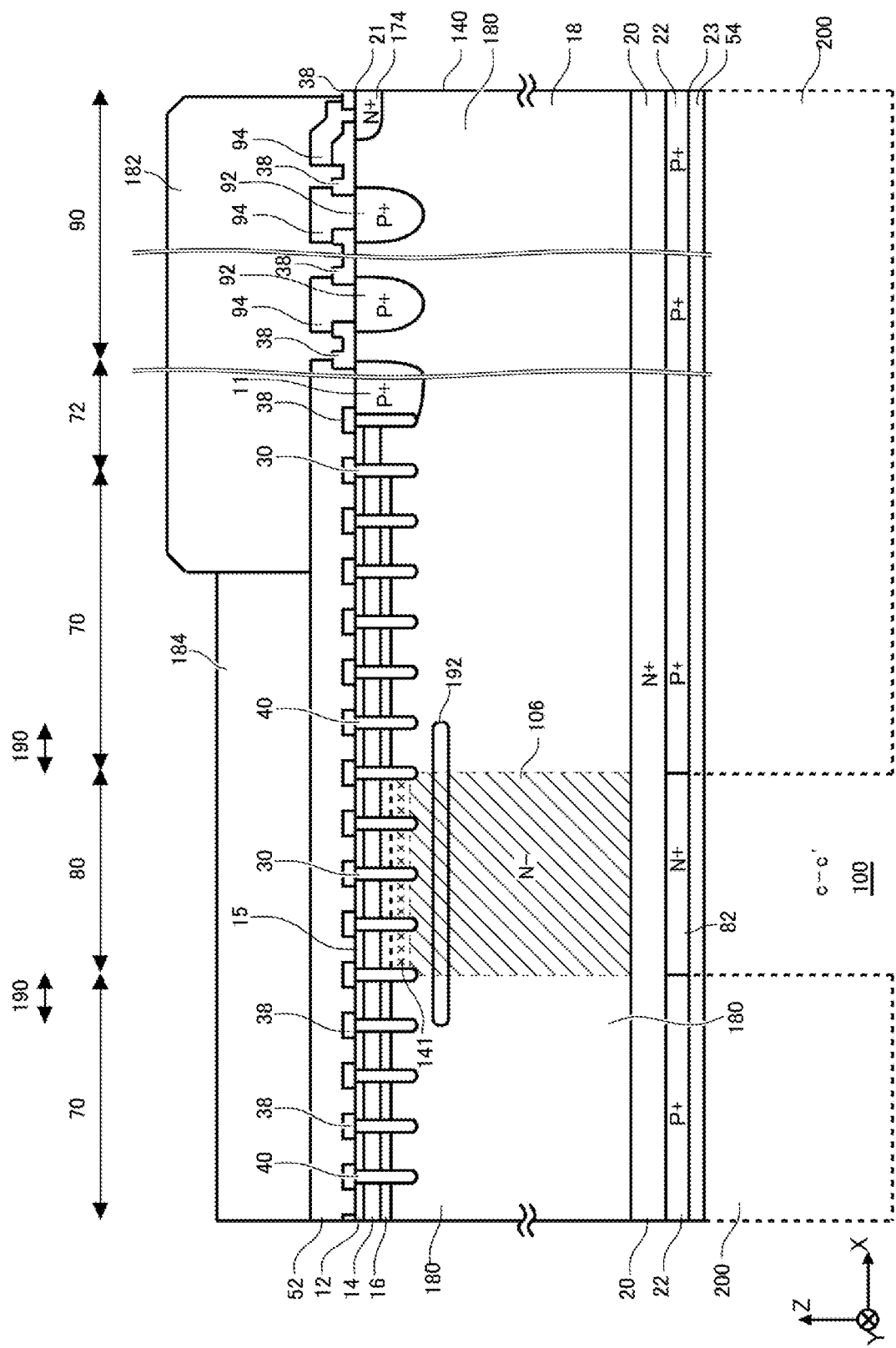
FIG. 16B is a diagram showing another arrangement example of the passed-through region 106.

FIG. 16B is a diagram showing another arrangement example of the passed-through region 106. FIG. 16B shows a configuration in which the passed-through region 106 and the base doping region 180 are formed in the active portion in a manner opposite to FIG. 16A. Forming the passed-through region 106 in the diode portion 80 suppresses extension of a space charge region at the time of reverse recovery, and suppresses waveform vibration at the time of reverse recovery. On the other hand, using the transistor portion 70 as the base doping region 180 facilitates, for example, when a short circuit occurs, the extension of the space charge region and injection of holes, and suppresses a short circuit breakdown.

Figure 17A:
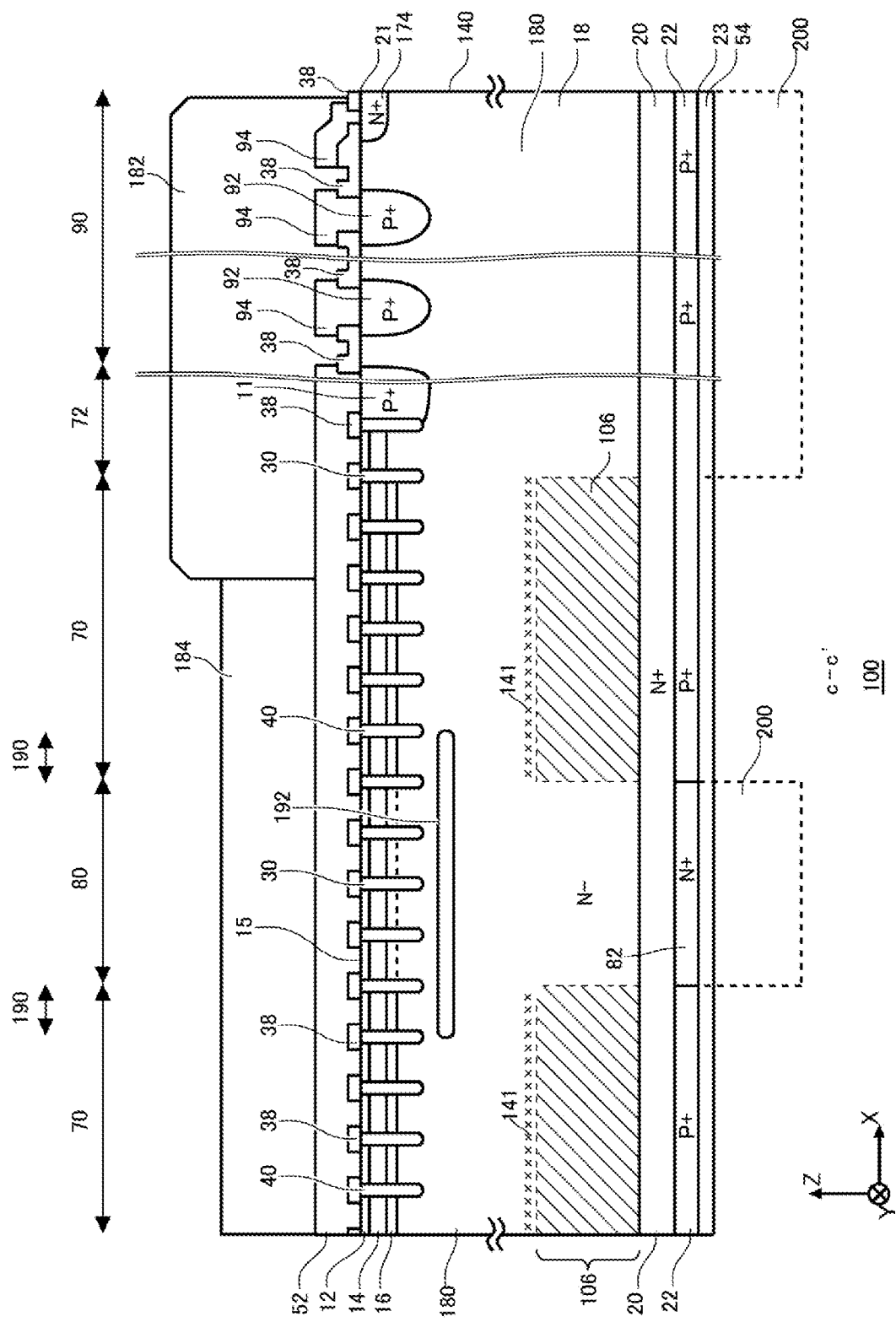
FIG. 17A is a diagram showing another arrangement example of the passed-through region 106.

FIG. 17A is a diagram showing another arrangement example of the passed-through region 106. The passed-through region 106 of the present example has the same arrangement in the depth direction as the passed-through region 106 shown in FIG. 13, and has the same arrangement in the top plan view as the passed-through region 106 shown in FIG. 16A. That is, the diode portion 80 is not provided with the passed-through region 106. The transistor portion 70 is provided with the passed-through region 106 from the lower surface 23 of the semiconductor substrate 10 to the vicinity of the center of the semiconductor substrate 10 in the depth direction. Further, in the example of FIG. 17A, the helium concentration peak 141 is made to recede from the bottom surface of the trench portion to the lower surface 23 side, and the base doping region 180 is formed, in the entire surface on the top plan view, to be closer to the upper surface 21 side than the helium concentration peak 141.

Figure 17B:
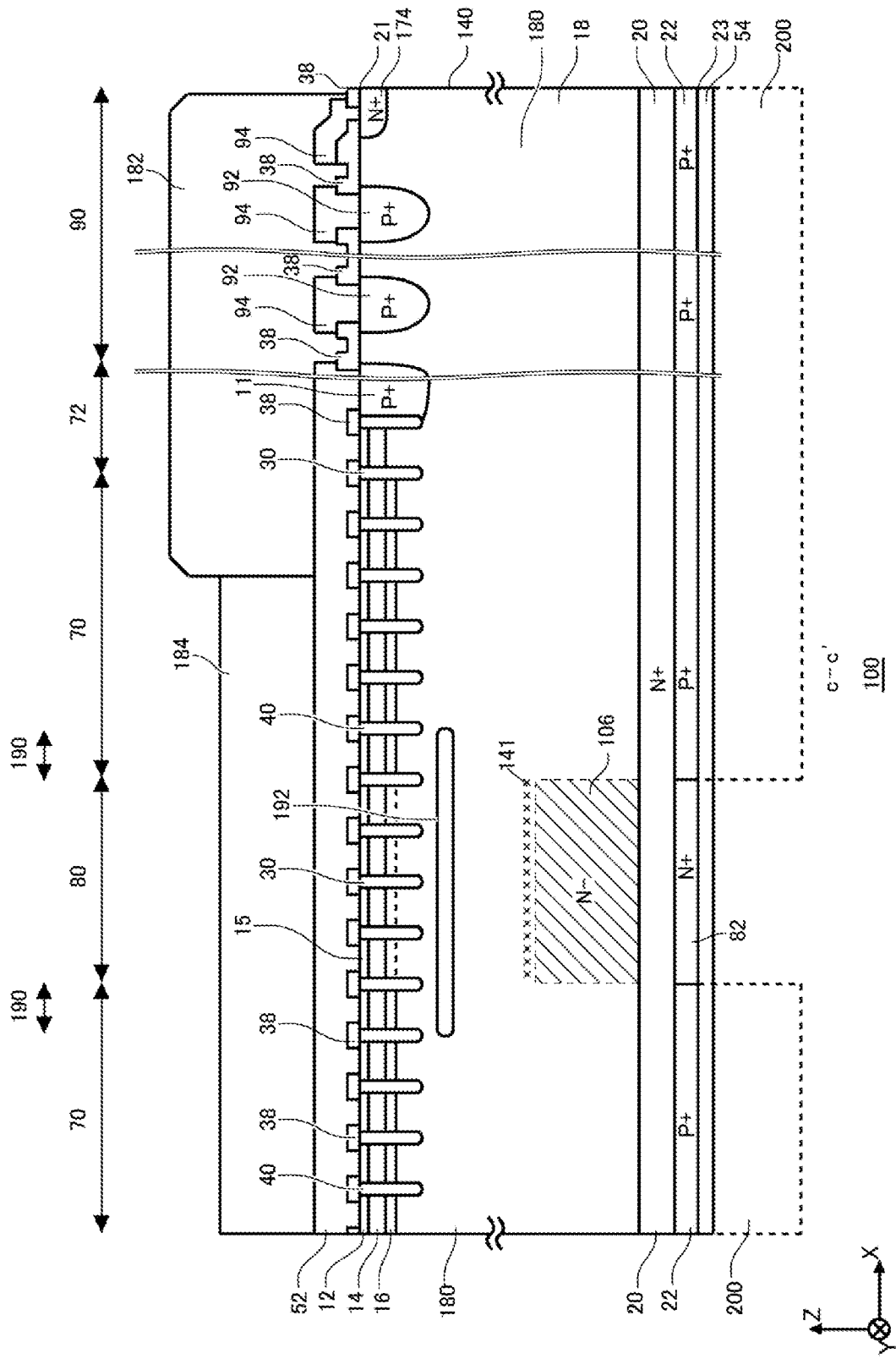
FIG. 17B is a diagram showing another arrangement example of the passed-through region 106.

FIG. 17B is a diagram showing another arrangement example of the passed-through region 106. FIG. 17B shows a configuration in which the passed-through region 106 and the base doping region 180 are formed in the active portion in a manner opposite to FIG. 17A. In the example of FIG. 17B as well, the effect similar to that of FIG. 16B is exhibited.

In order to form the passed-through region 106 described in FIG. 14 to FIG. 17B, the helium ions are implanted selectively in the top plan view in second implantation step S1902 described below. For example, it is possible to selectively perform the helium ion implantation by using a photoresist film 200 shown in FIG. 14 to FIG. 17B.

In this case, before second implantation step S1902, the photoresist film 200 with a predetermined thickness is selectively formed on a part of the lower surface 23 of the semiconductor substrate 10. The thickness of the photoresist film 200 is a thickness that can block the helium ions.

After the photoresist film 200 is formed, second implantation step S1902 is performed. In a region where the photoresist film 200 is formed, the helium ions are blocked by the photoresist film 200. Therefore, the helium ions do not enter a region of the semiconductor substrate 10 covered with the photoresist film 200. In a region where the photoresist film 200 is not formed, the helium ions are implanted at the second depth position Z2 depending on the acceleration energy. Note that in each example of FIG. 14, FIG. 15, FIG. 16A, FIG. 16B, FIG. 17A, and FIG. 17B, the photoresist film 200 is formed in contact with the lower surface 23 of the semiconductor substrate 10. In a step of forming the photoresist film 200, the collector electrode 54 is not provided on the lower surface 23.

Figure 17C:
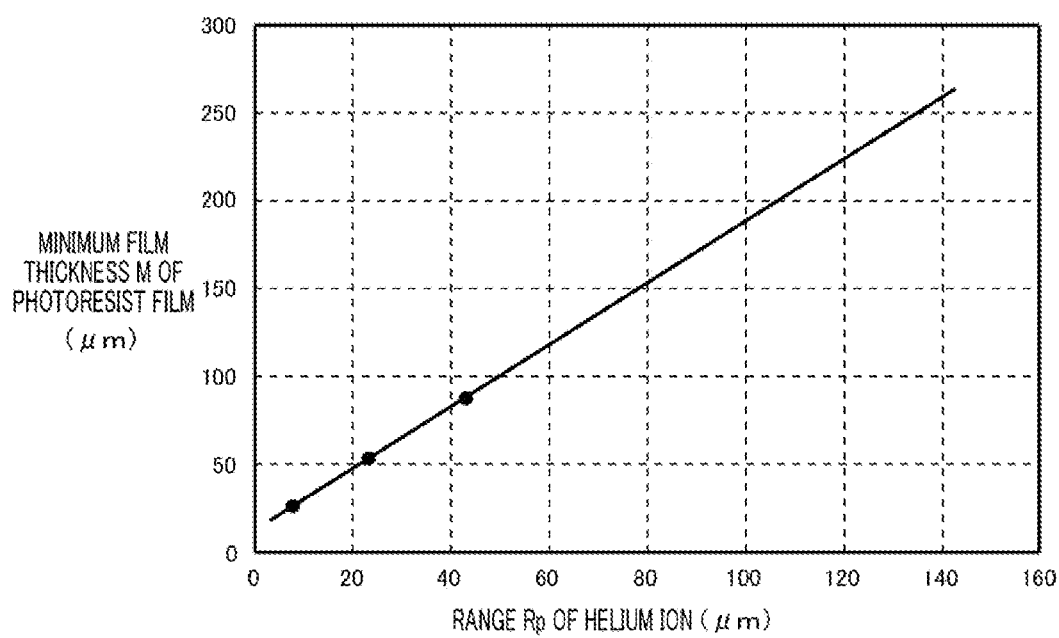
FIG. 17C is a diagram illustrating a minimum film thickness M of a photoresist film 200 for not allowing helium ions to enter the semiconductor substrate 10.

FIG. 17C is a diagram illustrating a minimum film thickness M of a photoresist film 200 for not allowing helium ions to enter the semiconductor substrate 10. FIG. 17C shows the film thickness M with respect to a range Rp of the helium ions.

The helium ions of the present example may be implanted from an accelerator into the semiconductor substrate 10 without passing through an absorber other than the photoresist film 200. The range Rp of the helium ions is uniquely determined by the acceleration energy of the accelerator.

Further, the minimum film thickness M of the photoresist film 200 that can block the helium ions is determined by the acceleration energy of the helium ions. Therefore, the minimum film thickness M of the photoresist film 200 can be represented by the range Rp of the helium ions. FIG. 17C is a diagram in which a relationship between the range Rp of the helium ions and the film thickness M is measured at three points and is approximated by a straight line. The relationship between the film thickness M ($\mu$m) and the range Rp ($\mu$m) can be represented by the following xpression M=1.76×Rp+12.32. It is preferable for the thickness of the photoresist film 200 to be larger than or equal to the minimum film thickness M shown by the above Expression.

The helium ions as another example may be implanted from the accelerator into the semiconductor substrate 10 via the absorber other than the photoresist film 200. The range Rp of the helium ions is determined by the acceleration energy of the accelerator and a thickness of the absorber along an implantation direction of the helium ions.

Figure 18A:
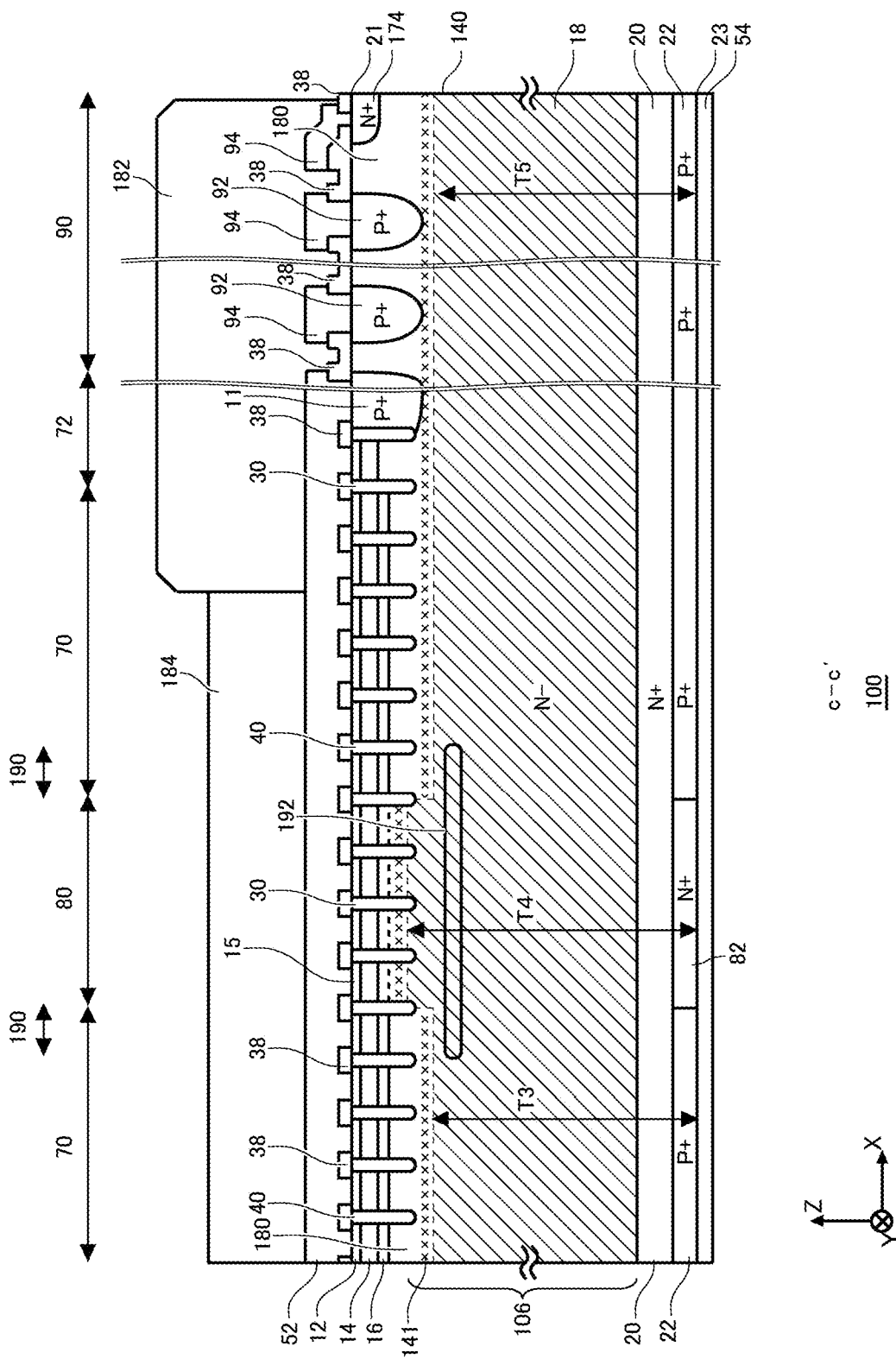
FIG. 18A is a diagram showing another arrangement example of the passed-through region 106.

FIG. 18A is a diagram showing another arrangement example of the passed-through region 106. In the present example, a width T5 of the passed-through region 106, in the depth direction, provided in the edge termination structure portion 90 is shorter than a width T4 of the passed-through region 106, in the depth direction, provided in the active portion 120 (the diode portion 80 in the present example).

In the diode portion 80, the helium concentration peak 141 may be located between the bottom portion of the dummy trench portion 30 and the upper surface 21 of the semiconductor substrate 10. In the edge termination structure portion 90, the helium concentration peak 141 may be located between the guard ring 92 and the lower surface 23 of the semiconductor substrate 10. The width T5 of the passed-through region 106 in the edge termination structure portion 90 may be larger than half a thickness T1 of the semiconductor substrate 10.

Further, a width T3 of the passed-through region 106, in the depth direction, provided in the transistor portion 70 may be shorter than the width T4 of the passed-through region 106, in the depth direction, provided in the diode portion 80. That is, in the transistor portion 70, the base doping region 180 is formed to be deeper than the depth of the trench portion. That is, the helium concentration peak 141 of the transistor portion 70 is located to be closer to the lower surface 23 side than the bottom surface of the trench portion. In the transistor portion 70, the helium concentration peak 141 may be located between the bottom portion of the gate trench portion 40 and the lower surface 23 of the semiconductor substrate 10. The width T3 may be the same as the width T5, may be larger than the width T5, and may be smaller than the width T5. The width T3 of the passed-through region 106 in the transistor portion 70 may be larger than half the thickness T1 of the semiconductor substrate 10. In this way, it is possible to arrange the base region 14 where a channel is formed in the transistor portion 70 to be spaced from the helium concentration peak 141. Therefore, it is possible to suppress an increase in defect in the vicinity of the channel.

The passed-through region 106 in the boundary portion 72 may have the same structure as the passed-through region 106 in the edge termination structure portion 90, may have the same structure as the passed-through region 106 in the transistor portion 70, and may have the same structure as the passed-through region 106 in the diode portion 80. Further, in the example of FIG. 18A, the transistor portion 70 may not be provided with the passed-through region 106. The diode portion 80 may not be provided with the passed-through region 106. The edge termination structure portion 90 may not be provided with the passed-through region 106. The boundary portion 72 may not be provided with the passed-through region 106.

Figure 18B:
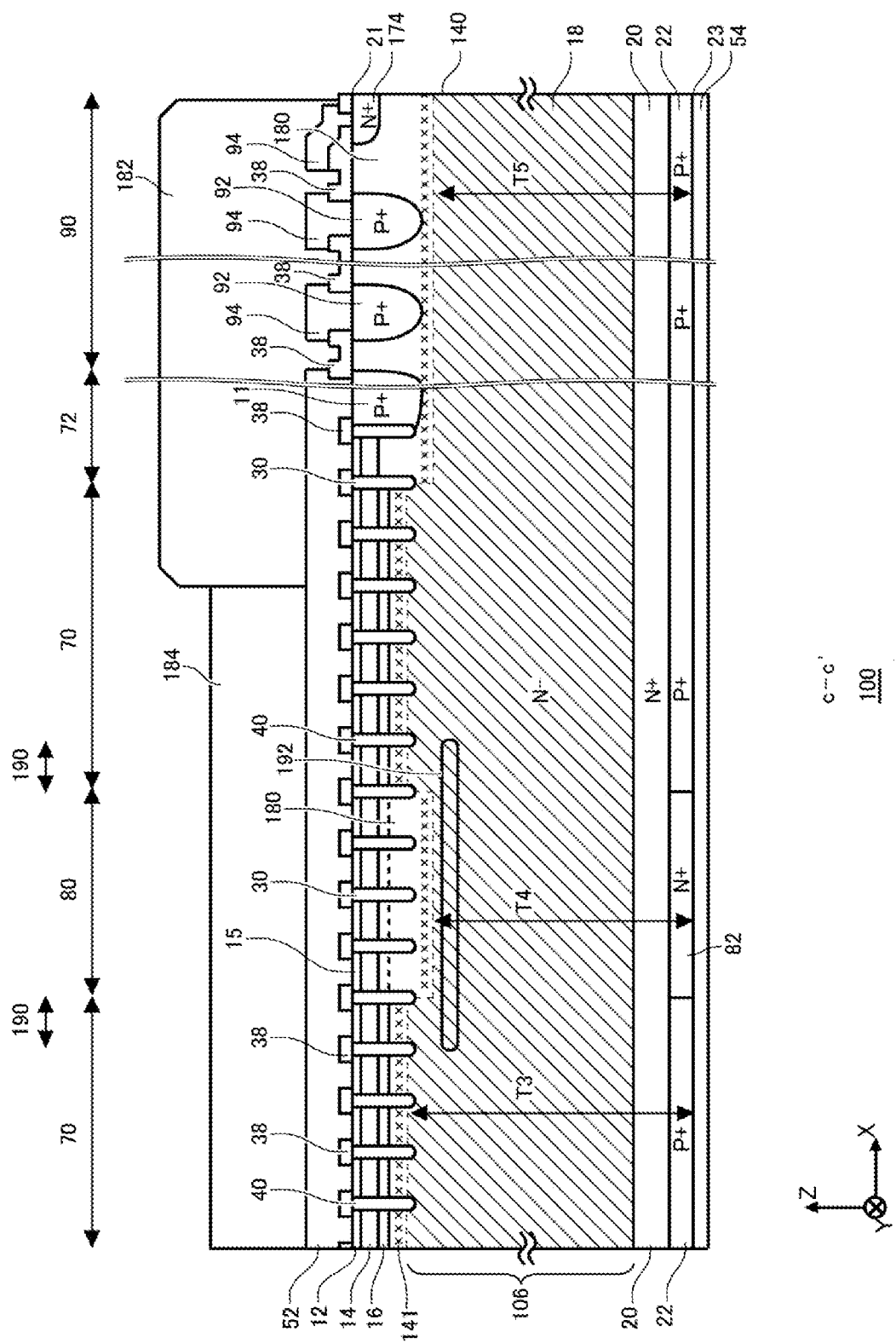
FIG. 18B is a diagram showing another arrangement example of the passed-through region 106.

FIG. 18B is a diagram showing another arrangement example of the passed-through region 106. In the present example, the width T5 of the passed-through region 106, in the depth direction, provided in the edge termination structure portion 90 is shorter than the width T3 of the passed-through region 106, in the depth direction, provided in the active portion 120 (the transistor portion 70 in the present example).

In the transistor portion 70, the helium concentration peak 141 may be located between the bottom portion of the gate trench portion 40 and the upper surface 21 of the semiconductor substrate 10. Structures of the passed-through region 106 and the helium concentration peak 141 in the edge termination structure portion 90 are similar to those of the example of FIG. 18A.

The width T4 of the passed-through region 106, in the depth direction, provided in the diode portion 80 may be shorter than the width T3 of the passed-through region 106, in the depth direction, provided in the transistor portion 70. That is, in the diode portion 80, the base doping region 180 is formed to be deeper than the depth of the trench portion. That is, the helium concentration peak 141 of the diode portion 80 is located to be closer to the lower surface 23 side than the bottom surface of the trench portion. In the diode portion 80, the helium concentration peak 141 may be located between the bottom portion of the dummy trench portion 30 and the lower surface 23 of the semiconductor substrate 10. The width T4 may be the same as the width T5, may be larger than the width T5, and may be smaller than the width T5. The width T4 of the passed-through region 106 in the diode portion 80 may be larger than half the thickness T1 of the semiconductor substrate 10.

The passed-through region 106 in the boundary portion 72 may have the same structure as the passed-through region 106 in the edge termination structure portion 90, may have the same structure as the passed-through region 106 in the transistor portion 70, and may have the same structure as the passed-through region 106 in the diode portion 80. Further, in the example of FIG. 18B, the transistor portion 70 may not be provided with the passed-through region 106. The diode portion 80 may not be provided with the passed-through region 106. The edge termination structure portion 90 may not be provided with the passed-through region 106. The boundary portion 72 may not be provided with the passed-through region 106.

As shown in FIG. 12 to FIG. 18B, adjusting the structure of the passed-through region 106 makes it possible to easily adjust the donor concentration distribution in the transistor portion 70, the diode portion 80, and the edge termination structure portion 90. The structure of the passed-through region 106 is not limited to the examples shown in FIG. 12 to FIG. 18B.

Figure 19:
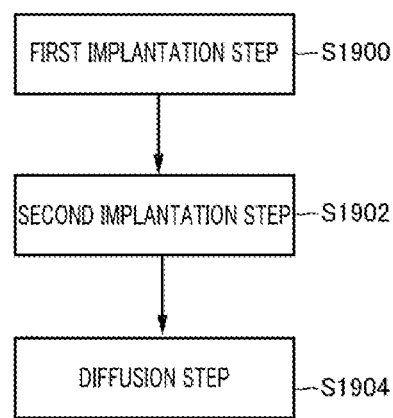
FIG. 19 is a diagram showing steps of forming a passed-through region 106 in a method for manufacturing the semiconductor device 100.

FIG. 19 is a diagram showing steps of forming a passed-through region 106 in a method for manufacturing the semiconductor device 100. In a case of forming the passed-through region 106, the hydrogen ions are implanted at the first depth Z1 from the lower surface 23 of the semiconductor substrate 10 in first implantation step S1900. Further, in second implantation step S1902, the passed-through region 106 is formed by implanting the helium ions at the second depth Z2 from the lower surface 23 of the semiconductor substrate 10. Either first implantation step S1900 or second implantation step S1902 may be performed first.

Note that in a case where first implantation step S1900 is performed first, when the heat treatment is performed between first implantation step S1900 and second implantation step S1902, it may not be possible to enhance the donor concentration of the passed-through region 106. That is, when the heat treatment is performed before the passed-through region 106 is formed, the hydrogen implanted in first implantation step S1900 may leak to the outside of the semiconductor substrate 10 without being able to combine with a crystal defect in the passed-through region 106. Therefore, it is preferable not to perform the heat treatment between first implantation step S1900 and second implantation step S1902. The heat treatment is treatment for heating the semiconductor substrate 10, for example, at 300° C. or higher.

After first implantation step S1900 and second implantation step S1902, diffusion step S1904 is performed. In diffusion step S1904, the semiconductor substrate 10 is heat treated, and the hydrogen implanted at the first depth Z1 is diffused in the passed-through region 106. In diffusion step S1904, the semiconductor substrate 10 may be heated to 300° C. or higher. The heating temperature may be 350° C. or higher. In diffusion step S1904, the semiconductor substrate 10 may be heated for 1 hour or longer, and may be heated for 3 hours or longer.

By diffusing hydrogen in diffusion step S1904, the crystal defect and hydrogen in the passed-through region 106 are combined to serve as a donor. This makes it possible to enhance the donor concentration in the passed-through region 106. In diffusion step S1904, a minimum value of donor concentration in the passed-through region 106 is preferably higher than the donor concentration (the base doping concentration) of the semiconductor substrate 10 before first implantation step S1900 and second implantation step S1902. That is, the donor concentration is preferably higher than the base doping concentration in the entire passed-through region 106.

In order to enhance the donor concentration in the entire passed-through region 106, the hydrogen implanted at the first depth position Z1 is preferably diffused up to the vicinity of the second depth position Z2. In first implantation step S1900, by adjusting the dose of hydrogen to be implanted at the first depth position Z1, the hydrogen can be sufficiently diffused up to the vicinity of the second depth position Z2. In first implantation step S1900, the dose of hydrogen is preferably determined such that the minimum value of the donor concentration in the passed-through region 106 is higher than the base doping concentration.

In first implantation step S1900, the hydrogen ion may be implanted in the vicinity of a stop region of the helium ion (the range Rp). The hydrogen ion implantation in the first implantation step may be performed before or after the helium ion implantation in second implantation step S1902. In the vicinity of the stop region of the helium ion, a localized ion implantation damage (disorder) also exists. There exist many dangling bonds in the disordered region. In first implantation step S1900, by implanting the hydrogen ions as well in the vicinity of the stop region of the helium ion, hydrogen terminates the disordered dangling bond such that the disorder can be reduced.

In a case of forming the peaks 24 of a plurality of hydrogen donor shown in FIG. 9 and the like in the buffer region 20, hydrogen ion implantations may be performed multiple times in addition to the hydrogen ion implantation in first implantation step S1900. The multiple times of hydrogen ion implantations to form the peaks 24 may be performed in first implantation step S1900. That is, first implantation step S1900 may be performed multiple times.

FIG. 20 to FIG. 26 are diagrams for illustrating a method for determining the dose of the hydrogen ions to be implanted at the first depth Z1 (referred to as a first dose). In first implantation step S1900 of the present example, hydrogen is implanted according to a diffusion coefficient of hydrogen in the semiconductor substrate 10, and in a dose larger than or equal to a minimum dose determined by the position (that is, a distance by which the hydrogen implanted at the first depth position Z1 should be diffused) of the second depth Z2.

Figure 20:
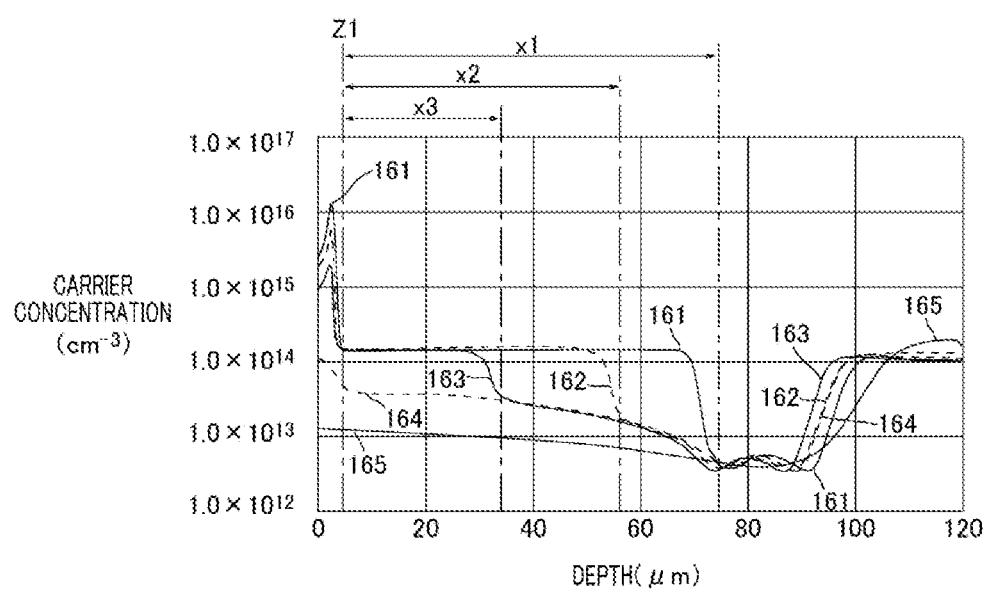
FIG. 20 is a diagram showing an example of a carrier concentration distribution in the semiconductor substrate 10 after diffusion step S1904.

FIG. 20 is a diagram showing an example of a carrier concentration distribution in the semiconductor substrate 10 after diffusion step S1904. The carrier concentration distribution in FIG. 20 can be acquired by, for example, Spreading Resistance profiling (Spread Resistance Profiling). In each of FIG. 20 to FIG. 26, the lower surface 23 of the semiconductor substrate 10 is defined as a reference position (0 μm) of a depth (μm). Further, the first depth Z1 is 10 μm or less. The first depth Z1 may be handled as 0 μm.

FIG. 20 shows carrier concentration distributions of five types of semiconductor substrates 10. A first example 161, a second example 162, and a third example 163 are examples in which the hydrogen ions are implanted at the first depth Z1 and the helium ions are implanted at the second depth Z2. A fourth example 164 and a fifth example 165 are examples in which the helium ions are implanted at the second depth Z2 and hydrogen is not implanted at the first depth Z1. In each example, the dose of the helium ions to the second depth Z2 (referred to as a second dose) is set to $1\times10^{13}/cm^2$. Further, the range of the helium ions to the second depth Z2 is set to 100 μm, and the acceleration energy is set to 4.0 Mev. The range of the helium ions may be adjusted by the acceleration energy, and may be adjusted by an aluminum absorber or the like.

In the first example 161, the second example 162, and the third example 163, the acceleration energy of the hydrogen ions to the first depth Z1 is set to 400 keV. In the first example 161, the first dose is set to $1\times10^{15}/cm^2$. In the second example 162, the first dose is set to $3\times10^{14}/cm^2$. In the third example 163, the first dose is set to $1\times10^{14}/cm^2$.

After the hydrogen ions are implanted, the semiconductor substrate 10 of each example is annealed at 370° C. for 5 hours in the same annealing furnace. Note that annealing is not performed in the fifth example 165. FIG. 20 shows a carrier concentration distribution after the annealing. Before the annealing in each example, the crystal defect is formed in the passed-through region 106 (the range from the lower surface 23 of the semiconductor substrate 10 to the second depth position Z2). Therefore, the carrier concentration in the passed-through region 106 is reduced.

After the annealing, hydrogen is combined with the crystal defect to serve as a donor, and thus the carrier concentration rises. Note that in the fourth example 164, hydrogen is not implanted at the first depth Z1, and thus the carrier concentration hardly rises. As shown in the first example 161, the second example 162, and the third example 163, as the first dose increases, the carrier concentration of the passed-through region 106 rises. Further, as the first dose increases, a region whose donor concentration is higher than the base doping concentration extends up to a region far away from the first depth Z1. That is, as the first dose increases, the hydrogen from the first depth Z1 reaches a distant region by a diffusion of the hydrogen.

When the first dose is set as Q, a diffusion depth of hydrogen from the first depth Z1 is set as x (x1, x2, x3) (cm), the diffusion coefficient of hydrogen is set as D (cm²/s), a diffusion time is set as t, and the base doping concentration of the semiconductor substrate 10 is set as $C_0$ (atoms/cm³), a relationship between these is represented by following Expression (1). Expression (1) represents a value calculated by a solution to a diffusion equation. When the diffusion equation is solved under a boundary condition that a total amount of hydrogen is constant, the solution has a Gaussian distribution. In the obtained Gaussian distribution solution, x when a concentration C (x, t) matches the base doping concentration $C_0$ is represented by Expression (1).

[Math. 1]

$$x = \sqrt{4Dt\ln\left(\frac{Q}{C_0\sqrt{\pi Dt}}\right)} \quad (1)$$

By Expression (1), the diffusion coefficients D of hydrogen in the first example 161, the second example 162, and the third example 163 can be numerically calculated. The diffusion depth x in each example may be determined by a profile shape in FIG. 20. For example, for the diffusion depth x, a distance from the first depth position Z1 to an initial inflection point in a valley portion in the carrier concentration can be used. Further, for the diffusion depth x, a distance from the first depth position Z1 to a position at which the carrier concentration initially falls below the base doping concentration may be used.

Note that the crystal defects formed when the helium ions are implanted at the second depth Z2 are various defects such as point defects and dislocations. Particularly, in the point defects, the vacancy type defect such as the vacancy and the divacancy is formed. In this case, a concentration of the crystal defect has a peak at a position which is slightly closer to an ion implantation surface (the lower surface 23 of the semiconductor substrate 10) from the second depth Z2.

Figure 21:
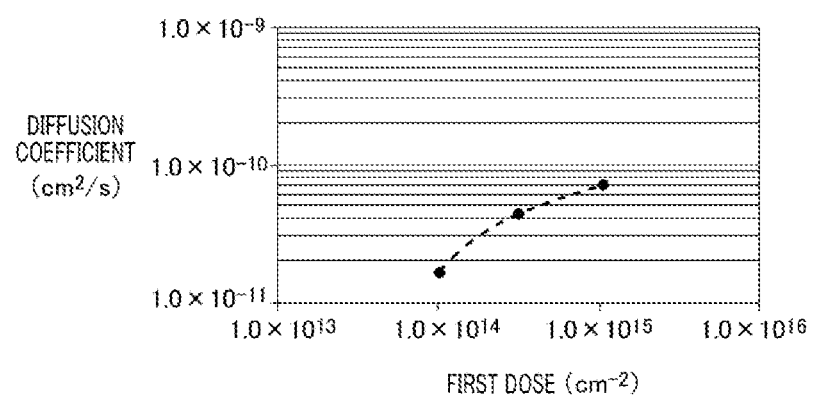
FIG. 21 is a diagram showing a relationship between a diffusion coefficient D of hydrogen and a first dose Q.

FIG. 21 is a diagram showing a relationship between a diffusion coefficient D of hydrogen and a first dose Q. In FIG. 21, the first example 161, the second example 162, and the third example 163 shown in FIG. 20 are respectively plotted. As the first dose Q increases, the diffusion coefficient D increases. The hydrogen implanted at the first depth Z1 is diffused toward the second depth Z2 while terminating the dangling bond in the passed-through region 106. A ratio of hydrogen which is diffused in the region where the dangling bond is terminated increases when the first dose Q increases, which thus is considered as a fact that the hydrogen diffusion becomes easy. Note that the value of the diffusion coefficient D varies depending on an experimental condition or the like. An error within at least ±50% is allowable with respect to the diffusion coefficient D shown in FIG. 21. An error within ±100% is also allowable.

Figure 22:
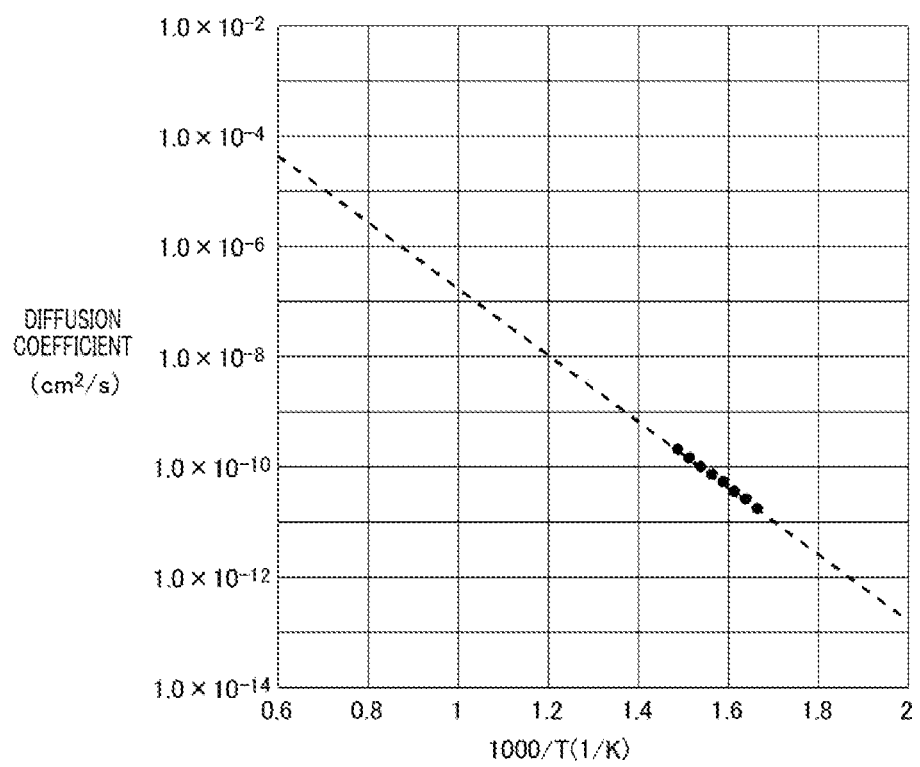
FIG. 22 is a diagram showing a relationship between a diffusion coefficient D and an annealing temperature T.

FIG. 22 is a diagram showing a relationship between a diffusion coefficient D and an annealing temperature T. FIG. 22 is a graph obtained by acquiring the diffusion coefficient described in FIG. 20 and FIG. 21 for a plurality of annealing temperatures T, and performing Arrhenius plotting. In the present example, the first dose is set to $Q=1\times10^{15}/cm^2$.

The diffusion coefficient D is represented by $D=D_0 \exp(-Ea/k_BT)$. $D_0$ is a constant, Ea is activation energy, and $k_B$ is a Boltzmann constant. From the graph in FIG. 22, $D_0=0.19095$ (cm²/s) and Ea=1.204 (eV). This makes it possible to calculate the diffusion coefficient of hydrogen in the semiconductor substrate 10.

Figure 23:
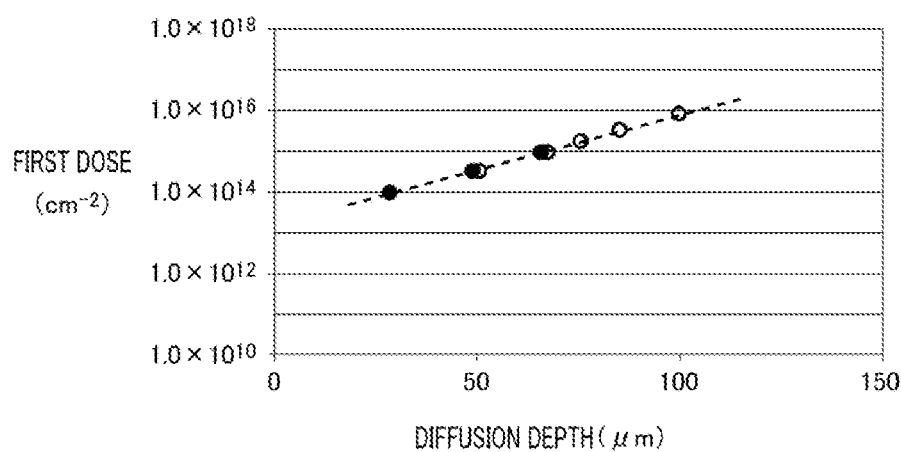
FIG. 23 is a diagram showing a relationship between a diffusion depth of hydrogen and a first dose.

FIG. 23 is a diagram showing a relationship between a diffusion depth of hydrogen and a first dose. In FIG. 23, the first example 161, the second example 162, and the third example 163 shown in FIG. 20 are plotted with a black circle.

As shown in FIG. 23, by connecting each plot with a straight line, the first dose for each diffusion depth x can be determined. That is, the straight line indicates the minimum first dose for each diffusion depth x. In first implantation step S1900, setting the first dose to be larger than the straight line allows the donor concentration of the entire passed-through region 106 to be higher than the base doping concentration. As an example, when the second depth Z2 is set to the diffusion depth x (μm), the first dose Q (ions/cm$^2$) may satisfy $$Q \geq 1.6491 \times 10^{13} \times e^{0.061619x}.$$

As described above, the peak of the crystal defect concentration when the helium ions are implanted at the second depth Z2 is provided at a position slightly shallower than the second depth Z2. The horizontal axis in FIG. 23 corresponds to a peak position of the crystal defect concentration. Therefore, in a case of forming the passed-through region 106 having a length X0 corresponding to the horizontal axis in FIG. 23, the helium ions are implanted at the second depth Z2 by the range Rp of the following Expression in consideration of straggling ΔRp in ion implantation.

Rp≥X0+ΔRp. By setting the concentration peak position of the crystal defect (a position of the length X0 from the lower surface 23) at a position closer to the upper surface 21 than the bottom portion of the trench portion provided on the upper surface 21 of the semiconductor substrate 10, it is possible to form the passed-through region 106 in approximately the entire the semiconductor substrate 10 in the depth direction.

Note that the minimum dose may be calculated based on following Expression (2) obtained by modifying Expression (1).

[Math. 2]

$$Q = C_0 \sqrt{\pi D t}\, e^{\frac{x^2}{4Dt}} \quad (2)$$

The diffusion coefficient D is calculated by the method described in FIG. 22. In FIG. 23, the minimum dose calculated by Expression (2) is plotted by a white circle. Note that since the diffusion coefficient D has a dimension of a square of a distance, the diffusion coefficient D may be represented by a function of the diffusion depth x of hydrogen.

Figure 24:
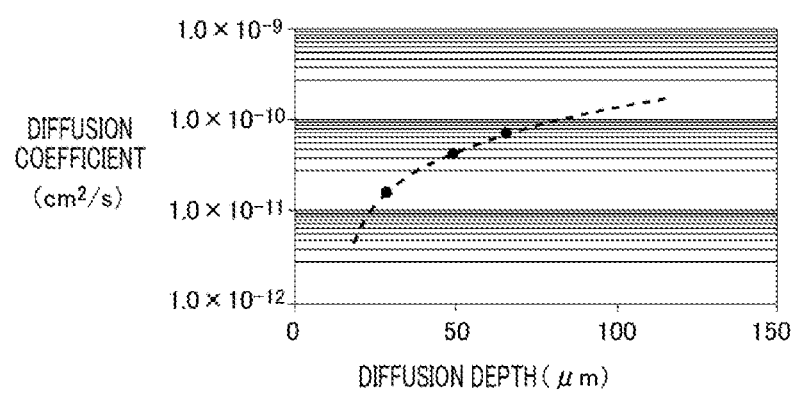
FIG. 24 is a diagram showing a relationship between a diffusion coefficient D and a diffusion depth x.

FIG. 24 is a diagram showing a relationship between a diffusion coefficient D and a diffusion depth x. In FIG. 24, the first example 161, the second example 162, and the third example 163 in FIG. 20 are plotted. As shown in FIG. 24, as the diffusion depth x increases, the diffusion coefficient D also increases.

When the diffusion depth x increases, a distance from the first depth Z1 to the concentration peak of the crystal defect increases. Therefore, a ratio of a region having the relatively small number of crystal defects in the passed-through region 106 increases. When the number of crystal defects is small, the diffusion coefficient is great, and thus when the diffusion depth x increases, an average diffusion coefficient of the passed-through region 106 is also great.

Note that in FIG. 20 to FIG. 24, the second dose is set to 1×10$^{13}$/cm$^2$. Note that even when the second dose is changed, a minimum dose of the first dose can be determined by the similar method. Further, the donor concentration in the passed-through region 106 may be adjusted by adjusting the second dose. By adjusting the second dose, the concentration of the crystal defects formed in the passed-through region 106 can be adjusted. Further, the annealing temperature is set to 370° C.; however, even when the annealing temperature is changed, the minimum dose can be determined by Expression (2).

Figure 25:
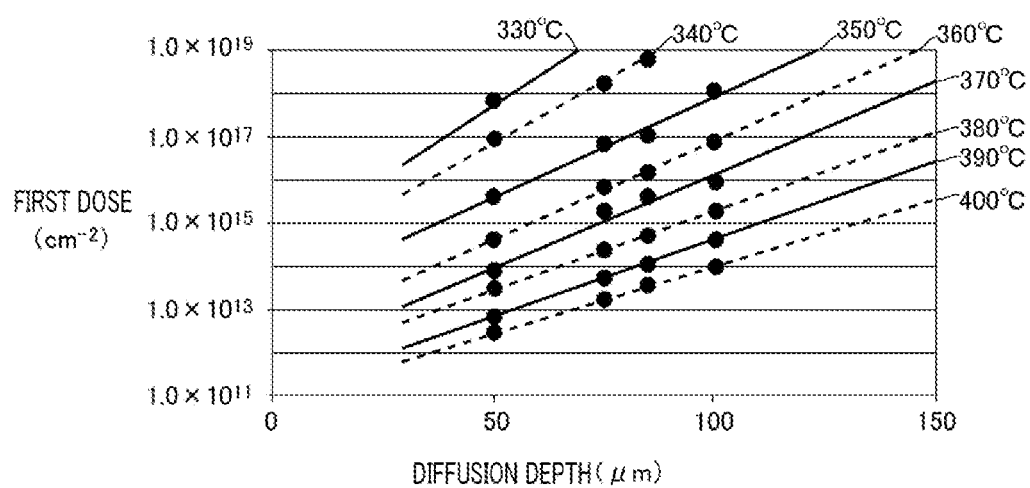
FIG. 25 is a diagram showing a straight line defining a minimum dose for each annealing temperature.

FIG. 25 is a diagram showing a straight line defining a minimum dose for each annealing temperature. In the present example, the diffusion coefficient D is constant regardless of the diffusion depth. In first implantation step S1900, the hydrogen ions only need to be implanted at the first depth Z1 in a dose larger than the minimum dose shown by the straight line in FIG. 25.

Figure 26:
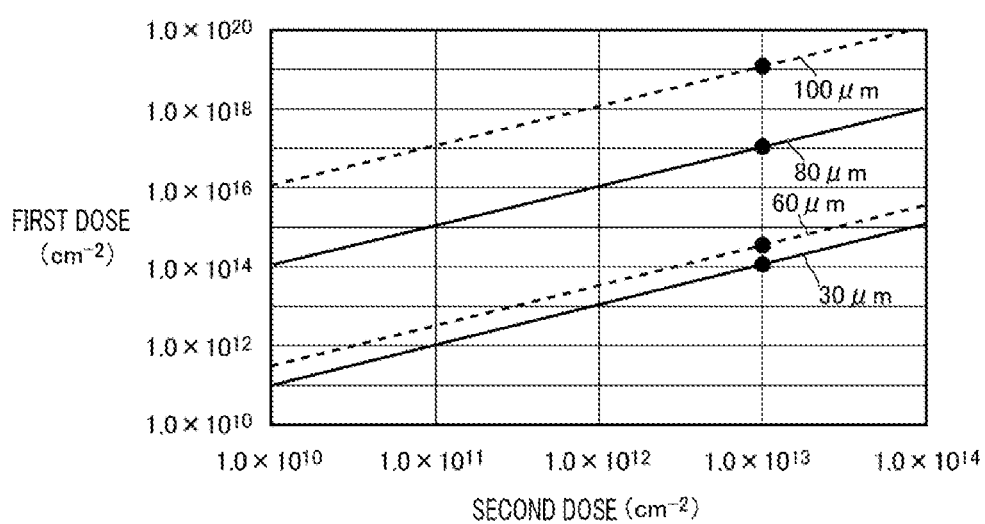
FIG. 26 is a diagram showing a relationship between a second dose and a minimum dose of the first dose.

FIG. 26 is a diagram showing a relationship between a second dose and a minimum dose of the first dose. In the present example, the relationship is shown for each diffusion depth x. In first implantation step S1900, the hydrogen ions only need to be implanted at the first depth Z1 in a dose larger than the minimum dose shown by the straight line in FIG. 26.

Figure 27:
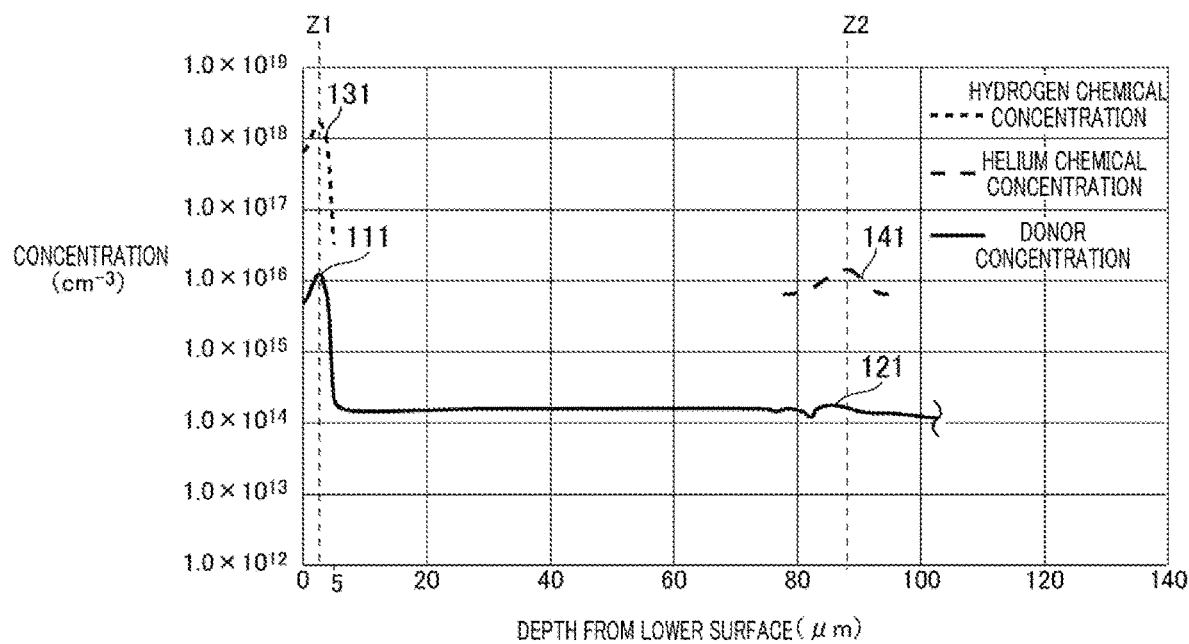
FIG. 27 is a diagram illustrating an example of a first depth Z1.

FIG. 27 is a diagram illustrating an example of a first depth Z1. FIG. 27 shows the donor concentration distribution, the hydrogen chemical concentration distribution, and a helium chemical concentration distribution in the depth direction of the semiconductor substrate 10. The hydrogen chemical concentration distribution and the helium chemical concentration distribution schematically show only the vicinity of the peak. In FIG. 27, an illustration of the distribution in the vicinity of the upper surface 21 of the semiconductor substrate 10 (a region where the distance from the lower surface 23 is 100 μm or more) is omitted. Further, the carrier concentration distribution in the region of the N type in the semiconductor substrate 10 may be used as a donor concentration distribution.

In the present example, the first depth Z1 of the hydrogen concentration peak 131 is included in a range of 5 μm or less from the lower surface 23 of the semiconductor substrate 10 in the depth direction. In the semiconductor device 100, configurations other than the first depth Z1 are the same as those in any of the aspects described in FIG. 1 to FIG. 26. The donor concentration distribution of the semiconductor device 100 of the present example is similar to that of the example of FIG. 10.

Locating the first depth Z1 in the vicinity of the lower surface 23 makes it possible to widen a distance between the first depth Z1 and the second depth Z2. Therefore, the donor concentration can be adjusted with a high precision in a wider range of the semiconductor substrate 10. The first depth Z1 may be included within a range of 4 μm from the lower surface 23, and may be included within a range of 3 μm.

In order to diffuse hydrogen in a wider range, the dose of hydrogen to be implanted at the first depth Z1 is preferably higher. In the present example, the dose of hydrogen to be implanted at the first depth Z1 may be 1×10$^{15}$ atoms/cm$^2$ or more, may be 1×10$^{16}$ atoms/cm$^2$ or more, may be 1×10$^{17}$ atoms/cm$^2$ or more, and may be 1×10$^{18}$ atoms/cm$^2$ or more. At the first depth Z1, the first donor concentration peak 111 due to the hydrogen donor may be formed. The donor concentration of the first donor concentration peak 111 may be 1×10$^{15}$/cm$^3$ or higher, and may be 1×10$^{16}$/cm$^3$ or higher. The donor concentration of the first donor concentration peak 111 may be 1×10$^{17}$/cm$^3$ or lower.

The implantation of hydrogen at the first depth Z1 may be performed by plasma doping. In the plasma doping, a gas for plasma excitation, and a source material gas including hydrogen are supplied to a container that contains the semiconductor substrate 10. The excitation gas may include an inert element such as argon. As the source material gas, phosphine (PH3) or the like may be used. By generating plasma by using these gases in the container and exposing the lower surface 23 of the semiconductor substrate 10 to the plasma, hydrogen with a high concentration can be easily implanted at a position which is shallow when viewed from the lower surface 23. Further, by implanting hydrogen into a shallow position in the vicinity of the lower surface 23 by using the plasma doping, it is possible to suppress a generation of the crystal defect in the semiconductor substrate 10. Further, since the number of the crystal defect is small, the annealing temperature can be lowered, and a throughput in manufacturing the semiconductor device 100 can be improved. Note that a method for implanting hydrogen at the first depth Z1 is not limited to the plasma doping.

The implantation of helium at the second depth Z2 of the helium concentration peak 141 may be performed by a method other than the plasma doping. Helium may be implanted at the second depth Z2 by accelerating the helium ion by an electric field or the like. The second depth position Z2 may be spaced from the lower surface 23 by 80 μm or more in the depth direction. The second depth position Z2 may be spaced from the lower surface 23 by 90 μm or more, and may be spaced by 100 μm or more. The distance in the depth direction between the first depth position and the second depth position may be 50% or more of the thickness of the semiconductor substrate 10 in the depth direction, may be 65% or more, and may be 80% or more.

Figure 28:
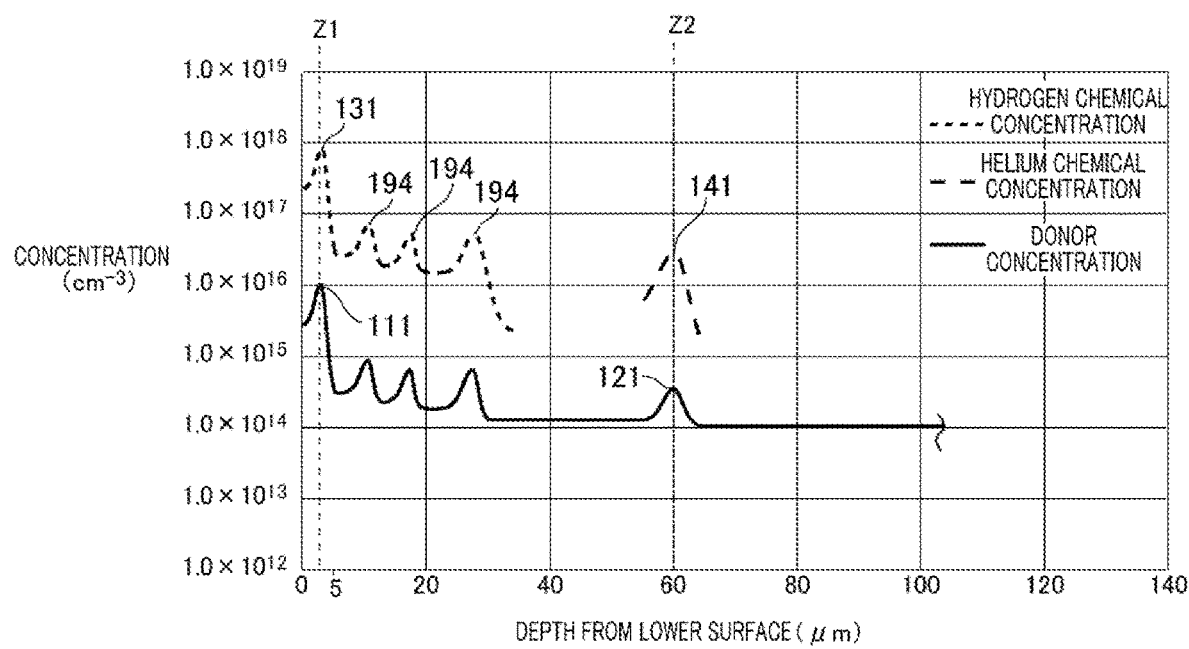
FIG. 28 shows other examples of the donor concentration distribution, hydrogen chemical concentration distribution, and helium chemical concentration distribution in the depth direction of the semiconductor substrate 10.

FIG. 28 shows other examples of the donor concentration distribution, hydrogen chemical concentration distribution, and helium chemical concentration distribution in the depth direction of the semiconductor substrate 10. The hydrogen chemical concentration distribution and the helium chemical concentration distribution schematically show only the vicinity of the peak. The first depth Z1 of the present example is the same as that of the example of FIG. 27. Further, the second depth Z2 may be located on the upper surface 21 side of the semiconductor substrate 10. The upper surface 21 side indicates a region between the center and the upper surface 21 in the depth direction of the semiconductor substrate 10.

In any example of FIG. 27 and FIG. 28, the hydrogen chemical concentration distribution may have one or more hydrogen concentration peaks 194 between the first depth Z1 and the second depth Z2. The hydrogen concentration peak 194 may be located in the buffer region 20 described in FIG. 6 or the like. The hydrogen concentration peak 131 may be located in the buffer region 20, and may be located between the buffer region 20 and the lower surface 23.

Figure 29:
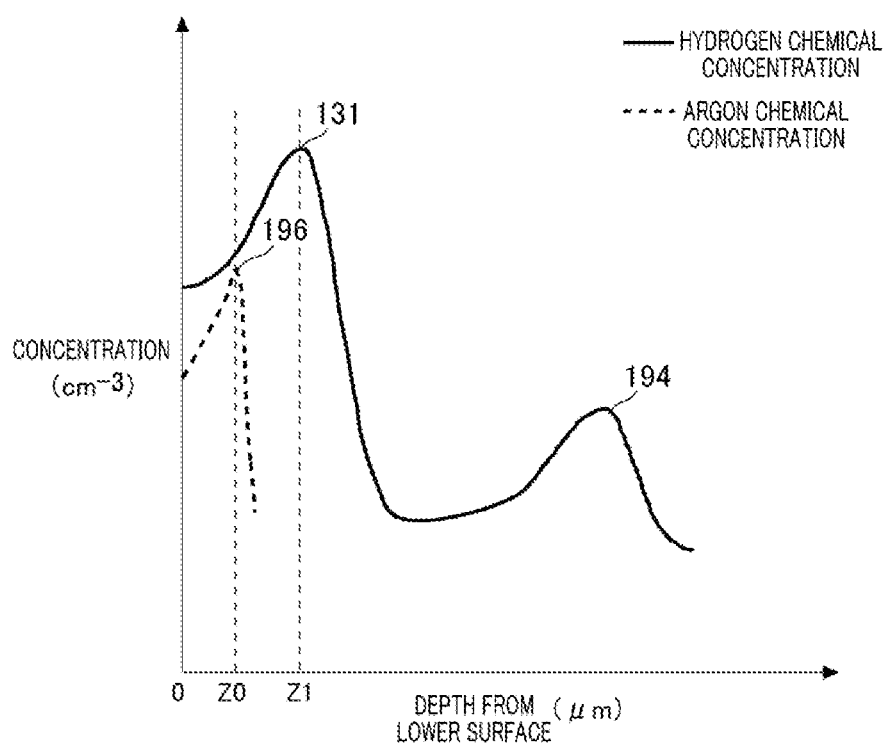
FIG. 29 is a diagram showing examples of the hydrogen chemical concentration distribution and an argon chemical concentration distribution in the vicinity of the hydrogen concentration peak 131.

FIG. 29 is a diagram showing examples of the hydrogen chemical concentration distribution and an argon chemical concentration distribution in the vicinity of the hydrogen concentration peak 131. In the present example, the hydrogen concentration peak 131 is a peak corresponding to hydrogen implanted by the plasma doping, and the hydrogen concentration peak 194 is a peak corresponding to hydrogen implanted by a method other than the plasma doping.

When hydrogen is implanted at the first depth position Z1 by the plasma doping, impurities other than hydrogen may be implanted in the vicinity of the first depth position Z1. For example, when an argon gas is used for the plasma excitation, argon may be implanted in the vicinity of the first depth position Z1. In FIG. 29, an argon concentration peak 196 is shown at the depth position Z0.

The depth position Z0 may be located between the lower surface 23 and the first depth position Z1. Since argon is an element heavier than hydrogen, the argon concentration peak 196 is likely to be formed at a position shallower than the hydrogen concentration peak 131.

In the present example, no peak of an argon chemical concentration is provided between the first depth position Z1 and the second depth position Z2. Since the hydrogen concentration peak 194 between the first depth position Z1 and the second depth position Z2 is formed by a method other than the plasma doping, there is no argon implanted in the vicinity of the hydrogen concentration peak 194. The argon chemical concentration between the first depth position Z1 and the second depth position Z2 is smaller than the argon concentration peak 196. A maximum value of the argon chemical concentration between the first depth position Z1 and the second depth position Z2 may be smaller than or equal to a minimum value of the argon chemical concentration between the lower surface 23 and the first depth position Z1.

Note that instead of argon, other impurities may be implanted into the semiconductor substrate 10 depending on a composition of the gas used for the plasma doping. When a PH3 gas is used for the plasma doping, a phosphorus concentration peak may be provided between the lower surface 23 and the first depth position Z1. When a BF3 gas is used for the plasma doping, between the lower surface 23 and the first depth position Z1, a fluorine concentration peak may be provided, and a boron concentration peak may be provided. The concentration value of the concentration peak of argon, phosphorus, fluorine, or boron may be smaller than the concentration value of the hydrogen concentration peak 131. The concentration value of the concentration peak of argon, phosphorus, fluorine, or boron may be half or lower, or 1/10 or lower of the concentration value of the hydrogen concentration peak 131.

Figure 30:
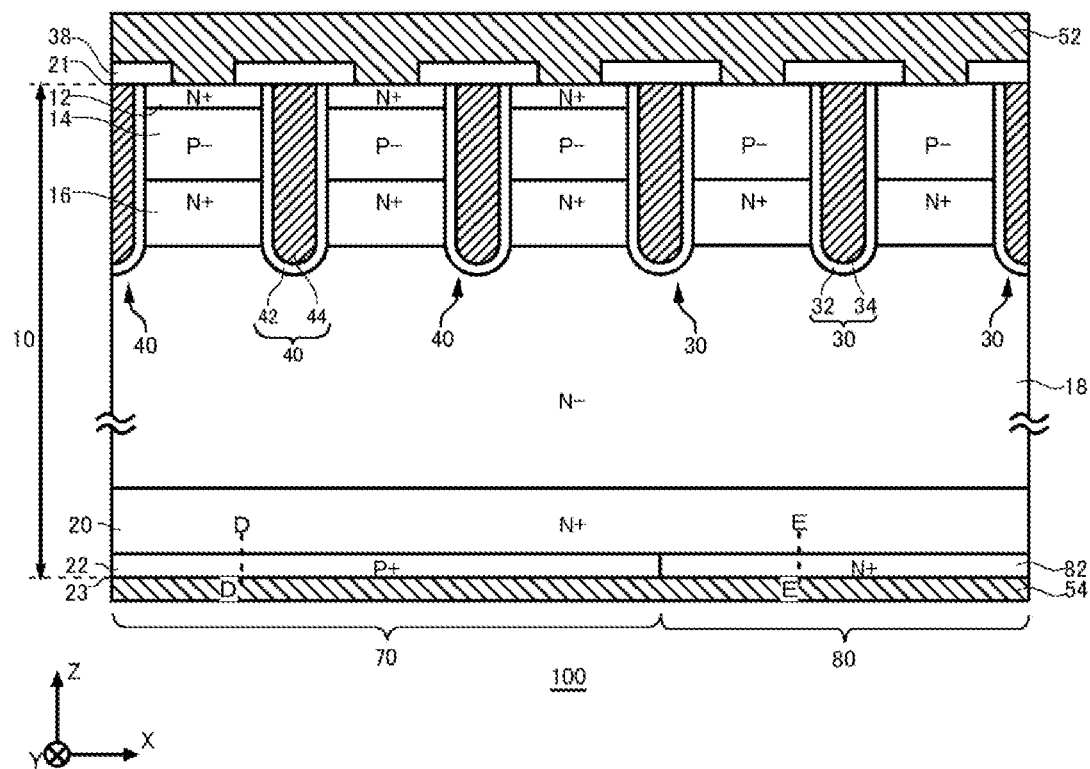
FIG. 30 is a diagram showing another structural example of the semiconductor device 100.

FIG. 30 is a diagram showing another structural example of the semiconductor device 100. The semiconductor device 100 of the present example includes a transistor portion 70 and a diode portion 80, similarly to the example shown in FIG. 11. A structure of the transistor portion 70 is the same as that of the example shown in FIG. 6. The transistor portion 70 and the diode portion 80 are provided to be adjacent to each other in the X axis direction.

The diode portion 80 in the present example has a configuration different from that of the transistor portion 70 in that the diode portion 80 has the dummy trench portion 30 instead of the gate trench portion 40, has the cathode region 82 instead of the collector region 22, and does not have the emitter region 12. Other structures are similar to those of the transistor portion 70.

The dummy trench portion 30 may have the same structure as the gate trench portion 40. The dummy trench portion 30 has a dummy dielectric film 32 and a dummy conductive portion 34. The dummy dielectric film 32 and the dummy conductive portion 34 may have the same structure and the same material as the gate dielectric film 42 and the gate conductive portion 44. Note that the gate conductive portion 44 is electrically connected to the gate electrode, while the dummy conductive portion 34 is electrically connected to the emitter electrode 52. Note that the dummy trench portion 30 may also be provided in the transistor portion 70. That is, some gate trench portion 40 in the transistor portion 70 may be replaced with the dummy trench portion 30.

The cathode region 82 is exposed on the lower surface 23 of the semiconductor substrate 10, similarly to the collector region 22. The cathode region 82 is connected to the collector electrode 54 on the lower surface 23. The cathode region 82 is a region of the N+ type doped with the impurity of the N type such as phosphorus. The buffer region 20 may be provided between the cathode region 82 and the drift region 18.

Further, in the diode portion 80, the base region 14 may be exposed on the upper surface 21. The base region 14 of the diode portion 80 is electrically connected to the emitter electrode 52. With such a configuration, the diode portion 80 functions as a diode.

In the present example, also in the diode portion 80, hydrogen is implanted at the first depth position Z1 and helium is implanted at the second depth position Z2. Further, also in the diode portion 80, a passed-through region similar to that of the transistor portion 70 is formed. Each concentration distribution in the transistor portion 70 may be the same as that in any aspect described in FIG. 1 to FIG. 29. The hydrogen chemical concentration distribution of the diode portion 80 in the depth direction may be the same as the hydrogen chemical concentration distribution of the transistor portion 70 in the depth direction. The helium chemical concentration distribution of the diode portion 80 in the depth direction may be the same as the helium chemical concentration distribution of the transistor portion 70 in the depth direction.

Figure 31:
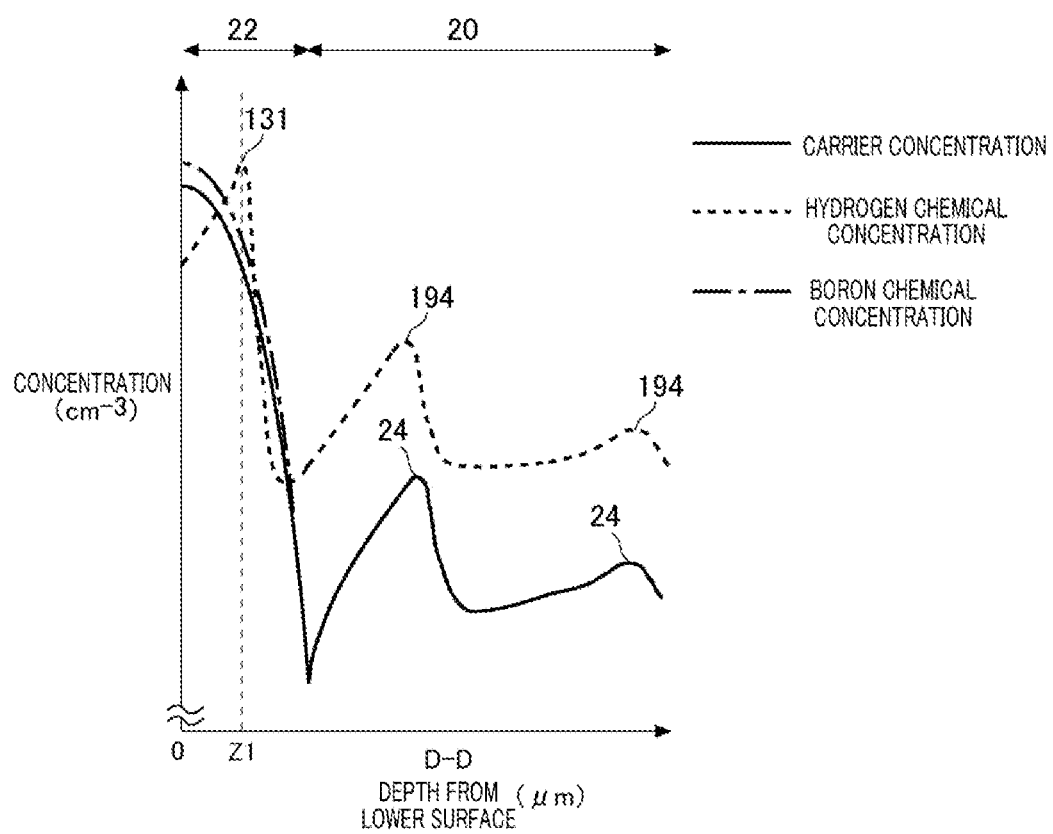
FIG. 31 shows examples of a carrier concentration distribution, a hydrogen chemical concentration distribution, and a boron chemical concentration distribution on a D-D line in FIG. 30.

FIG. 31 shows an example of a carrier concentration distribution, a hydrogen chemical concentration distribution, and a boron chemical concentration distribution on a D-D line in FIG. 30. The D-D line passes through the collector region 22 and a part of the buffer region 20 in the transistor portion 70. The collector region 22 of the present example is formed by implanting boron. Boron in the collector region 22 of the present example is implanted in a step different from the step for hydrogen of the hydrogen concentration peak 131. At least a part of boron in the collector region 22 may be implanted in the plasma doping for implanting hydrogen of the hydrogen concentration peak 131.

In the example of FIG. 7 or the like, the hydrogen concentration peak 131 is located in the buffer region 20. The hydrogen concentration peak 131 in the present example is located in the cathode region 82 and the collector region 22. The doping concentrations of the cathode region 82 and the collector region 22 are very high, and thus providing the hydrogen concentration peak 131 in the cathode region 82 and the collector region 22 makes it possible to suppress a variation of a shape of the carrier concentration distribution even when a hydrogen donor with a high concentration is generated by the hydrogen concentration peak 131. Therefore, it is easy to suppress an influence on the characteristics of the semiconductor device 100.

The concentration of the hydrogen concentration peak 131 is set for the hydrogen donor concentration to be sufficiently lower than the carrier concentration at the first depth position Z1. An activation ratio of hydrogen is approximately 1%. At the first depth position Z1, 1% of the hydrogen chemical concentration may be lower than a boron chemical concentration.

Further, a peak position of the carrier concentration distribution in the collector region 22 is located to be closer to a peak of the boron chemical concentration than the hydrogen concentration peak 131. In the example of FIG. 31, the peak of the boron chemical concentration is located on the lower surface 23. The peak position of the carrier concentration distribution in the collector region 22 may be the same as the peak position of the boron chemical concentration. The hydrogen concentration peak 131 may be located between the peak of the carrier concentration distribution in the collector region 22, and the buffer region 20. In the present example, the peak position of the carrier concentration distribution in the collector region 22 matches the lower surface 23. Note that in the buffer region 20, the depth position of the hydrogen concentration peak 194 may match the depth position of the peak 24 of the carrier concentration distribution.

Figure 32:
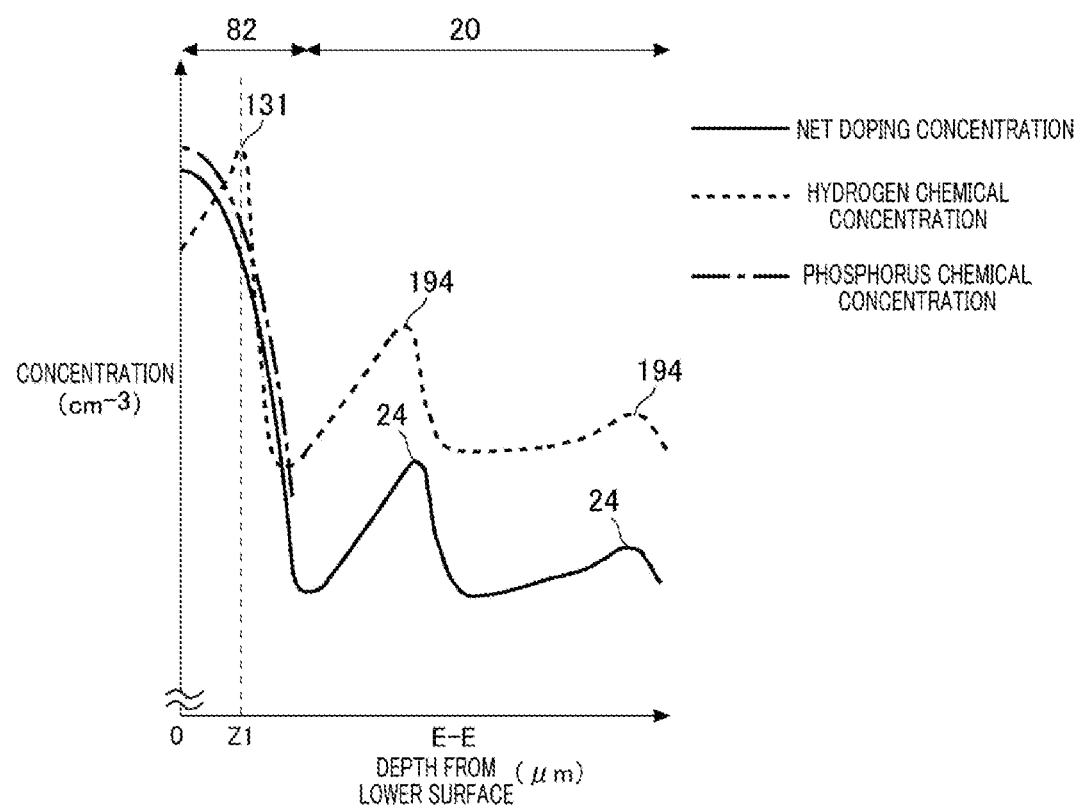
FIG. 32 shows examples of a carrier concentration distribution, a hydrogen chemical concentration distribution, and a phosphorus chemical concentration distribution on an E-E line in FIG. 30.

FIG. 32 shows an example of a carrier concentration distribution, a hydrogen chemical concentration distribution, and a phosphorus chemical concentration distribution on an E-E line in FIG. 30. The E-E line passes through the cathode region 82 and a part of the buffer region 20 in the diode portion 80. The cathode region 82 of the present example is formed by implanting phosphorus. Phosphorus in the cathode region 82 is implanted in a step different from the step for hydrogen of the hydrogen concentration peak 131. At least a part of phosphorus in the cathode region 82 may be implanted in the plasma doping for implanting hydrogen of the hydrogen concentration peak 131.

The hydrogen concentration peak 131 in the present example is located in the cathode region 82 and the collector region 22. The concentration of the hydrogen concentration peak 131 is set for the hydrogen donor concentration to be sufficiently lower than the carrier concentration at the first depth position Z1. The activation ratio of hydrogen is approximately 1%. At the first depth Z1, 1% of the hydrogen chemical concentration may be lower than a phosphorus chemical concentration.

Further, a peak position of the carrier concentration distribution in the cathode region 82 is located to be closer to a peak of the phosphorus chemical concentration than the hydrogen concentration peak 131. In the example of FIG. 32, the peak of the phosphorus chemical concentration is located on the lower surface 23. The peak position of the carrier concentration distribution in the cathode region 82 may be the same as a peak position of the phosphorus chemical concentration. The hydrogen concentration peak 131 may be located between the peak of the carrier concentration distribution in the cathode region 82, and the buffer region 20. In the present example, the peak position of the carrier concentration distribution in the cathode region 82 matches the lower surface 23. Note that in the buffer region 20, the depth position of the hydrogen concentration peak 194 may match the depth position of the peak 24 of the carrier concentration distribution.

Figure 33:
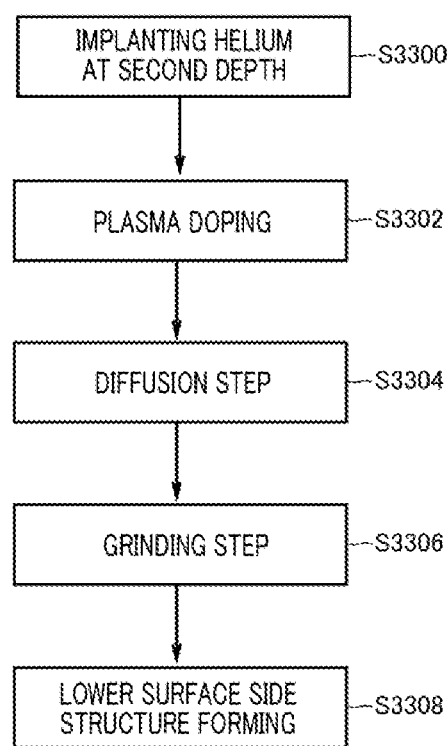
FIG. 33 is a diagram showing some steps of the method for manufacturing the semiconductor device 100.

FIG. 33 is a diagram showing some steps of the method for manufacturing the semiconductor device 100. Before the steps shown in FIG. 33, the structures of each trench portion, the emitter region 12, the base region 14, the accumulation region 16, and the like on the upper surface 21 side may be formed.

In the present example, in implantation step S3300, the helium ions are implanted at the second depth Z2 from the lower surface 23 of the semiconductor substrate 10. Implantation step S3300 may be the same as second implantation step S1902 in the example of FIG. 19.

Further, in implantation step S3302, the hydrogen ions are implanted at the first depth Z1 from the lower surface 23 of the semiconductor substrate 10. In implantation step S3302, the hydrogen ions are implanted by the plasma doping. A dose of hydrogen in implantation step S3302 may be the same as the dose of hydrogen in first implantation step S1900 of the example of FIG. 19. Either implantation step S3300 or implantation step S3302 may be performed first.

After implantation step S3300 and implantation step S3302, diffusion step S3304 is performed. Diffusion step S3304 is similar to diffusion step S1904 in the example of FIG. 19. By diffusing hydrogen in diffusion step S3304, the crystal defect and hydrogen in the passed-through region 106 are combined to serve as a donor. This makes it possible to enhance the donor concentration in the passed-through region 106.

After diffusion step S3304, grinding step S3306 is performed. In grinding step S3306, the lower surface 23 side of the semiconductor substrate 10 is ground by chemical mechanical polishing (CMP) or the like. In grinding step S3306, a range shallower than the first depth Z1 may be ground, or a range deeper than the first depth Z1 may be ground. This makes it possible to grind a region where hydrogen is distributed at a high concentration, and to reduce an amount of hydrogen in the vicinity of the lower surface 23.

After grinding step S3306, in lower surface side structure forming step S3308, structures such as the collector region 22, the cathode region 82, and the buffer region 20 on the lower surface 23 side are formed. In lower surface side structure forming step S3308, the vicinity of the lower surface 23 may be laser annealed after the dopant is implanted into the cathode region 82 and the buffer region 20. In this way, it is possible to locally perform the heat treatment, at a high temperature, on the vicinity of the lower surface 23 of the semiconductor substrate 10. Further, the dopant such as hydrogen may be implanted into the buffer region 20 after the laser annealing. After the dopant is implanted into the buffer region 20, the entire semiconductor substrate 10 may be heat treated with the annealing furnace.

Figure 34:
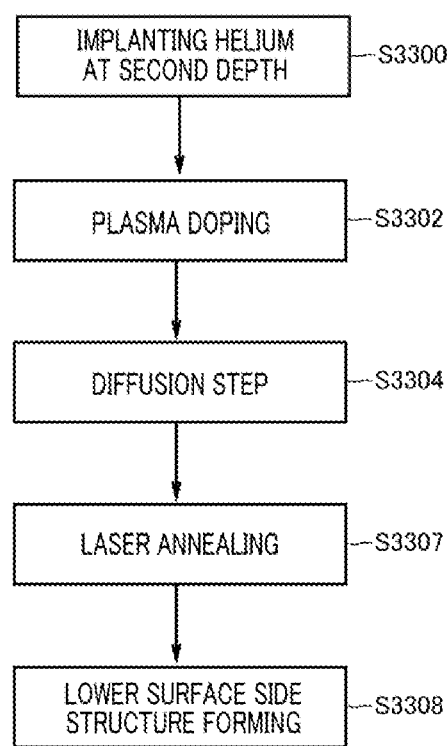
FIG. 34 is a diagram showing some steps of the method for manufacturing the semiconductor device 100.

FIG. 34 is a diagram showing some steps of the method for manufacturing the semiconductor device 100. The method for manufacturing of the present example is different from the example of FIG. 33 in that laser annealing step S3307 is included instead of grinding step S3306. The other steps are the same as those of the example of FIG. 33.

In laser annealing step S3307, the lower surface 23 of the semiconductor substrate 10 is laser annealed. In laser annealing step S3307, the vicinity of the first depth Z1 may be irradiated with a laser. In this way, at least a part of hydrogen in the vicinity of the first depth Z1 can be released to the outside of the semiconductor substrate 10. This makes it possible to reduce the hydrogen chemical concentration in the vicinity of the first depth Z1. In laser annealing step S3307, the laser may be radiated for the hydrogen concentration peak 131 to remain, and the laser may be radiated for the hydrogen concentration peak 131 not to remain. Note that even when the laser is radiated, a heavy element such as argon is likely to remain in the semiconductor substrate 10 in comparison with hydrogen. Therefore, even when laser annealing step S3307 is performed, the concentration peak of the impurity such as argon shown in FIG. 29 may exist in the semiconductor substrate 10.

Further, in laser annealing step S3307, the transistor portion 70 may be irradiated with the laser, and the diode portion 80 may not be irradiated with the laser. Even when the hydrogen donor with a high concentration remains on the lower surface 23 of the diode portion 80, the influence on the characteristics is relatively small. In this case, the hydrogen chemical concentration at the first depth Z1 of the diode portion 80 is higher than the hydrogen chemical concentration at the first depth Z1 of the transistor portion 70.

In the examples shown in FIG. 19, FIG. 33, and FIG. 34, the implantation of the hydrogen ions at the first depth Z1, and the implantation of the helium ions at the second depth Z2, and the heat treatment may be performed before the lower surface side structure is formed, may be performed after the lower surface side structure is formed, and may be performed while the lower surface side structure is formed.

Figure 35:
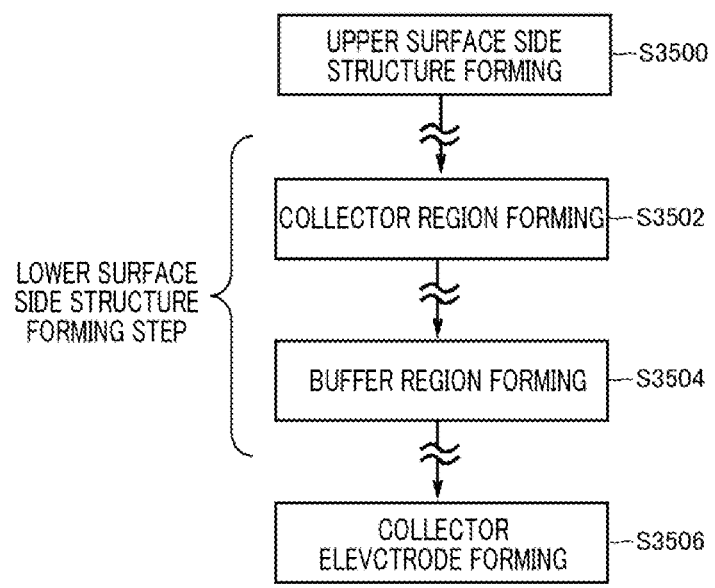
FIG. 35 shows an example of a step of implanting hydrogen ions at the first depth Z1 and implanting helium ions at a second depth Z2 in a lower surface side structure forming step.

FIG. 35 shows an example of a step of implanting hydrogen ions at the first depth Z1 and implanting helium ions at a second depth Z2 in a lower surface side structure forming step. In the present example, the implantation of the hydrogen ions at the first depth Z1, and the implantation of the helium ions at the second depth Z2, and the heat treatment are performed in buffer region forming step S3504 of forming the buffer region 20.

The lower surface side structure forming step may be performed after upper surface side structure forming step S3500 for the trench portion or the like. The lower surface side structure forming step includes collector region forming step S3502 and buffer region forming step S3504. In FIG. 35, an illustration of steps other than the lower surface side structure forming step are omitted. In the present example, in buffer region forming step S3504, the hydrogen ions are implanted at the first depth Z1 and the helium ions are implanted at the second depth Z2. In S3504, after the hydrogen ions are implanted, the semiconductor substrate 10 is heat treated and the hydrogen ions and the helium ions are diffused. After the lower surface side structure forming step, collector electrode forming step S3506 may be performed.

Figure 36:
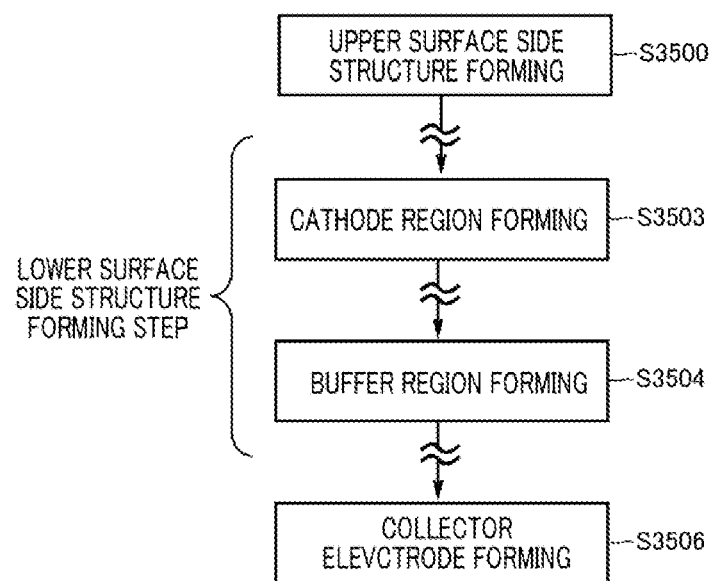
FIG. 36 shows another example of the step of implanting hydrogen ions at the first depth Z1 and implanting helium ions at the second depth Z2 in the lower surface side structure forming step.

FIG. 36 shows another example of the step of implanting hydrogen ions at the first depth Z1 and implanting helium ions at the second depth Z2 in the lower surface side structure forming step. In the present example, the implantation of the hydrogen ions at the first depth Z1 and the heat treatment are performed in cathode region forming step S3503. Further, the implantation of the helium ions at the second depth Z2 and the heat treatment are performed in buffer region forming step S3504.

The lower surface side structure forming step may be performed after upper surface side structure forming step S3500 for the trench portion or the like. The lower surface side structure forming step in the present example includes cathode region forming step S3503 and buffer region forming step S3504. In FIG. 36, an illustration of steps other than the lower surface side structure forming step are omitted.

The semiconductor device 100 of the present example may include the transistor portion 70 and the diode portion 80. In this case, a collector region 22 of the P type may be formed in a part of the cathode region 82 by forming the cathode region 82 on the entire lower surface 23 and then selectively implanting a dopant of the P type. In cathode region forming step S3503, a source material gas such as PH3 including a dopant of the N type such as phosphorus may be used. In cathode region forming step S3503, the hydrogen ions are implanted at the first depth Z1 in the entire lower surface 23.

Further, the cathode region 82 may be formed by selectively forming the collector region 22 on the lower surface 23 and then implanting the dopant of the N type and the hydrogen ions into the entire lower surface 23. In this case, a dopant of the P type with a high concentration may be implanted, in advance, into the collector region 22 for the conductivity type not to be inverted to the N type. By such a step, the first depth Z1 is located in the collector region 22 and the cathode region 82.

Note that when the semiconductor device 100 does not include the transistor portion 70 and includes the diode portion 80, the step of forming the collector region 22 can be omitted. Further, the hydrogen implantation at the second depth Z2 may be performed in the step of forming the buffer region 20. After the lower surface side structure forming step, collector electrode forming step S3506 may be performed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate,
11: well region,
12: emitter region,
14: base region,
15: contact region,
16: accumulation region,
18: drift region,
20: buffer region,
21: upper surface,
22: collector region,
23: lower surface,
24, 25: peak,
30: dummy trench portion,
32: dummy dielectric film,
34: dummy conductive portion,
38: interlayer dielectric film,
40: gate trench portion,
42: gate dielectric film,
44: gate conductive portion,
48: gate runner,
50: gate metal layer,
52: emitter electrode,
54: collector electrode,
70: transistor portion,
72: boundary portion,
80: diode portion,
82: cathode region,
90: edge termination structure portion,
92: guard ring,
94: field plate,
100: semiconductor device,
106: passed-through region,
111: first donor concentration peak,
112, 122, 132, 142, 172: upward slope,
113, 123, 133, 143, 173: downward slope,
114, 124, 125, 134, 144, 145: gradient,
116: gate pad,
118: emitter pad,
120: active portion,
121: second donor concentration peak,
131: hydrogen concentration peak,
140: outer peripheral end,
141: helium concentration peak,
150: flat region,
151: valley,
161: first example,
162: second example,
163: third example,
164: fourth example,
165: fifth example,
171: vacancy concentration peak,
174: channel stopper,
175: vacancy defect concentration distribution,
180: base doping region,
181: non-doping region,
182: protective film,
184: plating layer,
190: intermediate boundary region,
192: lifetime control region,
194: hydrogen concentration peak,
196: argon concentration peak,
200: photoresist film

What is claimed is:

1. A semiconductor device comprising:
a semiconductor substrate that has an upper surface and a lower surface, wherein
in a depth direction connecting the upper surface and the lower surface of the semiconductor substrate, a hydrogen concentration distribution has a hydrogen concentration peak, a helium concentration distribution has a helium concentration peak, and a donor concentration distribution has a first donor concentration peak and a second donor concentration peak,
the hydrogen concentration peak and the first donor concentration peak are located at a first depth, and the helium concentration peak and the second donor concentration peak are located at a second depth which is deeper than the first depth with respect to the lower surface,
each concentration peak has an upward slope in which a concentration value increases from the lower surface toward the upper surface, and
a value which is obtained by normalizing a gradient of the upward slope of the second donor concentration peak by a gradient of the upward slope of the helium concentration peak is smaller than a value which is obtained by normalizing a gradient of the upward slope of the first donor concentration peak by a gradient of the upward slope of the hydrogen concentration peak.

2. The semiconductor device according to claim 1, wherein
each concentration peak has a downward slope in which a concentration value decreases from the lower surface toward the upper surface, and
in the helium concentration peak, the gradient of the upward slope is smaller than a gradient of the downward slope.

3. The semiconductor device according to claim 1, wherein
each concentration peak has a downward slope in which a concentration value decreases from the lower surface toward the upper surface, and
in the second donor concentration peak, the gradient of the upward slope is smaller than a gradient of the downward slope.

4. The semiconductor device according to claim 1, wherein
the donor concentration distribution between the first depth and the second depth has a flat region where a donor concentration is approximately constant, and
a length of the flat region in the depth direction is 10% or more of a thickness of the semiconductor substrate in the depth direction.

5. The semiconductor device according to claim 1, wherein
the donor concentration distribution between the first depth and the second depth has a flat region where a donor concentration is approximately constant, and a length of the flat region in the depth direction is 10 µm or more.

6. The semiconductor device according to claim 4, wherein a minimum value of the donor concentration of the flat region is higher than a donor concentration of the semiconductor substrate.

7. The semiconductor device according to claim 6, wherein a minimum value of a donor concentration between the first depth and the second depth is higher than the donor concentration of the semiconductor substrate.

8. The semiconductor device according to claim 1, wherein a concentration value of the helium concentration peak is smaller than a concentration value of the hydrogen concentration peak.

9. The semiconductor device according to claim 1, further comprising:
a drift region of an N type that is provided in the semiconductor substrate;
an emitter region that is provided in contact with the upper surface of the semiconductor substrate and that has a higher donor concentration than a donor concentration of the drift region;
a base region of a P type that is provided between the emitter region and the drift region;
a collector region of the P type that is provided in contact with the lower surface of the semiconductor substrate; and
a buffer region of the N type that is provided between the collector region and the drift region and that has one or more donor concentration peaks whose donor concentration is higher than the donor concentration of the drift region,
wherein the first donor concentration peak is the donor concentration peak of the buffer region.

10. The semiconductor device according to claim 9, further comprising:
an accumulation region that is provided between the base region and the drift region and that has one or more donor concentration peaks whose donor concentration is higher than the donor concentration of the drift region,
wherein the second donor concentration peak is the donor concentration peak of the accumulation region.

11. The semiconductor device according to claim 10, wherein the accumulation region has, in addition to the second donor concentration peak, the donor concentration peak due to a donor other than hydrogen.

12. The semiconductor device according to claim 9, further comprising:
an accumulation region that is provided between the base region and the drift region and that has one or more donor concentration peaks whose donor concentration is higher than the donor concentration of the drift region,
wherein the second donor concentration peak is located between the buffer region and the accumulation region.

13. The semiconductor device according to claim 1, further comprising:
a gate trench portion that is provided on the upper surface of the semiconductor substrate,
wherein the second donor concentration peak is located between a bottom portion of the gate trench portion and the upper surface of the semiconductor substrate.

14. The semiconductor device according to claim 1, further comprising:
an active portion that is provided in the semiconductor substrate; and
an edge termination structure portion that is provided to surround the active portion in a top plan view of the semiconductor substrate, wherein
the semiconductor substrate has a passed-through region through which helium implanted at a position of the helium concentration peak has passed, and
in the depth direction, the passed-through region provided in the edge termination structure portion is shorter than the passed-through region provided in the active portion, or the passed-through region is not provided in the edge termination structure portion.

15. The semiconductor device according to claim 1, further comprising:
a transistor portion and a diode portion that are provided in the semiconductor substrate, wherein
the semiconductor substrate has a passed-through region through which helium implanted at a position of the helium concentration peak has passed, and
in the depth direction, the passed-through region provided in the diode portion is shorter than the passed-through region provided in the transistor portion, or the passed-through region is not provided in the diode portion.

16. The semiconductor device according to claim 1, further comprising:
a transistor portion and a diode portion that are provided in the semiconductor substrate, wherein
the semiconductor substrate has a passed-through region through which helium implanted at a position of the helium concentration peak has passed, and
in the depth direction, the passed-through region provided in the transistor portion is shorter than the passed-through region provided in the diode portion, or the passed-through region is not provided in the transistor portion.

17. The semiconductor device according to claim 1, wherein the first depth is included in a range of 5 µm or less from the lower surface in the depth direction.

18. The semiconductor device according to claim 17, wherein a donor concentration at the hydrogen concentration peak is $1\times10^{15}/cm^3$ or higher and $1\times10^{17}/cm^3$ or lower.

19. A semiconductor device comprising:
a semiconductor substrate that has an upper surface and a lower surface,
wherein in a depth direction connecting the upper surface and the lower surface of the semiconductor substrate, a hydrogen concentration distribution has a hydrogen concentration peak located in a range of 5 µm or less from the lower surface in the depth direction, and a helium concentration distribution has a helium concentration peak located, in the depth direction of the semiconductor substrate, on a side of the upper surface than a center of the semiconductor substrate in the depth direction, and
wherein a minimum value of a donor concentration between a depth at which the hydrogen concentration peak is located and a depth at which the helium concentration peak is located is higher than a donor concentration of the semiconductor substrate.

20. The semiconductor device according to claim 19, wherein the semiconductor device has an impurity concentration peak between the lower surface and the hydrogen concentration peak, and an impurity of the impurity concentration peak is argon or fluorine.

21. A method for manufacturing a semiconductor device including a semiconductor substrate that has an upper surface and a lower surface, the method for manufacturing comprising:
- a first implantation step of implanting hydrogen at a first depth from the lower surface of the semiconductor substrate to form a hydrogen concentration peak;
- a second implantation step of implanting helium at a second depth from the lower surface of the semiconductor substrate, the second depth being deeper than the first depth with respect to the lower surface, to form a helium concentration peak and a passed-through region through which the helium has passed; and
- a diffusion step of heat treating the semiconductor substrate to diffuse, in the passed-through region, the hydrogen implanted at the first depth, so as to form a first donor concentration peak at the first depth and form a second donor concentration peak at the second depth, wherein
- each concentration peak has an upward slope in which a concentration value increases from the lower surface toward the upper surface,
- a value which is obtained by normalizing a gradient of the upward slope of the second donor concentration peak by a gradient of the upward slope of the helium concentration peak is smaller than a value which is obtained by normalizing a gradient of the upward slope of the first donor concentration peak by a gradient of the upward slope of the hydrogen concentration peak, and
- in the semiconductor substrate heat treated in the diffusion step, a dose of hydrogen in the first implantation step is determined such that a minimum value of a donor concentration of the passed-through region is higher than a donor concentration of the semiconductor substrate into which the hydrogen is to be implanted.

22. The method for manufacturing according to claim 21, wherein in the first implantation step, hydrogen is implanted according to a diffusion coefficient of hydrogen in the semiconductor substrate, and in a dose larger than or equal to a minimum dose determined by the second depth.

23. The method for manufacturing according to claim 21, wherein the semiconductor substrate is a silicon substrate, and when the second depth from the lower surface is set to x (μm), a dose Q (ions/cm$^2$) of hydrogen in the first implantation step satisfies $$Q \gtrsim 1.6491 \times 10^{13} x e^{0.061619x}.$$

24. The method for manufacturing according to claim 21, wherein in the first implantation step, hydrogen is implanted at the first depth by plasma doping.

25. The method for manufacturing according to claim 24, wherein the lower surface of the semiconductor substrate is ground after the plasma doping.

26. The method for manufacturing according to claim 24, wherein the lower surface of the semiconductor substrate is laser annealed after the plasma doping.

27. A semiconductor device comprising:
- a semiconductor substrate that has an upper surface and a lower surface,
- wherein in a depth direction connecting the upper surface and the lower surface of the semiconductor substrate, a hydrogen concentration distribution has a hydrogen concentration peak located in a range of 5 μm or less from the lower surface in the depth direction, and a helium concentration distribution has a helium concentration peak located, in the depth direction of the semiconductor substrate, (a) on a side of the upper surface and (b) in a range spaced apart from the lower surface by 80 μm or more in the depth direction, and
- wherein a minimum value of a donor concentration between a depth at which the hydrogen concentration peak is located and a depth at which the helium concentration peak is located is higher than a donor concentration of the semiconductor substrate.

* * * * *